(12) United States Patent
Kamimura

(10) Patent No.: US 11,733,611 B2
(45) Date of Patent: *Aug. 22, 2023

(54) PATTERN FORMING METHOD, METHOD FOR PRODUCING ELECTRONIC DEVICE, AND KIT

(71) Applicant: FUJIFILM Corporation, Tokyo (JP)

(72) Inventor: Tetsuya Kamimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 428 days.

This patent is subject to a terminal disclaimer.

(21) Appl. No.: 16/369,712

(22) Filed: Mar. 29, 2019

(65) Prior Publication Data

US 2019/0227435 A1    Jul. 25, 2019

Related U.S. Application Data

(63) Continuation of application No. PCT/JP2017/035443, filed on Sep. 29, 2017.

(30) Foreign Application Priority Data

Sep. 30, 2016 (JP) ................... 2016-194760

(51) Int. Cl.
```
G03F 7/30      (2006.01)
G03F 7/038     (2006.01)
G03F 7/32      (2006.01)
G03F 7/38      (2006.01)
G03F 7/075     (2006.01)
G03F 7/039     (2006.01)
H01L 21/027    (2006.01)
G03F 7/40      (2006.01)
G03F 7/16      (2006.01)
C08F 220/18    (2006.01)
C08F 220/28    (2006.01)
```

(52) U.S. Cl.
CPC .......... *G03F 7/30* (2013.01); *C08F 220/1807* (2020.02); *C08F 220/283* (2020.02); *G03F 7/0382* (2013.01); *G03F 7/0392* (2013.01); *G03F 7/0397* (2013.01); *G03F 7/0758* (2013.01); *G03F 7/16* (2013.01); *G03F 7/32* (2013.01); *G03F 7/325* (2013.01); *G03F 7/38* (2013.01); *G03F 7/40* (2013.01); *H01L 21/027* (2013.01)

(58) Field of Classification Search
CPC ........... G03F 7/30; G03F 7/325; G03F 7/0382
See application file for complete search history.

(56) References Cited

U.S. PATENT DOCUMENTS

2012/0003591 A1* 1/2012 Enomoto .............. G03F 7/0397
                                                   430/325
2012/0028196 A1* 2/2012 Kamimura .............. G03F 7/325
                                                   430/464
2012/0052449 A1    3/2012 Kato et al.
2015/0227049 A1*  8/2015 Yamanaka ............. B65D 25/14
                                                   206/524.2
2016/0004156 A1*  1/2016 Sugiyama ............... G03F 7/038
                                                   430/311
2016/0026088 A1    1/2016 Yamanaka et al.
2016/0041465 A1    2/2016 Takizawa et al.
2016/0054658 A1    2/2016 Yoshidome et al.
2016/0152755 A1    6/2016 Fujiwara et al.
2016/0195814 A1*  7/2016 Enomoto ................ G03F 7/322
                                                   430/311
2017/0184973 A1    6/2017 Yamanaka
(Continued)

FOREIGN PATENT DOCUMENTS

JP    2000-288458 A    10/2000
JP    2009-025708 A1    2/2009
JP    2012-032788 A     2/2012
(Continued)

OTHER PUBLICATIONS

Communication dated Dec. 4, 2020, from the Taiwanese Patent Office in Taiwanese Application No. 106133648.
Communication dated Dec. 10, 2019, from the Japanese Patent Office in Application No. 2018-542915.
Communication dated Nov. 2, 2020 by the Korean Patent Office in application No. 10-2019-7009119.
(Continued)

*Primary Examiner* — John S Chu
(74) *Attorney, Agent, or Firm* — Sughrue Mion, PLLC

(57) ABSTRACT

An object of the present invention is to provide a pattern forming method which is excellent in developability and defect suppression performance. Another object of the present invention is to provide a method for producing an electronic device including the pattern forming method. Still another object of the present invention is to provide a kit capable of forming a pattern which is excellent in developability and defect suppression performance.

The pattern forming method of the present invention is a pattern forming method including a resist film forming step of forming a resist film on a substrate using an actinic ray-sensitive or radiation-sensitive resin composition; an exposing step of exposing the resist film; and a developing step of developing the exposed resist film using a developer, in which the actinic ray-sensitive or radiation-sensitive resin composition contains an acid-decomposable resin represented by a specific structure; and as the developer, a chemical liquid containing an organic solvent, alcohol impurities, and metal impurities containing at least metal atoms is used, the total content of the alcohol impurities being 0.01 mass ppb to 1000 mass ppm with respect to the total mass of the chemical liquid.

21 Claims, No Drawings

(56) References Cited

U.S. PATENT DOCUMENTS

2019/0171102 A1\* 6/2019 Kamimura .............. G03F 7/038

FOREIGN PATENT DOCUMENTS

| JP | 2012-047896 A | 3/2012 |
|---|---|---|
| JP | 2013-218308 A | 10/2013 |
| JP | 2014-211478 A | 11/2014 |
| JP | 2014-232309 A | 12/2014 |
| JP | 2015-084122 A | 4/2015 |
| JP | 2016-057614 A | 4/2016 |
| KR | 10-2012-0002468 A | 1/2012 |
| KR | 10-2015-0063128 A | 6/2015 |
| KR | 10-2015-0126641 A | 11/2015 |
| KR | 10-2015-0127303 A | 11/2015 |
| TW | 201205208 A1 | 2/2012 |
| WO | 2014/069245 A1 | 5/2014 |
| WO | 2014/162912 A1 | 10/2014 |
| WO | 2016/052393 A1 | 4/2016 |
| WO | 2017/169833 A1 | 10/2017 |

OTHER PUBLICATIONS

International Search Report dated Dec. 19, 2017 issued by the International Searching Authority in PCT/JP2017/035443.
Written Opinion dated Dec. 19, 2017 issued by the International Searching Authority in PCT/JP2017/035443.
International Preliminary Report on Patentability with the translation of Written Opinion dated Apr. 2, 2019 issued by the International Bureau in PCT/JP2017/035443.
Communication dated May 17, 2021, from the Korean Intellectual Property Office in application No. 10-2019-7009119.
Office Action dated Aug. 9, 2021, issued by the Taiwanese Patent Office in Taiwanese application No. 106133648.
Office Action dated May 16, 2022 issued by the Korean Patent Office in Korean Application No. 10-2022-7003398.
Office Action dated Nov. 21, 2022 in Korean Application No. 10-2022-7003398 English Machine Translation.
Office Action dated May 22, 2023, issued in Korean Application No. 10-2022-7003398.

\* cited by examiner

PATTERN FORMING METHOD, METHOD FOR PRODUCING ELECTRONIC DEVICE, AND KIT

CROSS-REFERENCE TO RELATED APPLICATIONS

This application is a Continuation of PCT International Application No. PCT/JP2017/035443 filed on Sep. 29, 2017, which claims priority under 35 U.S.C. § 119(a) to Japanese Patent Application No. 2016-194760 filed on Sep. 30, 2016. The above application is hereby expressly incorporated by reference, in its entirety, into the present application.

BACKGROUND OF THE INVENTION

1. Field of the Invention

The present invention relates to a pattern forming method, a method for producing an electronic device, and a kit.

2. Description of the Related Art

In the process of producing a semiconductor device such as an integrated circuit (IC) and a large scale integrated circuit (LSI), microfabrication by lithography using an actinic ray-sensitive or radiation-sensitive resin composition (photoresist composition) has been conventionally carried out. Recently, the integration degree of integrated circuits has been higher and consequently the formation of an ultrafine pattern in the sub-micron or quarter-micron range has been required. To cope with this requirement, the exposure wavelength has also tended to become shorter, for example, from g line to i line, or further to KrF excimer laser light. Furthermore, at present, the development of lithography using electron beams, X-rays, or extreme ultraviolet (EUV) light in addition to excimer laser light is also proceeding.

In such lithography, a film is formed by using a photoresist composition, the resulting film is developed with a developer, and the post-development film is cleaned with a rinsing liquid. In addition, in order to improve the wettability of a photoresist composition with respect to a substrate, a pre-wetting liquid is brought into contact with the substrate before applying the photoresist composition to the substrate.

In addition, recently, a resist composition containing a resin (acid-decomposable resin) having a group which is decomposed by the action of an acid to generate an alkali-soluble group is frequently used as a photoresist composition (for example, see JP2016-057614A).

SUMMARY OF THE INVENTION

In addition, recently, with the demand for further miniaturization of a pattern, further improvements are required for developability of a resist film after exposure and defect performance of the pattern to be formed.

As a result of investigation by forming a pattern using the resist composition containing an acid-decomposable resin described in the above-mentioned JP2016-057614A, the present inventors have found that there is room for further improvement because the developability and defect suppression performance do not necessarily satisfy the recently required level.

Therefore, an object of the present invention is to provide a pattern forming method which is excellent in developability and defect suppression performance.

Another object of the present invention is to provide a method for producing an electronic device including the pattern forming method.

As a result of extensive studies to achieve the foregoing objects, the present inventors have found that the foregoing objects can be achieved by subjecting a resist film containing an acid-decomposable resin having a specific structure to exposure and then, using as a developer, a chemical liquid containing an organic solvent as a main component and alcohol impurities and metal impurities in a trace amount. The present invention has been completed based on these findings.

That is, it has been found that the foregoing objects can be achieved by the following constitutions.

[1] A pattern forming method comprising:
a resist film forming step of forming a resist film on a substrate using an actinic ray-sensitive or radiation-sensitive resin composition;
an exposing step of exposing the resist film; and
a developing step of developing the exposed resist film using a developer,
in which the actinic ray-sensitive or radiation-sensitive resin composition contains a resin described later, and
the developer is a chemical liquid containing
an organic solvent,
organic impurities containing at least alcohol impurities, and
metal impurities containing metal atoms, in which the total content of the alcohol impurities is 0.01 mass ppb to 1000 mass ppm with respect to the total mass of the chemical liquid.

[2] A pattern forming method comprising:
a resist film forming step of forming a resist film on a substrate using an actinic ray-sensitive or radiation-sensitive resin composition;
an exposing step of exposing the resist film; and
a developing step of developing the exposed resist film using a developer,
in which the actinic ray-sensitive or radiation-sensitive resin composition contains a resin having a repeating unit having a phenolic hydroxyl group and having a group capable of decomposing by the action of an acid to generate a polar group, and
the developer is a chemical liquid containing
an organic solvent,
organic impurities containing at least alcohol impurities, and
metal impurities containing metal atoms, in which the total content of the alcohol impurities is 0.01 mass ppb to 1000 mass ppm with respect to the total mass of the chemical liquid.

[3] The pattern forming method according to [1] or [2],
in which the metal impurities contain at least one specific metal atom selected from the group consisting of an Fe atom, a Cr atom, a Ni atom, and a Pb atom,
in a case where the specific metal atom is one selected from the group consisting of an Fe atom, a Cr atom, a Ni atom, and a Pb atom, a content of the specific metal atom is 0.001 to 100 mass ppt with respect to the total mass of the chemical liquid,
in a case where the specific metal atom is two or more selected from the group consisting of an Fe atom, a Cr atom, a Ni atom, and a Pb atom, the content of each of the specific metal atoms is 0.001 to 100 mass ppt with respect to the total mass of the chemical liquid, and the total content of the metal atoms contained in the chemical liquid is 0.1 to 500 mass ppt with respect to the total mass of the chemical liquid.

[4] The pattern forming method according to any one of [1] to [3], in which the total content of the organic impurities is 1 to 5,000 mass ppm with respect to the total mass of the chemical liquid.

[5] The pattern forming method according to any one of [1] to [4], in which the organic impurities include one or more selected from the group consisting of dioctyl phthalate, diisononyl phthalate, dioctyl adipate, dibutyl phthalate, ethylene rubber, and ethylene propylene rubber.

[6] The pattern forming method according to any one of [1] to [5], in which the number of objects to be counted having a size of 0.1 μm or more counted by a light scattering type in-liquid particle counter in the chemical liquid is 100 objects to be counted/mL or less.

[7] The pattern forming method according to any one of [1] to [6], in which the content of water in the chemical liquid is 0.01 to 1.0 mass % with respect to the total mass of the chemical liquid.

[8] The pattern forming method according to any one of [1] to [7], in which the organic solvent is any one selected from the group consisting of propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, 1-hexanol, 2-heptanone, isoamyl acetate, and 4-methyl-2-pentanol.

[9] The pattern forming method according to any one of [1] to [8], further comprising:
a pre-wetting step of bringing a pre-wetting liquid into contact with the substrate before the resist film forming step,
in which the chemical liquid is used as the pre-wetting liquid.

[10] The pattern forming method according to any one of [1] to [9], further comprising:
a rinsing step of cleaning the substrate using a rinsing liquid after the developing step,
in which the chemical liquid is used as the rinsing liquid.

[11] The pattern forming method according to any one of [1] to [10], in which the actinic ray-sensitive or radiation-sensitive resin composition further contains a photoacid generator and an organic solvent.

[12] The pattern forming method according to [11], in which, in the actinic ray-sensitive or radiation-sensitive resin composition, at least one of the organic solvents is propylene glycol monomethyl ether acetate.

[13] A method for producing an electronic device, comprising:
the pattern forming method according to any one of [1] to [12].

[14] A kit comprising:
a developer; and
an actinic ray-sensitive or radiation-sensitive resin composition containing a resin described later,
in which the developer is a chemical liquid containing an organic solvent,
organic impurities containing at least alcohol impurities, and
metal impurities containing metal atoms, in which the total content of the alcohol impurities is 0.01 mass ppb to 1000 mass ppm with respect to the total mass of the chemical liquid.

[15] A kit comprising:
a developer; and
an actinic ray-sensitive or radiation-sensitive resin composition containing a resin having a repeating unit having a phenolic hydroxyl group and having a group capable of decomposing by the action of an acid to generate a polar group,
in which the developer is a chemical liquid containing an organic solvent,
organic impurities containing at least alcohol impurities, and
metal impurities containing metal atoms, in which the total content of the alcohol impurities is 0.01 mass ppb to 1000 mass ppm with respect to the total mass of the chemical liquid.

[16] The kit according to [14] or [15], further comprising:
a rinsing liquid,
in which the rinsing liquid is a chemical liquid containing an organic solvent,
organic impurities containing at least alcohol impurities, and
metal impurities containing metal atoms, in which the total content of the alcohol impurities is 0.01 mass ppb to 1000 mass ppm with respect to the total mass of the chemical liquid.

[17] The kit according to any one of [14] to [16],
in which the metal impurities contain at least one specific metal atom selected from the group consisting of an Fe atom, a Cr atom, a Ni atom, and a Pb atom,
in a case where the specific metal atom is one selected from the group consisting of an Fe atom, a Cr atom, a Ni atom, and a Pb atom, a content of the specific metal atom is 0.001 to 100 mass ppt with respect to the total mass of the chemical liquid,
in a case where the specific metal atom is two or more selected from the group consisting of an Fe atom, a Cr atom, a Ni atom, and a Pb atom, the content of each of the specific metal atoms is 0.001 to 100 mass ppt with respect to the total mass of the chemical liquid, and
the total content of the metal atoms contained in the chemical liquid is 0.1 to 500 mass ppt with respect to the total mass of the chemical liquid.

[18] The kit according to any one of [14] to [17],
in which the actinic ray-sensitive or radiation-sensitive resin composition further contains
an organic solvent,
organic impurities containing at least alcohol impurities, and
metal impurities containing metal atoms, in which the total content of the alcohol impurities is 0.01 mass ppb to 1000 mass ppm with respect to the total mass of the composition.

According to the present invention, it is possible to provide a pattern forming method which is excellent in developability and defect suppression performance.

Further, according to the present invention, it is possible to provide a method for producing an electronic device including the pattern forming method.

Further, according to the present invention, it is possible to provide a kit capable of forming a pattern which is excellent in developability and defect suppression performance.

DESCRIPTION OF THE PREFERRED EMBODIMENTS

Hereinafter, the present invention will be described in detail.

The description of constituent features given below is often made based on representative embodiments of the present invention, but the present invention is not limited to such embodiments.

In the present specification, the numerical range shown with "to" refers to a range including the numerical values indicated before and after "to" as a lower limit value and an upper limit value, respectively.

Further, the term "preparation" in the present invention is intended to include the provision of a specific material by synthesis or formulation thereof, but also the procurement of a predetermined material by purchase or the like.

In the present invention, the term "ppm" means "parts-per-million ($10^{-6}$)", the term "ppb" means "parts-per-billion ($10^{-9}$)", and the term "ppt" means "parts-per-trillion ($10^{-12}$)".

In the present invention, 1 Å (angstrom) corresponds to 0.1 nm.

Incidentally, the term "group (atom group)" used in the present invention is intended to include both unsubstituted and substituted groups unless designated as "unsubstituted" or "substituted" within a range not impairing the effects of the present invention. For example, the term "hydrocarbon group" includes not only a hydrocarbon group having no substituent (unsubstituted hydrocarbon group) but also a hydrocarbon group having a substituent (substituted hydrocarbon group). This also has the same meaning for each compound.

The term "radiation" in the present invention refers to, for example, far ultraviolet rays, extreme ultraviolet rays (EUV light), X-rays, or electron beams. The term "light" in the present invention refers to actinic rays or radiation. Unless otherwise indicated, the term "exposure" in the present invention includes not only exposure to far ultraviolet rays, X-rays, EUV light, or the like but also lithography with particle beams such as electron beams or ion beams.

[Pattern Forming Method]

The pattern forming method according to the embodiment of the present invention includes:

a resist film forming step of forming a resist film on a substrate using an actinic ray-sensitive or radiation-sensitive resin composition;

an exposing step of exposing the resist film; and a developing step of developing the exposed resist film using a developer.

Herein, the actinic ray-sensitive or radiation-sensitive resin composition contains a resin described later.

In addition, a chemical liquid having the following constitution is used as the developer.

(Chemical liquid)

A chemical liquid containing:

an organic solvent;

organic impurities containing at least alcohol impurities; and metal impurities containing metal atoms, in which the total content of the alcohol impurities is 0.01 mass ppb to 1000 mass ppm with respect to the total mass of the chemical liquid.

According to the study of the present inventors, it has been confirmed that the developability and the defect suppression performance are excellent in a case where the developer is a chemical liquid having the above-mentioned constitution. In particular, in a case where the total content of the alcohol impurities is less than 0.01 mass ppb with respect to the total mass of the chemical liquid, it has been found that the developing time is prolonged in a case where the chemical liquid is applied to a developer. This is presumably because the development promoting action by highly polar alcohol impurities cannot be obtained. On the other hand, in a case where the total content of the alcohol impurities exceeds 1000 mass ppm with respect to the total mass of the chemical liquid, it has been found that the development may unintentionally proceed excessively in a case where the chemical liquid is applied to a developer. This is presumably because the development is promoted too much by highly polar alcohol impurities. In addition, in a case where the content of the alcohol impurities is large, the defect suppression performance also tends to decrease.

Particularly in a case where the chemical liquid has the following constitution (that is, by controlling the content of metal impurities in the chemical liquid), developability and defect suppression performance are even superior.

(Chemical liquid)

A chemical liquid containing:

an organic solvent;

organic impurities containing at least alcohol impurities; and metal impurities containing metal atoms, in which the total content of the alcohol impurities is 0.01 mass ppb to 1000 mass ppm with respect to the total mass of the chemical liquid, the metal impurities contain at least one specific metal atom selected from the group consisting of an Fe atom, a Cr atom, a Ni atom, and a Pb atom, in a case where the specific metal atom is one selected from the group consisting of an Fe atom, a Cr atom, a Ni atom, and a Pb atom, the content of the specific metal atom is 0.001 to 100 mass ppt with respect to the total mass of the chemical liquid, in a case where the specific metal atom is two or more selected from the group consisting of an Fe atom, a Cr atom, a Ni atom, and a Pb atom, the content of each of the metal atoms is 0.001 to 100 mass ppt with respect to the total mass of the chemical liquid, and the total content of the metal atoms contained in the chemical liquid is 0.1 to 500 mass ppt with respect to the total mass of the chemical liquid.

The present inventors have found that the number of defects is less likely to increase in a case where the total content of metal atoms in the chemical liquid is 0.1 mass ppt or more with respect to the total mass of the chemical liquid. It is considered that the metal impurities are present in the chemical liquid in a state of free metal ions and in a solidified state by association therebetween. In a case where the chemical liquid is applied to a developer, free metal ions tend to adhere to the substrate surface, so it is assumed that the metal impurities are more likely to be removed from the substrate as they are in a solidified state.

In a case where the total content of metal atoms in the chemical liquid is 0.1 mass ppt or more with respect to the total mass of the chemical liquid, there is a tendency that metal ions are less likely to be liberated alone in the chemical liquid (that is, a decrease in the association rate is suppressed) and remain on the substrate surface. On the other hand, in a case where the total content of metal atoms in the chemical liquid is 500 mass ppt or less with respect to the total mass of the chemical liquid, there is a tendency that deterioration of the number of defects due to an increase in the total content of metal atoms in the chemical liquid hardly occurs.

In addition, the present inventors have found that, among the metal impurities containing a metal atom, metal impurities containing at least one metal atom (specific metal atom) selected from the group consisting of an Fe atom, a Cr atom, a Ni atom, and a Pb atom are easily adsorbed to various materials (for example, a base material and an insulating film).

Therefore, it is preferred that the content of at least one specific metal atom selected from the group consisting of an Fe atom, a Cr atom, a Ni atom, and a Pb atom in the chemical liquid is independently 0.001 to 100 mass ppt (preferably 0.1 to 100 mass ppt) with respect to the total mass of the chemical liquid. That is, in a case where the specific metal atom is one selected from the group consisting of an Fe atom, a Cr atom, a Ni atom, and a Pb atom, it is preferred that the content of one type of the specific metal atom is 0.001 to 100 mass ppt (preferably 0.1 to 100 mass ppt) with respect to the total mass of the chemical liquid. On the other hand, in a case where the specific metal atom is two or more selected from the group consisting of an Fe atom, a Cr atom, a Ni atom, and a Pb atom, it is preferred that the content of each specific metal atom is 0.001 to 100 mass ppt (preferably 0.1 to 100 mass ppt) with respect to the total mass of the chemical liquid.

In a case where the contents of an Fe atom, a Cr atom, a Ni atom, and a Pb atom are each independently 0.001 mass ppt or more with respect to the total mass of the chemical liquid, metal ions are less likely to be liberated alone in the chemical liquid (that is, a decrease in the association rate is suppressed) and remain on the substrate surface. On the other hand, in a case where the contents of an Fe atom, a Cr atom, a Ni atom, and a Pb atom are each independently 100 mass ppt or less with respect to the total mass of the chemical liquid, deterioration of the number of defects can be further suppressed.

It is inferred for the pattern forming method according to the embodiment of the present invention that the effects of the present invention are obtained by subjecting an exposed film of a resist film containing a resin described later (acid-decomposable resin) to development using the above chemical liquid.

Hereinafter, the pattern forming method according to the embodiment of the present invention will be described first, and the actinic ray-sensitive or radiation-sensitive resin composition and the chemical liquid will be then described respectively.

[Pattern Forming Method]

The pattern forming method according to the embodiment of the present invention includes:

(i) a resist film forming step of forming a resist film on a substrate using an actinic ray-sensitive or radiation-sensitive resin composition;
(ii) an exposing step of exposing the resist film; and
(iii) a developing step of developing the exposed resist film using a developer.

The pattern forming method according to the embodiment of the present invention is not particularly limited as long as it includes the above steps (i) to (iii). Hereinafter, aspects (1) to (7) are listed as preferred aspects.

(1) The pattern forming method according to the embodiment of the present invention preferably has (iv) a preheating step (also referred to as a prebake (PB) step) after (i) a resist film forming step and before (ii) an exposing step.

(2) The pattern forming method according to the embodiment of the present invention preferably has (v) a post exposure bake (PEB) step after (ii) an exposing step and before (iii) a developing step.

(3) The pattern forming method according to the embodiment of the present invention preferably has (vi) a post-development heating step (also referred to as a post bake (POB) step) after (iii) a developing step (after a rinsing step in a case where the rinsing step is carried out).

(4) The pattern forming method according to the embodiment of the present invention preferably has (vii) a pre-wetting step of bringing a pre-wetting liquid into contact with a substrate before (i) a resist film forming step. In addition, a later-described chemical liquid is preferably used as the pre-wetting liquid.

(5) The pattern forming method according to the embodiment of the present invention also preferably has (viii) a rinsing step of cleaning the substrate using a rinsing liquid after (iii) a developing step and before (vi) a post-development heating step. In addition, a later-described chemical liquid is preferably used as the rinsing liquid.

(6) In the pattern forming method according to the embodiment of the present invention, the exposure method in (ii) an exposing step is preferably immersion exposure.

(7) The pattern forming method according to the embodiment of the present invention may include (ii) an exposing step a plurality of times.

The resist film in the present invention is a film formed from an actinic ray-sensitive or radiation-sensitive resin composition described later, and more specifically, it is preferably a film formed by applying the above composition on a substrate.

In the pattern forming method according to the embodiment of the present invention, the above-mentioned (i) resist film forming step, (ii) exposing step, (iii) developing step, (vii) pre-wetting step, and (viii) rinsing step can be carried out by generally known methods.

The substrate is not particularly limited, and it is possible to use substrates which are generally used in steps of producing a semiconductor such as IC, steps of producing a circuit board such as a liquid crystal or a thermal head, and steps for other types of photofabrication lithography. Specific examples of the substrate include an inorganic substrate such as silicon, $SiO_2$, or SiN and a coating type inorganic substrate such as spin on glass (SOG).

In addition, if necessary, an antireflection film may be formed between the resist film and the substrate. A known organic or inorganic antireflection film can be appropriately used as the antireflection film.

In the pattern forming method according to the embodiment of the present invention, it is particularly preferable to have (vi) a post-development heating step (POB). This is because a developer (chemical liquid described below) and a rinsing liquid remaining between the patterns and inside the pattern are removed by including (vi) a post-development heating step (POB) in the pattern forming method. At this time, volatilization of impurities including organic substances such as alcohol impurities and organic impurities in the chemical liquid, which will be described later, also occurs, so that it is possible to further improve the defect suppression performance of the obtained pattern.

In addition, by including (iv) a preheating step (PB) and (v) a post exposure bake step (PEB) in the pattern forming method, the reaction of the exposed portion is promoted and sensitivity and/or pattern profile is improved. In particular, there is an effect that the exposure effectively proceeds, since the resist solvent is sufficiently removed and does not remain in the film by including (iv) a preheating step (PB) in the pattern forming method.

The heating temperature is preferably 70° C. to 130° C. and more preferably 80° C. to 120° C. in both of PB and PEB.

The heating time is preferably 30 to 300 seconds, more preferably 30 to 180 seconds, and still more preferably 30 to 90 seconds in both of PB and PEB.

The heating can be carried out by means provided in an ordinary exposure or development machine, and may be carried out using a hot plate or the like.

In addition, the heating temperature of POB is preferably 40° C. to 250° C. and more preferably 70° C. to 220° C.

The heating time is preferably 10 seconds to 10 minutes and more preferably 30 seconds to 5 minutes.

The light source wavelength used in the exposure apparatus is not limited, and examples thereof include infrared rays, visible rays, ultraviolet rays, far ultraviolet rays, extreme ultraviolet rays, X-rays, and electron beams, for example, far ultraviolet rays at a wavelength of preferably 250 nm or less, more preferably 220 nm or less, and still more preferably 1 to 200 nm, specifically a KrF excimer laser (248 nm), an ArF excimer laser (193 nm), an F2 excimer laser (157 nm), X-rays, EUV (13 nm), electron beams, and the like, among which a KrF excimer laser, an ArF excimer laser, EUV, or electron beams are preferable, an ArF excimer laser, EUV, or electron beams are more preferable, and an ArF excimer laser is still more preferable.

In addition, in the pattern forming method according to the embodiment of the present invention, a liquid immersion exposure method can be applied to (ii) an exposing step. The liquid immersion exposure method can be combined with a super-resolution technique such as a phase shift method or a modified illumination method. The liquid immersion exposure can be carried out, for example, according to the method described in paragraphs [0594] to [0601] of JP2013-242397A.

In a case where the receding contact angle of the resist film is excessively small, it is not possible to suitably use the film in a case of exposing through a liquid immersion medium and it is not possible to sufficiently exhibit an effect of reducing residual water (watermark) defects. In order to realize a preferable receding contact angle, a hydrophobic resin is preferably contained in an actinic ray-sensitive or radiation-sensitive resin composition which will be described later. Alternatively, a film (hereinafter, also referred to as a "top coat") sparingly soluble in an immersion liquid formed of the hydrophobic resin may be provided on the upper layer of the resist film. The functions required for the top coat are coating suitability with respect to the upper layer part of a resist film and sparingly soluble properties in an immersion liquid. It is preferred that the composition for forming a top coat is not mixed with a composition film of the actinic ray-sensitive or radiation-sensitive resin composition to be described later and can be uniformly applied on the upper layer of the resist film of the actinic ray-sensitive or radiation-sensitive resin composition to be described later.

There are no particular limitations on the preparation of the composition for forming a top coat and the method for forming a top coat, and it is possible to use a conventionally known method such as a method described in paragraphs [0072] to [0082] of JP2014-059543A. In the pattern forming method according to the embodiment of the present invention, it is also preferable to form a top coat containing a basic compound described in JP2013-061648A on the resist film.

In addition, even in a case where the exposure is carried out by a method other than the liquid immersion exposure method, a top coat may be formed on the resist film.

(iii) In the developing step, a predetermined chemical is used. The chemical will be described later.

The developing method is not particularly limited, and it is possible to apply, for example, a method of dipping a substrate in a tank which is filled with a developer for a certain period of time (a dipping method), a method of carrying out development by raising the developer onto the substrate surface using surface tension and leaving the substrate to stand for a certain period of time (a puddle method), a method of spraying the developer onto the substrate surface (a spraying method), a method of continuously jetting the developer onto a substrate which is rotating at a certain speed while scanning a developer jetting nozzle at a certain speed (a dynamic dispensing method), or the like. The suitable range of the jet pressure of the jetted developer, the method of adjusting the jet pressure of the developer, and the like are not particularly limited. For example, ranges and methods described in paragraphs [0631] to [0636] of JP2013-242397A can be used.

(iii) a rinsing step carried out after (viii) a developing step is a step of cleaning the substrate that has been subjected to development using a developer (a chemical liquid described later) containing an organic solvent as a main component, using a rinsing liquid. The rinsing liquid is not particularly limited and known ones can be used, and among them, it is preferable to use a chemical liquid described later. Since the chemical liquid described later is highly purified, the obtained pattern is superior in defect suppression performance.

The method of the cleaning process is not particularly limited and it is possible to apply, for example, a method of continuously jetting a rinsing liquid onto a substrate spinning at a certain speed (spin coating method), a method of dipping the substrate in a tank which is filled with the rinsing liquid for a certain period of time (a dipping method), a method of spraying the rinsing liquid onto the substrate surface (a spraying method), or the like. It is preferable to carry out the cleaning process using the spin coating method among these methods, to rotate the substrate at a rotation speed of 2000 rpm to 4000 rpm after the cleaning, and to remove the rinsing liquid from the substrate.

(vii) The pre-wetting step is a step of bringing a pre-wetting liquid into contact with a substrate before (i) the resist film forming step so as to improve the wettability of the actinic ray-sensitive or radiation-sensitive resin composition to the substrate surface.

The pre-wetting liquid is not particularly limited and known ones can be used, and among them, it is preferable to use a chemical liquid described later. Since the chemical liquid described later is highly purified, it is possible to form a resist film in which defects are suppressed, and eventually the pattern obtained through the developing step (iii) is superior in defect suppression performance.

There is no particular limitation on the method of pre-wetting and it is possible to apply, for example, a method of continuously jetting the pre-wetting liquid onto a substrate rotating at a certain speed (spin coating method), a method of dipping the substrate in a tank which is filled with the pre-wetting liquid for a certain period of time (a dipping method), a method of spraying a pre-wetting liquid onto the substrate surface (a spraying method), or the like.

In the present invention, a predetermined chemical liquid is used as a developer. However, as described above, from the viewpoint of more remarkably obtaining the effect desired by the present application, it is preferable to use a predetermined chemical liquid as a pre-wetting liquid, and it is more preferable to use a predetermined chemical liquid as a pre-wetting liquid and a rinsing liquid.

<Actinic Ray-Sensitive or Radiation-Sensitive Resin Composition>

<<Acid-Decomposable Resin>>

The actinic ray-sensitive or radiation-sensitive resin composition contains a resin represented by Formula (I) as an acid-decomposable resin or has a repeating unit having a phenolic hydroxyl group described later, and contains a resin having a group capable of decomposing by the action of an acid to generate a polar group.

Hereinafter, individual resins will be described.

Resin Represented by Formula (I)

The actinic ray-sensitive or radiation-sensitive resin composition contains a resin including a repeating unit selected from the group consisting of a repeating unit represented by Formula (a), a repeating unit represented by Formula (b), a repeating unit represented by Formula (c), a repeating unit represented by Formula (d), and a repeating unit represented by Formula (e) (hereinafter, this resin is also referred to as a "resin represented by Formula (I)").

The resin represented by Formula (I) is a resin whose solubility in a developer (a chemical liquid described later) containing an organic solvent as a main component is reduced by the action of an acid, and has a group capable of decomposing by the action of an acid to generate an alkali-soluble group (for example, a carboxy group). Since the chemical liquid described later is particularly excellent in permeability to a resin represented by Formula (I), defects due to development residues can be significantly suppressed, in addition to being excellent in developability.

Hereinafter, the resin represented by Formula (I) will be described.

(Resin Represented by Formula (I))

(I)

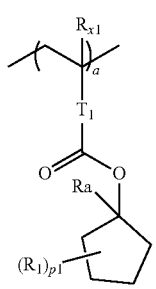
(a)

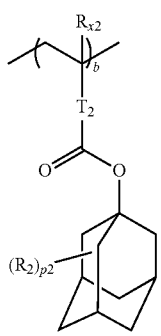
(b)

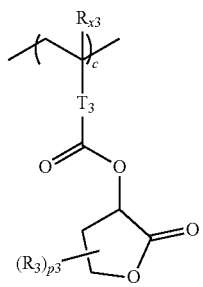
(c)

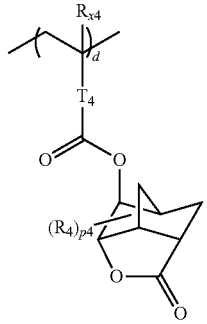
(d)

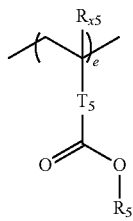
(e)

Formula (I) is constituted of a repeating unit (a) (a repeating unit represented by Formula (a)), a repeating unit (b) (a repeating unit represented by Formula (b)), a repeating unit (c) (a repeating unit represented by Formula (c)), a repeating unit (d) (a repeating unit represented by Formula (d)), and a repeating unit (e) (a repeating unit represented by Formula (e)).

$R_{x1}$ to $R_{x5}$ each independently represent a hydrogen atom or an alkyl group which may have a substituent.

$R_1$ to $R_4$ each independently represent a monovalent substituent, and $p_1$ to $p_4$ each independently represent 0 or a positive integer.

$R_a$ represents a linear or branched alkyl group.

$T_1$ to $T_5$ each independently represent a single bond or a divalent linking group.

$R_5$ represents a monovalent organic group.

a to e each represent mol %, and each independently represent a number within ranges of $0 \leq a \leq 100$, $0 \leq b \leq 100$, $0 \leq c < 100$, $0 \leq d < 100$, and $0 \leq e < 100$, provided that $a+b+c+d+e=100$ and $a+b \neq 0$.

However, in Formula (I), the repeating unit (e) has a structure different from any of the repeating units (a) to (d).

Examples of the alkyl group which may have a substituent, which is represented by Rat to $R_{x5}$, include a methyl group and a group represented by $-CH_2-R_{11}$. $R_{11}$ represents a halogen atom (such as a fluorine atom), a hydroxyl group, or a monovalent organic group.

$R_{x1}$ to $R_{x5}$ are each independently preferably a hydrogen atom, a methyl group, a trifluoromethyl group, or a hydroxymethyl group.

Examples of the divalent linking group represented by $T_1$ to $T_5$ in Formula (I) include an alkylene group, a —COO-Rt- group, and an —O-Rt- group. In the formula, Rt represents an alkylene group or a cycloalkylene group.

$T_1$ to $T_5$ are each independently preferably a single bond or a —COO-Rt- group. Rt is preferably an alkylene group having 1 to 5 carbon atoms and more preferably a —$CH_2$— group, a —$(CH_2)_2$— group, or a —$(CH_2)_3$— group.

In Formula (I), $R_a$ represents a linear or branched alkyl group, examples of which include a methyl group, an ethyl group, and a t-butyl group. Among them, a linear or branched alkyl group having 1 to 4 carbon atoms is preferable.

In Formula (I), $R_1$ to $R_4$ each independently represent a monovalent substituent. $R_1$ to $R_4$ are not particularly limited and examples thereof include a hydroxyl group, a cyano group, and a linear or branched alkyl group or cycloalkyl group having a hydroxyl group, a cyano group, or the like.

In Formula (I), $p_1$ to pa each independently represent 0 or a positive integer. The upper limit value of $p_1$ to pa corresponds to the number of hydrogen atoms that can be substituted in each repeating unit.

In Formula (I), $R_5$ represents a monovalent organic group. $R_5$ is not particularly limited and examples thereof include a monovalent organic group having a sultone structure; a monovalent organic group having a cyclic ether such as tetrahydrofuran, dioxane, 1,4-thioxane, dioxolane, and 2,4,6-trioxabicyclo[3.3.0]octane; and an acid-decomposable group (for example, an adamantyl group quaternized by substituting the carbon at the position bonding to a —COO group with an alkyl group).

Further, in Formula (I), it is also preferred that the repeating unit (b) is formed from the monomer described in paragraphs [0014] to [0018] of JP2016-138219A.

In Formula (I), a to e each represent mol % and each independently represent a number included in the range of 0≤a≤100, 0≤b≤100, 0≤c<100, 0≤d<100, and 0≤e<100, provided that a+b+c+d+e=100 and a+b≠0.

In Formula (I), a+b (the content of the repeating unit having an acid-decomposable group with respect to all repeating units) is preferably 20 to 90 mol %, more preferably 25 to 85 mol %, and still more preferably 30 to 80 mol %.

In Formula (I), c+d (the content of the repeating unit having a lactone structure with respect to all repeating units) is preferably 3 to 80 mol % and more preferably 3 to 60 mol %.

The weight-average molecular weight (Mw) of the resin represented by Formula (I) is usually 1,000 to 200,000, preferably 2,000 to 20,000, and more preferably 3,000 to 15,000. The weight-average molecular weight is a value in terms of polystyrene determined by a gel permeation chromatography (GPC) method using tetrahydrofuran (THF) as a developing solvent.

The content of the resin represented by Formula (I) in the actinic ray-sensitive or radiation-sensitive resin composition is usually 30 to 99 mass % and preferably 50 to 95 mass % based on the total solid content of the actinic ray-sensitive or radiation-sensitive resin composition.

Resin Having Repeating Unit Having Phenolic Hydroxyl Group and Having Group Capable of Decomposing by Action of Acid to Generate Polar Group Hereinafter, a resin having a repeating unit having a phenolic hydroxyl group and having a group capable of decomposing by the action of an acid to generate a polar group (hereinafter, also referred to as "resin P") will be described. The resin P is a resin whose solubility in a developer (a chemical liquid described later) containing an organic solvent as a main component is reduced by the action of an acid, and has a group capable of decomposing by the action of an acid to generate a polar group (for example, an alkali-soluble group such as a carboxy group). Since the chemical liquid described later is particularly excellent in permeability to the resin P, defects due to development residues can be significantly suppressed, in addition to being excellent in developability.

(Repeating Unit Having Phenolic Hydroxyl Group)

The resin P contains a repeating unit having a phenolic hydroxyl group.

The repeating unit having a phenolic hydroxyl group may be, for example, a repeating unit represented by Formula (IA).

In the formula, $R_{41}$, $R_{42}$, and $R_{43}$ each independently represent a hydrogen atom, an alkyl group, a halogen atom, a cyano group, or an alkoxycarbonyl group. Meanwhile, $R_{42}$ may be bonded to $Ar_4$ to form a ring, and $R_{42}$ in this case represents a single bond or an alkylene group.

$X_4$ represents a single bond, —COO—, or —$CONR_{64}$— in which $R_{64}$ represents a hydrogen atom or an alkyl group.

$L_4$ represents a single bond or an alkylene group.

$Ar_4$ represents an (n+1)-valent aromatic ring group, and in a case of being bonded to $R_{42}$ to form a ring, $Ar_4$ represents an (n+2)-valent aromatic ring group.

n represents an integer of 1 to 5.

The alkyl group of $R_{41}$, $R_{42}$, and $R_{43}$ in Formula (IA) is preferably an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, or a dodecyl group, which may have a substituent, more preferably an alkyl group having 8 or less carbon atoms, and still more preferably an alkyl group having 3 or less carbon atoms.

The cycloalkyl group of $R_{41}$, $R_{42}$, and $R_{43}$ in Formula (IA) may be monocyclic or polycyclic. The cycloalkyl group is preferably a monocyclic cycloalkyl group having 3 to 8 carbon atoms, such as a cyclopropyl group, a cyclopentyl group, or a cyclohexyl group, which may have a substituent.

Examples of the halogen atom of $R_{41}$, $R_{42}$, and $R_{43}$ in Formula (IA) include a fluorine atom, a chlorine atom, a bromine atom, and an iodine atom, among which a fluorine atom is preferable.

The alkyl group contained in the alkoxycarbonyl group of $R_{41}$, $R_{42}$, and $R_{43}$ in Formula (IA) is preferably the same as the alkyl group in $R_{41}$, $R_{42}$, and $R_{43}$.

Examples of the substituent in each of the above-mentioned groups include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The number of carbon atoms in the substituent is preferably 8 or less.

$Ar_4$ represents an (n+1)-valent aromatic ring group. The divalent aromatic ring group in a case where n is 1 may have a substituent, and preferred examples thereof include arylene groups having 6 to 18 carbon atoms, such as a phenylene group, a tolylene group, a naphthylene group, and an anthracenylene group, and aromatic ring groups containing a hetero ring, such as thiophene, furan, pyrrole, benzothiophene, benzofuran, benzopyrrole, triazine, imidazole, benzimidazole, triazole, thiadiazole, and thiazole.

Specific examples of the (n+1)-valent aromatic ring group in a case where n is an integer of 2 or more include groups formed by removing an (n−1) number of any hydrogen atoms from the above-mentioned specific examples of the divalent aromatic ring group.

The (n+1)-valent aromatic ring group may further have a substituent.

Examples of the substituent that the above-mentioned alkyl group, cycloalkyl group, alkoxycarbonyl group, alkylene group, and (n+1)-valent aromatic ring group may have include alkyl groups exemplified for $R_{41}$, $R_{42}$, and $R_{43}$ in Formula (IA); alkoxy groups such as a methoxy group, an ethoxy group, a hydroxyethoxy group, a propoxy group, a hydroxypropoxy group, and a butoxy group; and aryl groups such as a phenyl group.

The alkyl group for $R_{64}$ in —$CONR_{64}$— ($R_{64}$ represents a hydrogen atom or an alkyl group) represented by $X_4$ include alkyl groups having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, which may have a substituent, among which alkyl groups having 8 or less carbon atoms are more preferable.

$X_4$ is preferably a single bond, —COO—, or —CONH— and more preferably a single bond or —COO—.

The alkylene group for $L_4$ is preferably an alkylene group having 1 to 8 carbon atoms, such as a methylene group, an ethylene group, a propylene group, a butylene group, a hexylene group, or an octylene group, which may have a substituent.

$Ar_4$ is preferably an aromatic ring group having 6 to 18 carbon atoms which may have a substituent, and more preferably a benzene ring group, a naphthalene ring group, or a biphenylene ring group.

The repeating unit represented by Formula (IA) preferably comprises a hydroxystyrene structure. That is, $Ar_4$ is preferably a benzene ring group.

The repeating unit having a phenolic hydroxyl group is preferably a repeating unit represented by Formula (p1).

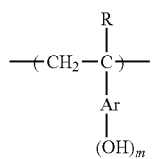

(p1)

R in Formula (p1) represents a hydrogen atom, a halogen atom, or a linear or branched alkyl group having 1 to 4 carbon atoms. A plurality of R's may be the same as or different from one another. R in Formula (p1) is preferably a hydrogen atom.

The Ar in Formula (p1) represents an aromatic ring, examples of which include aromatic hydrocarbon rings having 6 to 18 carbon atoms which may have a substituent, such as a benzene ring, a naphthalene ring, an anthracene ring, a fluorene ring, and a phenanthrene ring; and aromatic hetero rings containing a hetero ring, such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring. Among them, a benzene ring is more preferable.

m in Formula (p1) represents an integer of 1 to 5 and is preferably 1.

Specific examples of the repeating unit having a phenolic hydroxyl group are shown below, but the present invention is not limited thereto. In the formulae, a represents 1 or 2.

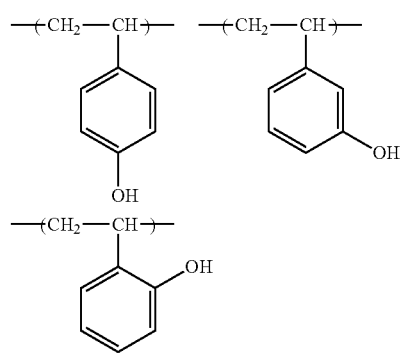

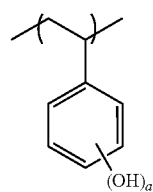

(B-1)

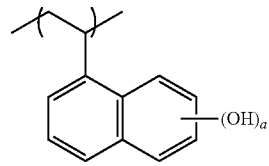

(B-2)

(B-3)

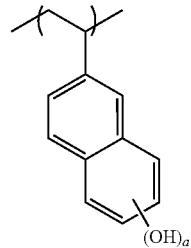

(B-4)

-continued
(B-5)
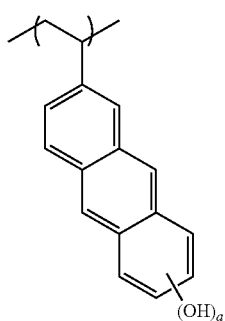
(B-6)
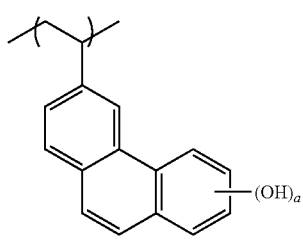
(B-7)
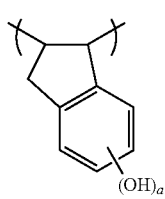
(B-8)
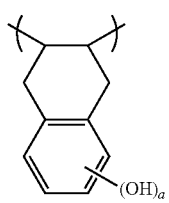
(B-9)
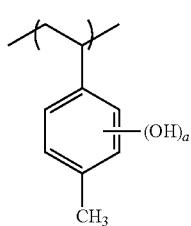
(B-10)
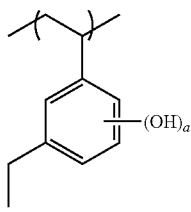
(B-11)
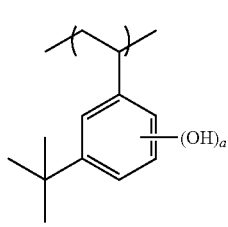
-continued
(B-12)
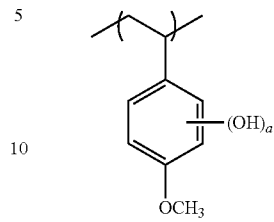
(B-13)
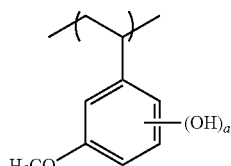
(B-14)
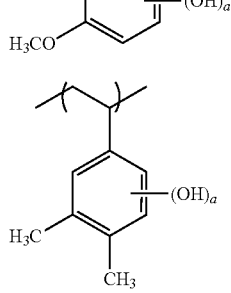
(B-15)
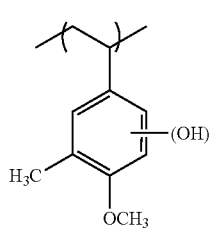
(B-16)
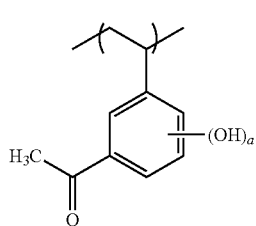
(B-17)
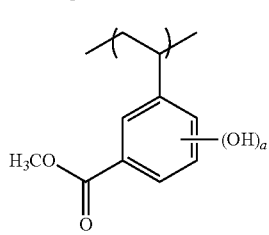
(B-18)
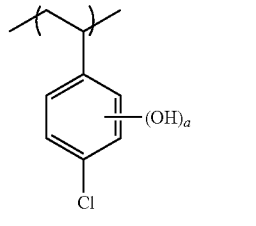

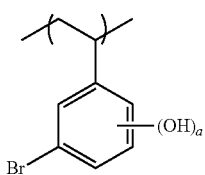
(B-19)
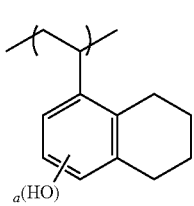
(B-20)
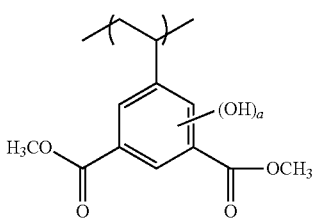
(B-21)
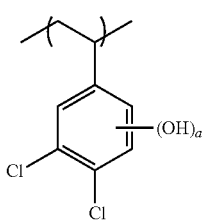
(B-22)
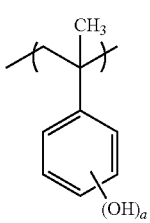
(B-23)
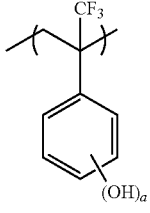
(B-24)
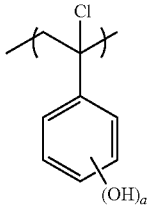
(B-25)
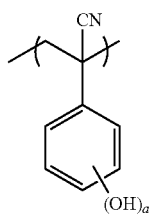
(B-26)
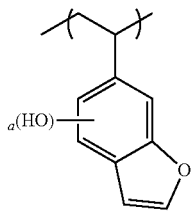
(B-27)
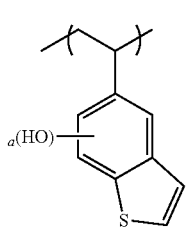
(B-28)
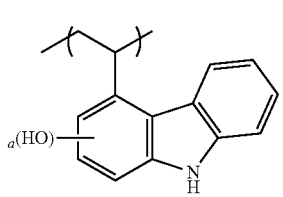
(B-29)
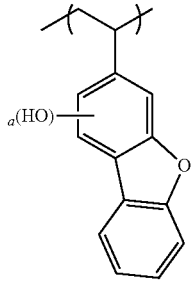
(B-30)
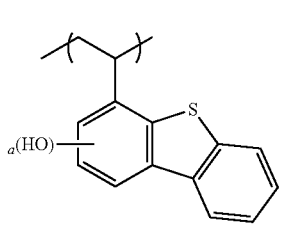
(B-31)
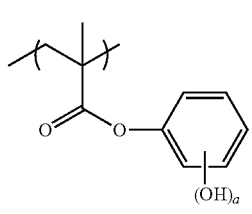
(B-32)

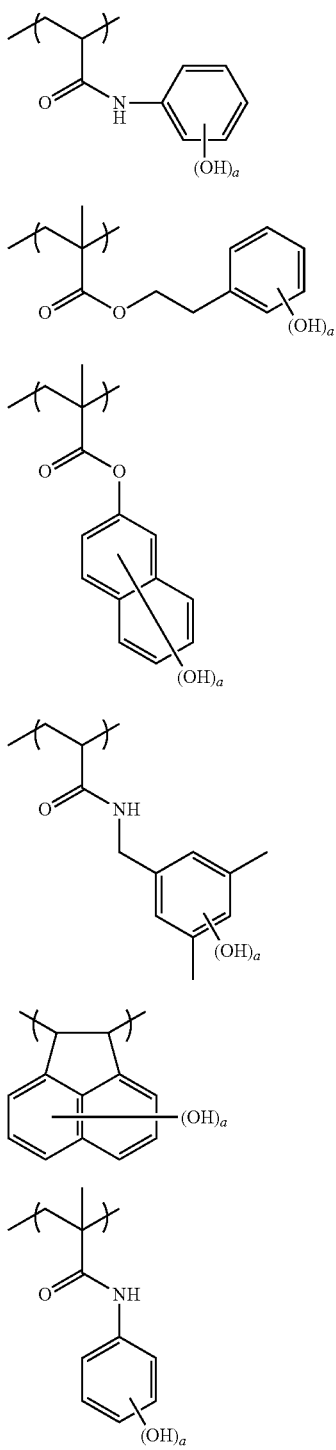

(B-33)
(B-34)
(B-35)
(B-36)
(B-37)
(B-38)

The content of the repeating unit having a phenolic hydroxyl group is preferably 1 to 50 mol %, more preferably 1 to 45 mol %, and still more preferably 1 to 40 mol %, with respect to all repeating units in the resin P.

As described above, the resin P has a group capable of decomposing by the action of an acid to generate a polar group. That is, the resin P corresponds to a resin whose solubility in a developer containing an organic solvent as a main component is reduced by the action of an acid. The resin P preferably has a repeating unit having a group capable of decomposing by the action of an acid to generate a polar group (hereinafter, also referred to as "acid-decomposable group"), and more preferably has a repeating unit represented by Formula (AI).

The polar group may be an alkali-soluble group. Examples of the alkali-soluble group include a carboxy group, a fluorinated alcohol group (preferably a hexafluoroisopropanol group), a phenolic hydroxyl group, and a sulfonic acid group.

In the acid-decomposable group, the polar group is protected by a group capable of being eliminated by the action of an acid (acid-eliminable group). Examples of the acid-eliminable group include $-C(R_{36})(R_{37})(R_{38})$, $-C(R_{36})(R_{37})(OR_{39})$, and $-C(R_{01})(R_{02})(OR_{39})$.

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

Hereinafter, the repeating unit represented by Formula (AI) will be described. (Formula (AI): repeating unit having acid-decomposable group)

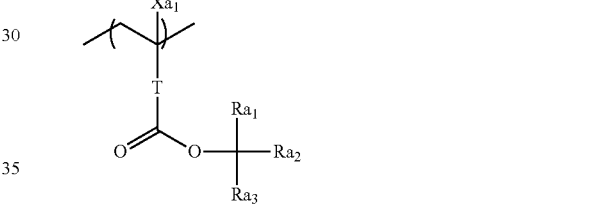

(AI)

In Formula (AI)

$X_{a1}$ represents a hydrogen atom or an alkyl group which may have a substituent.

T represents a single bond or a divalent linking group.

$Ra_1$ to $Ra_3$ each independently represent an alkyl group (linear or branched) or a cycloalkyl group (monocyclic or polycyclic).

Two of $Ra_1$ to $Ra_3$ may be bonded to each other to form a cycloalkyl group (monocyclic or polycyclic).

Examples of the alkyl group which may have a substituent represented by $X_{a1}$ include a methyl group and a group represented by $-CH_2-R_{11}$. $R_{11}$ represents a halogen atom (such as a fluorine atom), a hydroxyl group, or a monovalent organic group.

$X_{a1}$ is preferably a hydrogen atom, a methyl group, a trifluoromethyl group, or a hydroxymethyl group.

Examples of the divalent linking group of T include an alkylene group, a $-COO-Rt-$ group, and an $-O-Rt-$ group. In the formula, Rt represents an alkylene group or a cycloalkylene group.

T is preferably a single bond or a $-COO-Rt-$ group. Rt is preferably an alkylene group having 1 to 5 carbon atoms and more preferably a $-CH_2-$ group, a $-(CH_2)_2-$ group, or a $-(CH_2)_3-$ group.

The alkyl group of $Ra_1$ to $Ra_3$ is preferably an alkyl group having 1 to 4 carbon atoms.

The cycloalkyl group of $Ra_1$ to $Ra_3$ is preferably a monocyclic cycloalkyl group such as a cyclopentyl group or a cyclohexyl group, or a polycyclic cycloalkyl group such as a norbornyl group, a tetracyclodecanyl group, a tetracyclodododecanyl group, or an adamantyl group.

The cycloalkyl group formed by bonding of two of $Ra_1$ to $Ra_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group. The monocyclic cycloalkyl group having 5 or 6 carbon atoms is more preferable.

In the cycloalkyl group formed by bonding of two of $Ra_1$ to $Ra_3$, for example, one of methylene groups constituting the ring may be substituted with a heteroatom such as an oxygen atom, or a group having a heteroatom such as a carbonyl group.

The repeating unit represented by Formula (AI) is preferably, for example, an aspect in which $Ra_1$ is a methyl group or an ethyl group, and $Ra_2$ and $Ra_3$ are bonded to each other to form the above-mentioned cycloalkyl group.

Each of the above groups may have a substituent, and examples of the substituent include an alkyl group (having 1 to 4 carbon atoms), a halogen atom, a hydroxyl group, an alkoxy group (having 1 to 4 carbon atoms), a carboxy group, and an alkoxycarbonyl group (having 2 to 6 carbon atoms), with the number of carbon atoms being preferably 8 or less.

The content as the total of the repeating units represented by Formula (AI) is preferably 20 to 90 mol %, more preferably 25 to 85 mol %, and still more preferably 30 to 80 mol %, with respect to all repeating units in the resin P.

Specific examples of the repeating unit represented by Formula (AI) are shown below, but the present invention is not limited thereto.

In the specific examples, Rx and $Xa_1$ each independently represent a hydrogen atom, $CH_3$, $CF_3$, or $CH_2OH$. Rxa and Rxb each represent an alkyl group having 1 to 4 carbon atoms. Z represents a substituent containing a polar group, and in a case where a plurality of Z's are present, they are each independent from one another. p represents 0 or a positive integer. Examples of the substituent containing a polar group, which is represented by Z, include a hydroxyl group, a cyano group, an amino group, an alkylamido group, and a sulfonamido group, and a linear or branched alkyl group or cycloalkyl group having these groups.

1
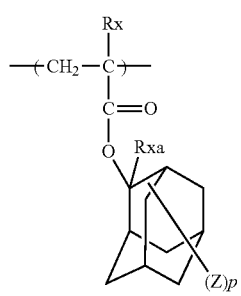

2
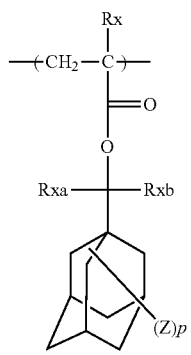

3
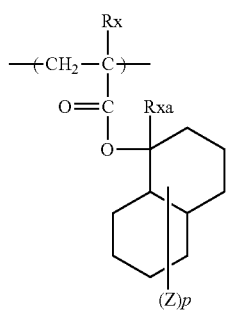

4
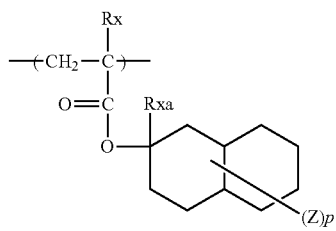

5
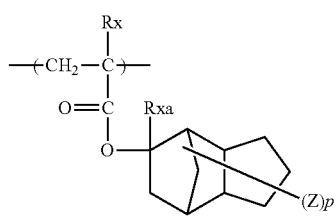

6
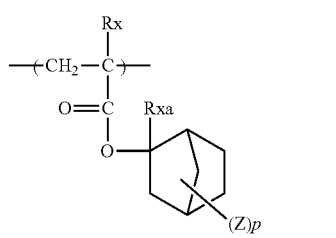

7
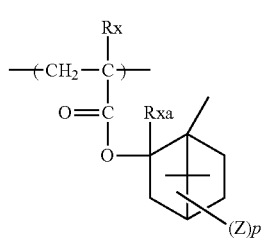

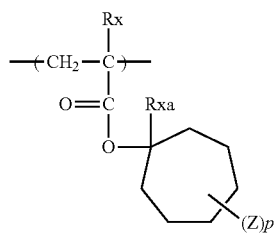
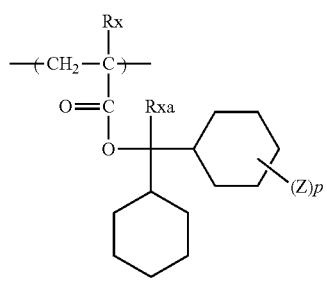
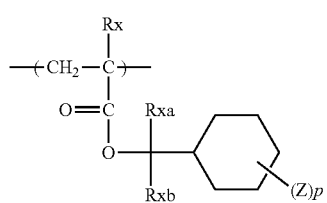
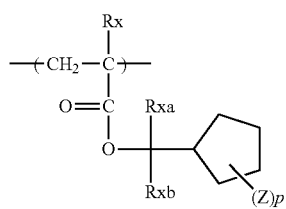
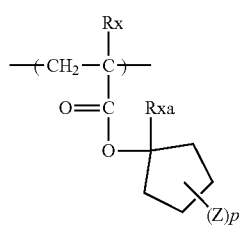
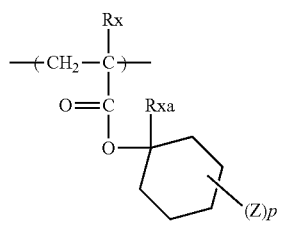
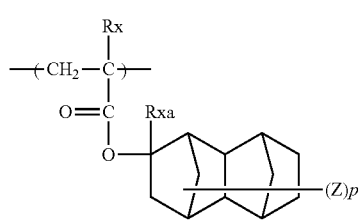
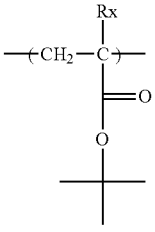
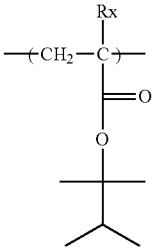
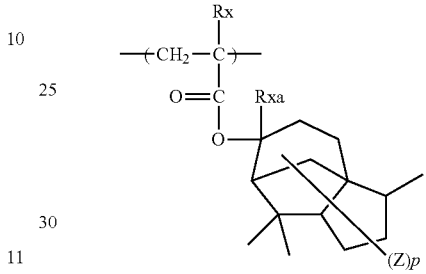
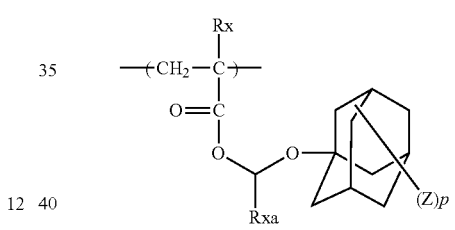
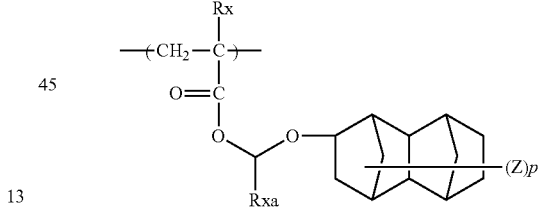
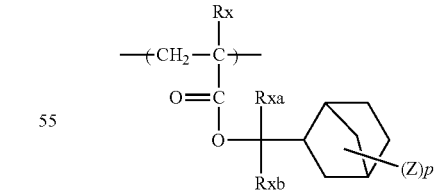
(Repeating Unit Having Lactone Structure)
Further, the resin P preferably contains a repeating unit having a lactone structure.
The repeating unit having a lactone structure preferably has a lactone structure in the side chain thereof, and is more preferably a repeating unit derived from a (meth)acrylic acid derivative monomer, for example.

The repeating units having a lactone structure may be used alone or in combination of two or more thereof, but it is preferable to use only one type of repeating unit.

The content of the repeating unit having a lactone structure with respect to all repeating units of the resin P is, for example, 3 to 80 mol % and preferably 3 to 60 mol %.

The lactone structure is preferably a 5- to 7-membered lactone structure and more preferably a structure in which another ring structure is fused to a 5- to 7-membered lactone structure in a form that forms a bicyclo structure or a Spiro structure.

As the lactone structure, it is preferable to have a repeating unit having a lactone structure represented by any one of Formulae (LC1-1), . . . , or (LC1-17). The lactone structure is preferably a lactone structure represented by Formula (LC1-1), Formula (LC1-4), Formula (LC1-5), or Formula (LC1-8) and more preferably a lactone structure represented by Formula (LC1-4).

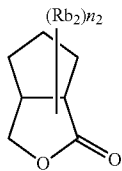
LC1-15

LC1-16

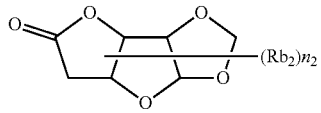
LC1-17

The lactone structure moiety may have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxy group, a halogen atom, a hydroxyl group, a cyano group, and an acid-decomposable group. $n_2$ represents an integer of 0 to 4. In a case where $n_2$ is 2 or more, a plurality of substituents ($Rb_2$)'s may be the same as or different from one another or the plurality of substituents ($Rb_2$)'s may be bonded to each other to form a ring.

(Repeating Unit Containing Organic Group Having Polar Group)

The resin P may further contain a repeating unit containing an organic group having a polar group, in particular, a repeating unit having an alicyclic hydrocarbon structure substituted with a polar group.

This improves adhesiveness to a substrate and affinity for a developer. The alicyclic hydrocarbon structure substituted with a polar group is preferably an adamantyl group, a diamantyl group, or a norbornane group. The polar group is preferably a hydroxyl group or a cyano group.

Specific examples of the repeating unit having a polar group are listed below, but the present invention is not limited thereto.

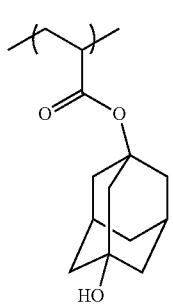 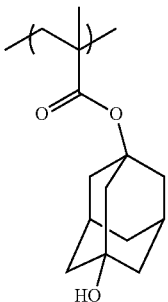

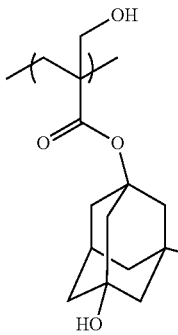
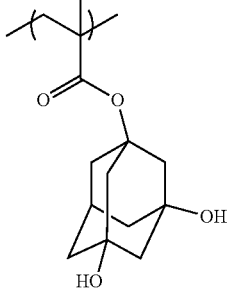

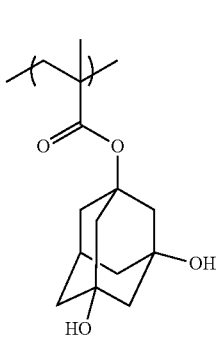
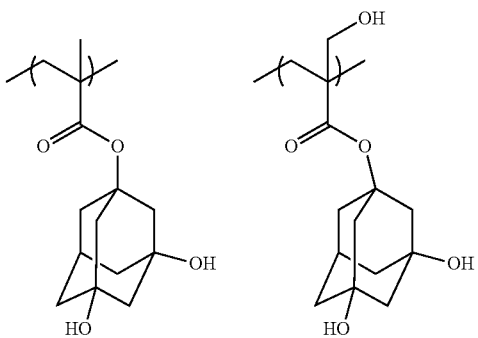

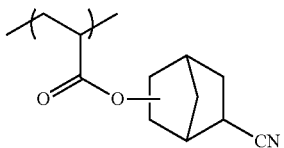

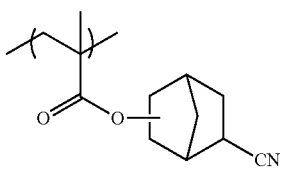

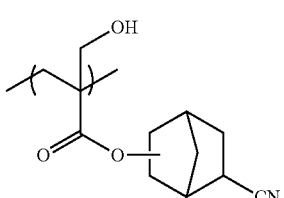
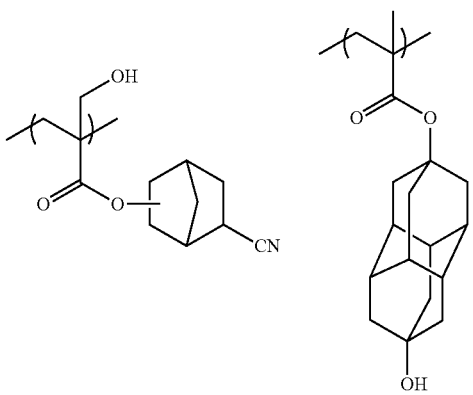

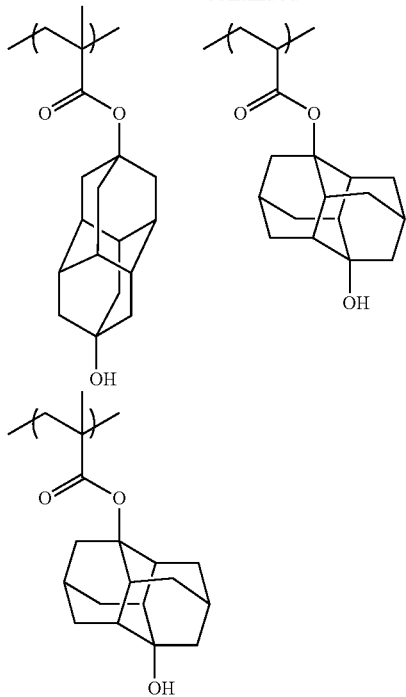

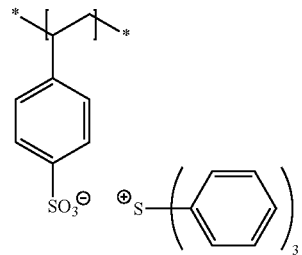

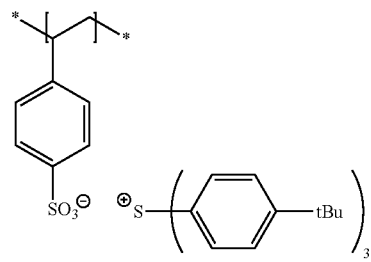

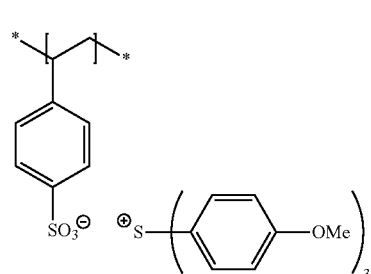

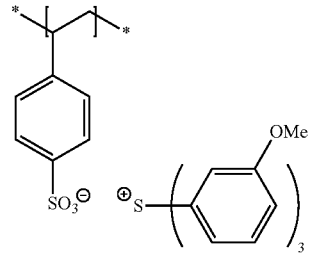

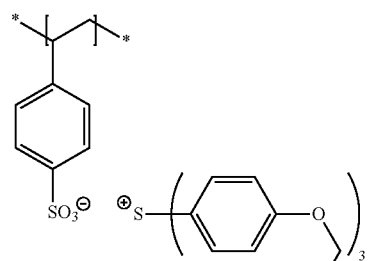

In a case where the resin P contains a repeating unit containing an organic group having a polar group, the content thereof is preferably 1 to 50 mol %, more preferably 1 to 30 mol %, still more preferably 5 to 25 mol %, and particularly preferably 5 to 20 mol %, with respect to all repeating units in the resin P.

(Repeating Unit Having Group Capable of Generating Acid Upon Irradiation with Actinic Rays or Radiation (Photoacid Generating Group))

The resin P may contain a repeating unit having a group capable of generating an acid upon irradiation with actinic rays or radiation (photoacid generating group).

The repeating unit having a group capable of generating an acid upon irradiation with actinic rays or radiation (photoacid generating group) may be, for example, a repeating unit represented by Formula (4).

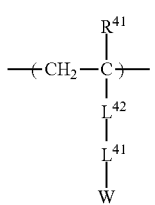

(4)

$R^{41}$ represents a hydrogen atom or a methyl group. $L^{41}$ represents a single bond or a divalent linking group. $L^{42}$ represents a divalent linking group. W represents a structural moiety capable of decomposing upon irradiation with actinic rays or radiation to generate an acid on the side chain.

Specific examples of the repeating unit represented by Formula (4) are shown below, but the present invention is not limited thereto.

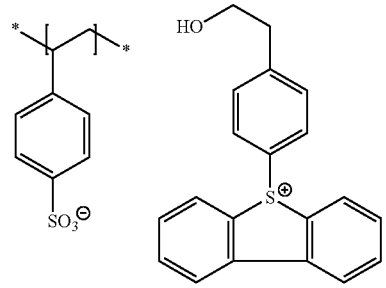

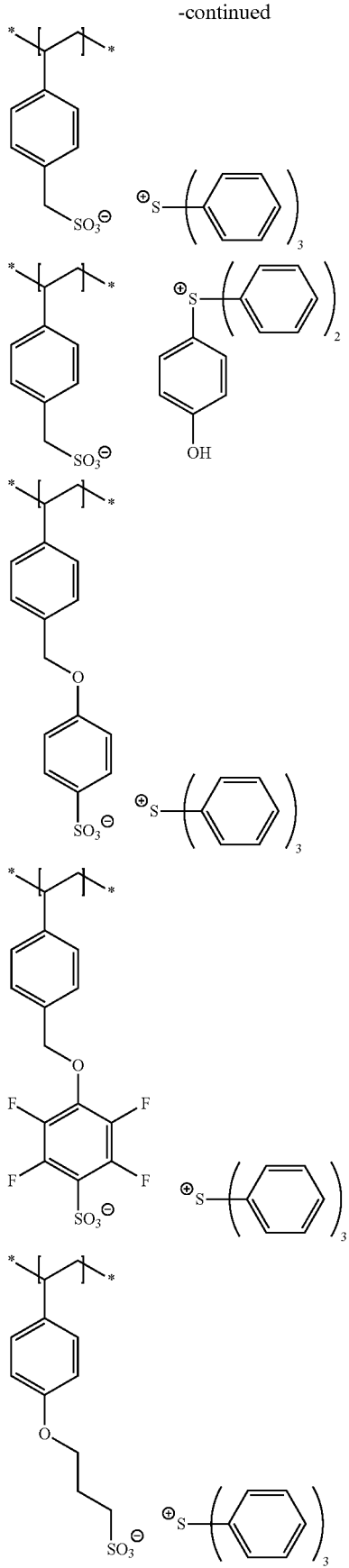
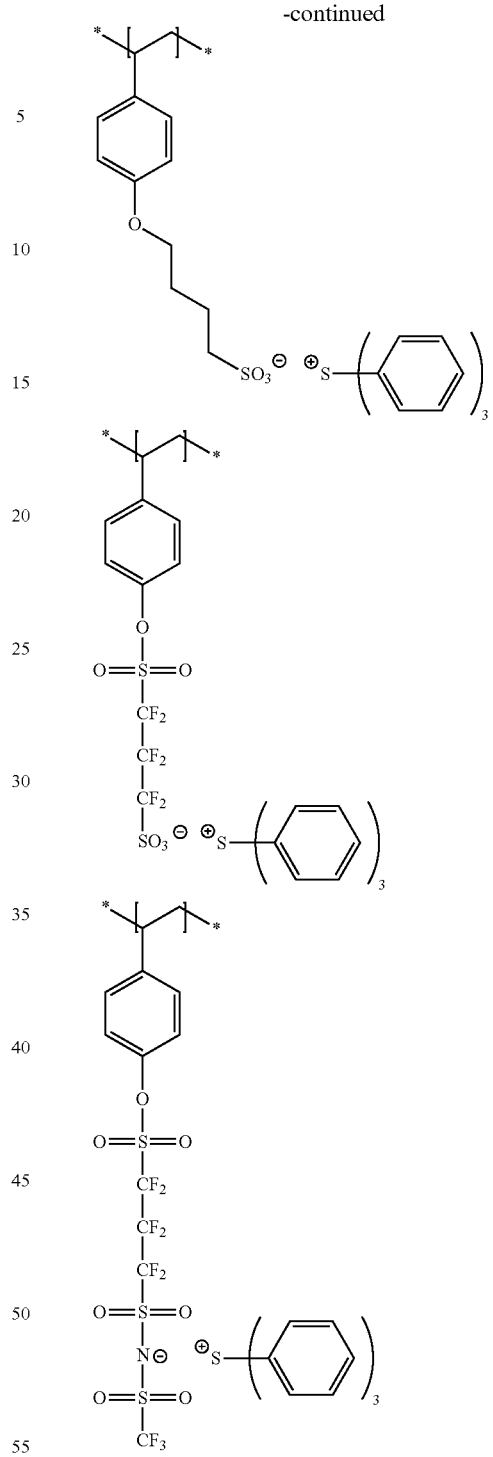

Additional examples of the repeating unit represented by Formula (4) include repeating units described in paragraphs [0094] to [0105] of JP2014-041327A.

In a case where the resin P contains a repeating unit having a photoacid generating group, the content of the repeating unit having a photoacid generating group is preferably 1 to 40 mol %, more preferably 5 to 35 mol %, and still more preferably 5 to 30 mol %, with respect to all repeating units in the resin P.

The resin P may contain a repeating unit represented by Formula (VI).

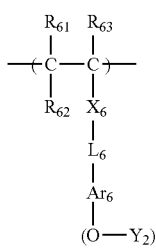

(VI)

In Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. Meanwhile, $R_{62}$ and $Ar_6$ may be bonded to each other to form a ring, and $R_{62}$ in this case represents a single bond or an alkylene group.

$X_6$ represents a single bond, —COO—, or —CONR$_{64}$—. $R_{64}$ represents a hydrogen atom or an alkyl group.

$L_6$ represents a single bond or an alkylene group.

$Ar_6$ represents an (n+1)-valent aromatic ring group and, in a case of being bonded to $R_{62}$ to form a ring, $Ar_6$ represents an (n+2)-valent aromatic ring group.

In a case of n≥2, $Y_2$'s each independently represent a hydrogen atom or a group capable of being eliminated by the action of an acid, provided that at least one of $Y_2$'s represents a group capable of being eliminated by the action of an acid.

n represents an integer of 1 to 4.

The group $Y_2$ capable of being eliminated by the action of an acid is preferably a structure represented by Formula (VI-A).

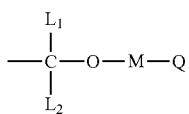

(VI-A)

$L_1$ and $L_2$ each independently represent a hydrogen atom, an alkyl group, a cycloalkyl group, an aryl group, or a group formed by combining an alkylene group and an aryl group.

M represents a single bond or a divalent linking group.

Q represents an alkyl group, a cycloalkyl group which may contain a heteroatom, an aryl group which may contain a heteroatom, an amino group, an ammonium group, a mercapto group, a cyano group, or an aldehyde group.

At least two of Q, M, or $L_1$ may be bonded to form a ring (preferably a 5-membered or 6-membered ring).

The repeating unit represented by Formula (VI) is preferably a repeating unit represented by Formula (3).

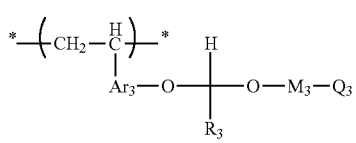

(3)

In Formula (3), $Ar_3$ represents an aromatic ring group.

$R_3$ represents a hydrogen atom, an alkyl group, a cycloalkyl group, an aryl group, an aralkyl group, an alkoxy group, an acyl group, or a heterocyclic group.

$M_3$ represents a single bond or a divalent linking group.

$Q_3$ represents an alkyl group, a cycloalkyl group, an aryl group, or a heterocyclic group.

At least two of $Q_3$, $M_3$, or $R_3$ may be bonded to form a ring.

The aromatic ring group represented by $Ar_3$ is the same as $Ar_6$ in Formula (VI) in a case where n in Formula (VI) is 1, more preferably a phenylene group or a naphthylene group, and still more preferably a phenylene group.

Specific examples of the repeating unit represented by Formula (VI) are shown below, but the present invention is not limited thereto.

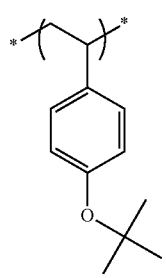

(VI-1)

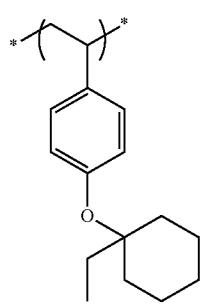

(VI-2)

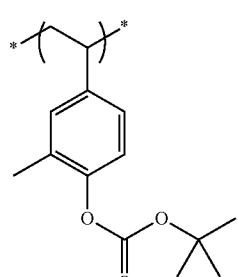

(VI-3)

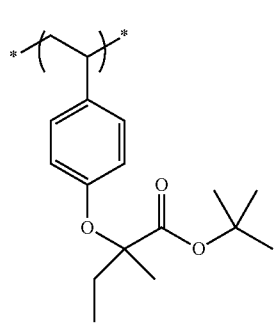

(VI-4)

(VI-5)
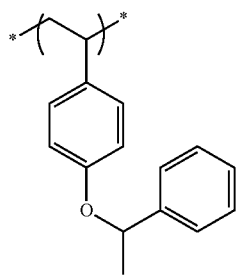
(VI-6)
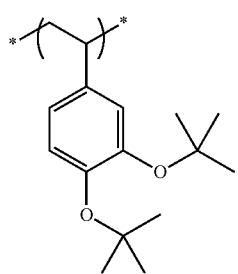
(VI-7)
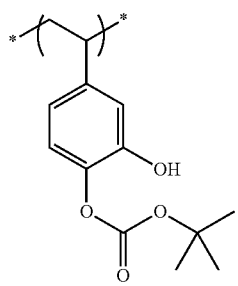
(VI-8)
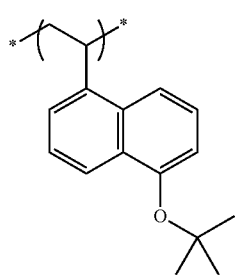
(VI-9)
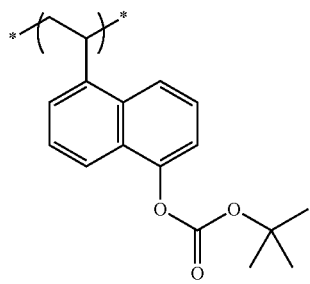
(VI-10)
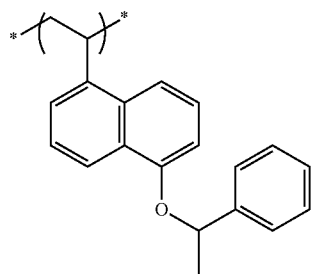
(VI-11)
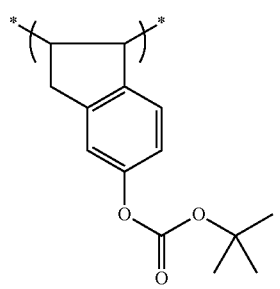
(VI-12)
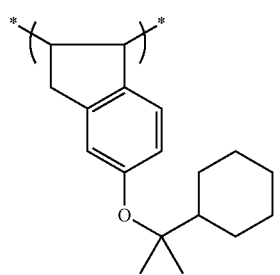
(VI-13)
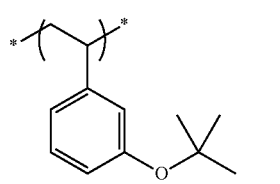
(VI-14)
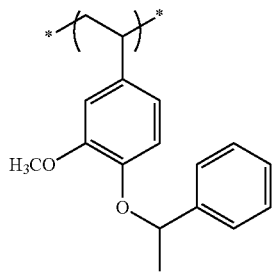
(VI-15)
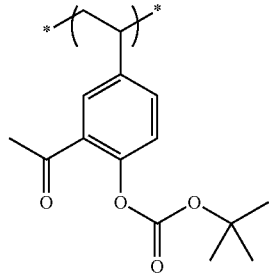

(VI-16)
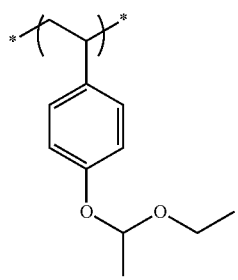
(VI-17)
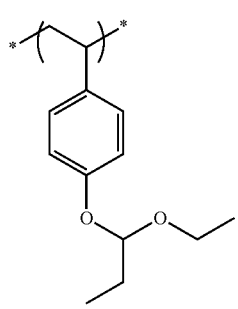
(VI-18)
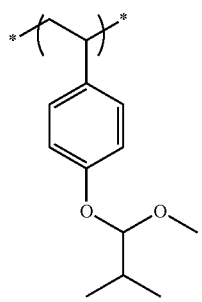
(VI-19)
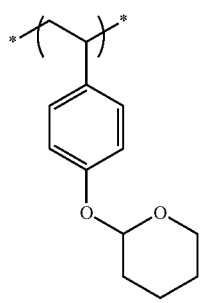
(VI-20)
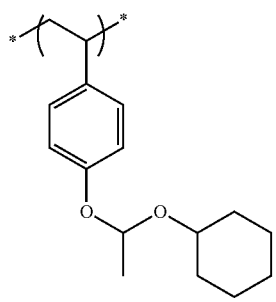
(VI-21)
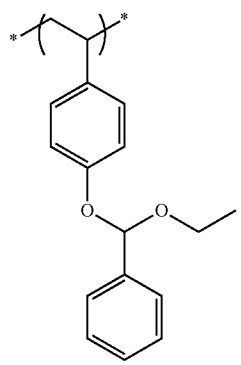
(VI-22)
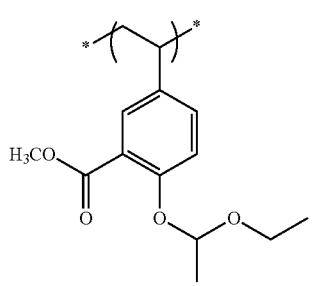
(VI-23)
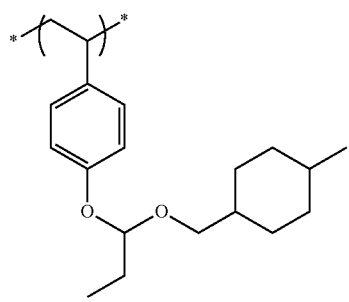
(VI-24)
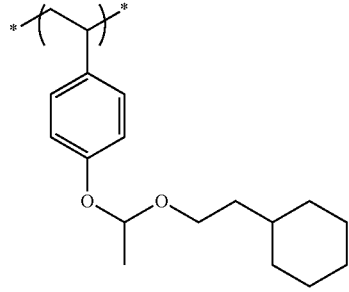
(VI-25)
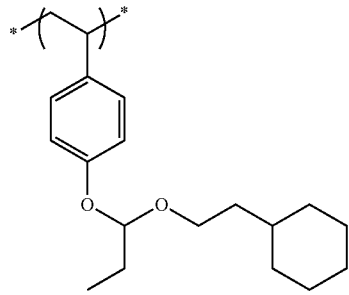

(VI-26) 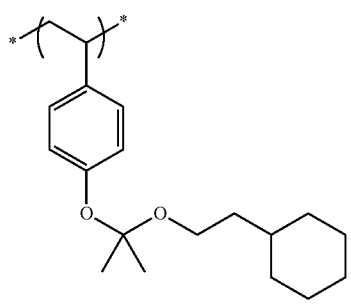
(VI-27) 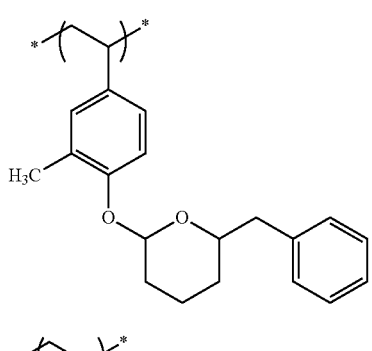
(VI-28) 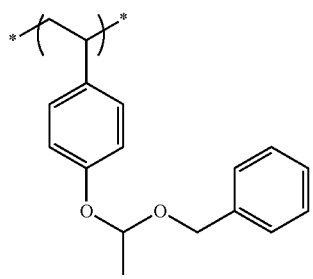
(VI-29) 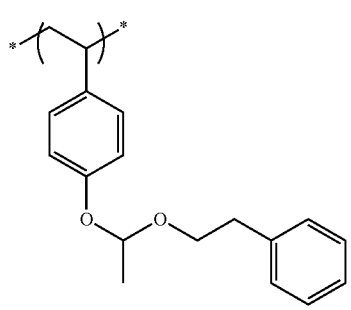
(VI-30) 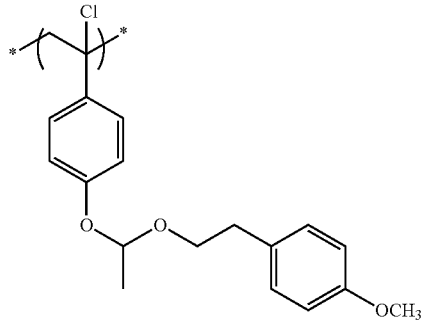
(VI-31) 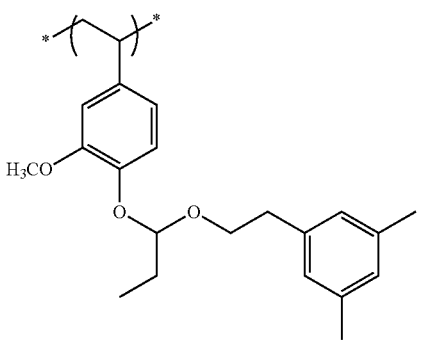
(VI-32) 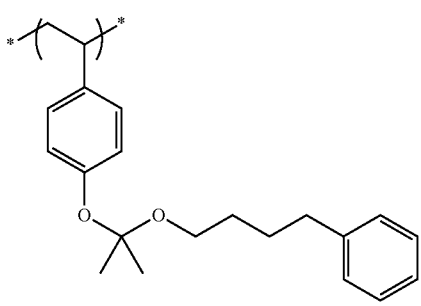
(VI-33) 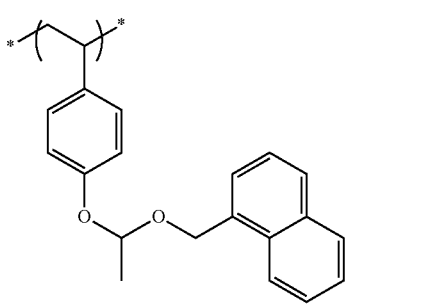
(VI-34) 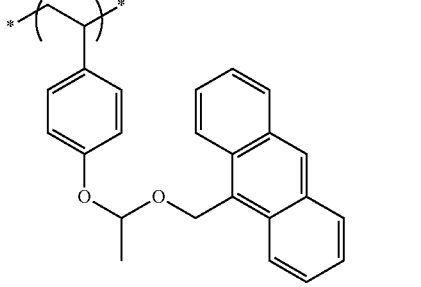
(VI-35) 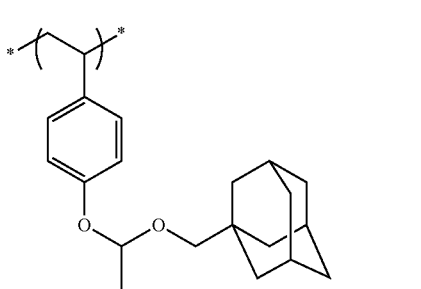

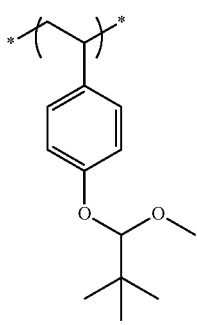
(VI-36)

The resin P may contain a repeating unit represented by Formula (4).

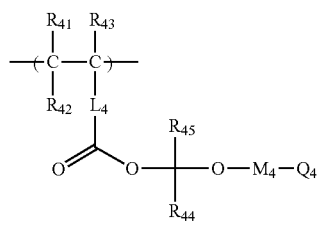
(4)

In Formula (4), $R_{41}$, $R_{42}$, and $R_{43}$ each independently represent a hydrogen atom, an alkyl group, a cycloalkyl group, a halogen atom, a cyano group, or an alkoxycarbonyl group. $R_{42}$ and $L_4$ may be bonded to form a ring, and $R_{42}$ in this case represents an alkylene group.

$L_4$ represents a single bond or a divalent linking group, and $L_4$ represents a trivalent linking group in a case of being bonded to $R_{42}$ to form a ring.

$R_{44}$ and $R_{45}$ each represent a hydrogen atom, an alkyl group, a cycloalkyl group, an aryl group, an aralkyl group, an alkoxy group, an acyl group, or a heterocyclic group.

$M_4$ represents a single bond or a divalent linking group.

$Q_4$ represents an alkyl group, a cycloalkyl group, an aryl group, or a heterocyclic group.

At least two of $Q_4$, $M_4$, or $R_{44}$ may be bonded to form a ring.

$R_{41}$, $R_{42}$, and $R_{43}$ have the same definition as $R_{41}$, $R_{42}$, and $R_{43}$ in Formula (IA), and preferred ranges thereof are also the same.

$L_4$ has the same definition as T in Formula (AI), and a preferred range thereof is also the same.

$R_{44}$ and $R_{45}$ have the same definition as $R_3$ in Formula (3), and preferred ranges thereof are also the same.

$M_4$ has the same definition as $M_3$ in Formula (3), and a preferred range thereof is also the same.

$Q_4$ has the same definition as $Q_3$ in Formula (3), and a preferred range thereof is also the same.

Examples of the ring formed by bonding of at least two of $Q_4$, $M_4$, or $R_{44}$ include rings formed by bonding of at least two of $Q_3$, $M_3$, or $R_3$, and preferred ranges thereof are also the same.

Specific examples of the repeating unit represented by Formula (4) are shown below, but the present invention is not limited thereto.

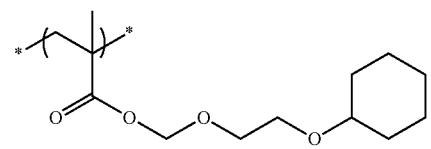
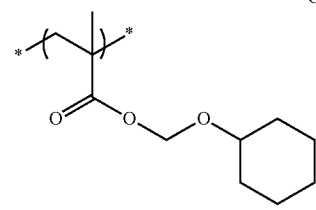
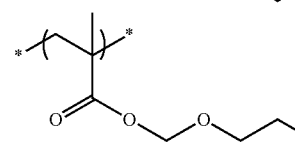
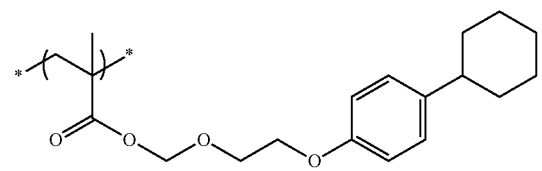
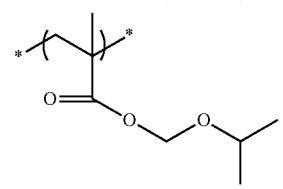
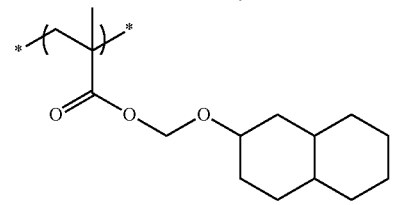
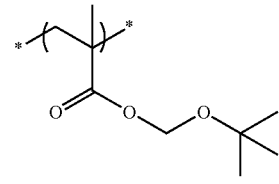
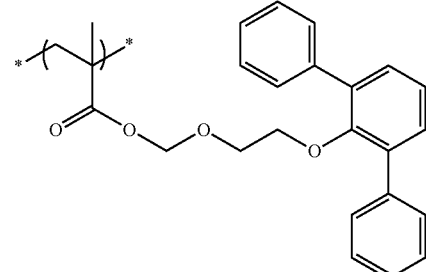
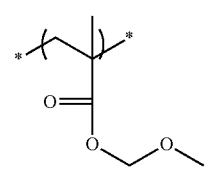

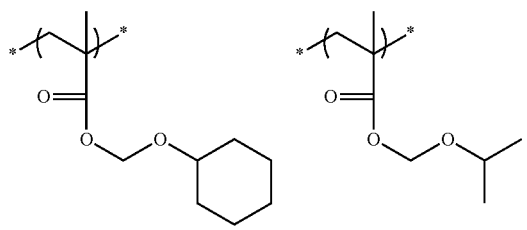
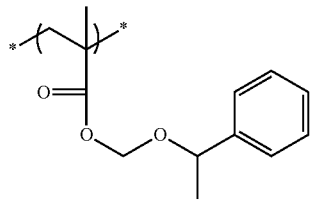
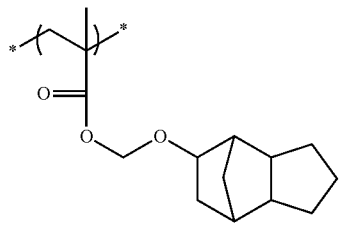
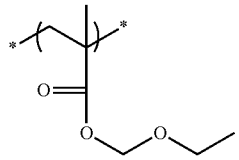
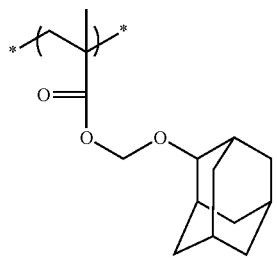
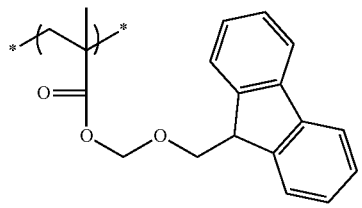
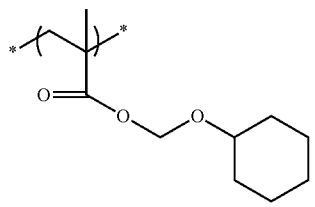
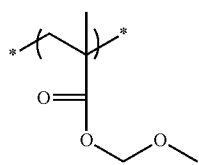

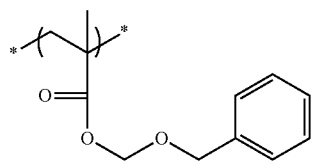

Further, the resin P may contain a repeating unit represented by Formula (BZ).

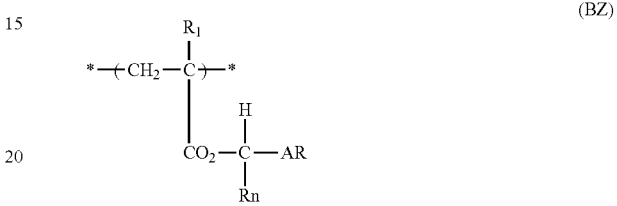

(BZ)

In Formula (BZ), AR represents an aryl group. Rn represents an alkyl group, a cycloalkyl group, or an aryl group. Rn and AR may be bonded to each other to form a non-aromatic ring.

$R_1$ represents a hydrogen atom, an alkyl group, a cycloalkyl group, a halogen atom, a cyano group, or an alkyloxycarbonyl group.

Specific examples of the repeating unit represented by Formula (BZ) are shown below, but the present invention is not limited thereto.

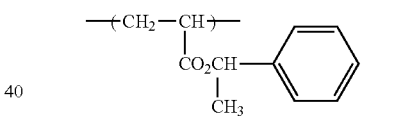
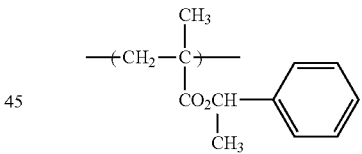
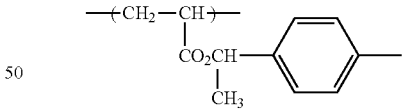
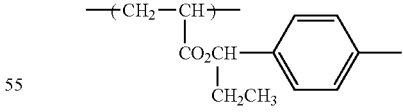
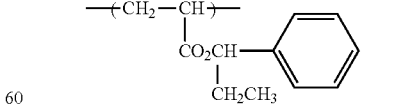
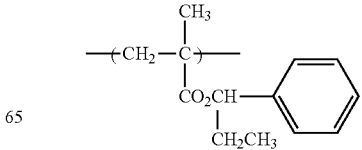

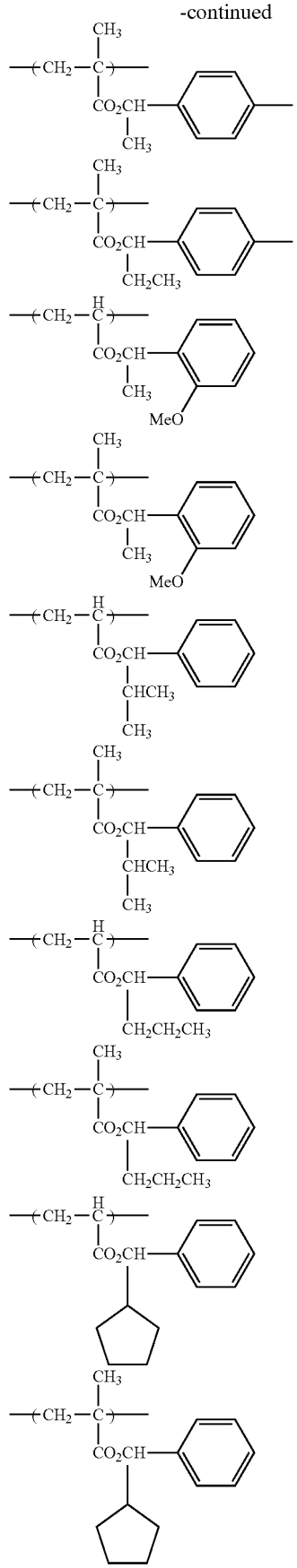

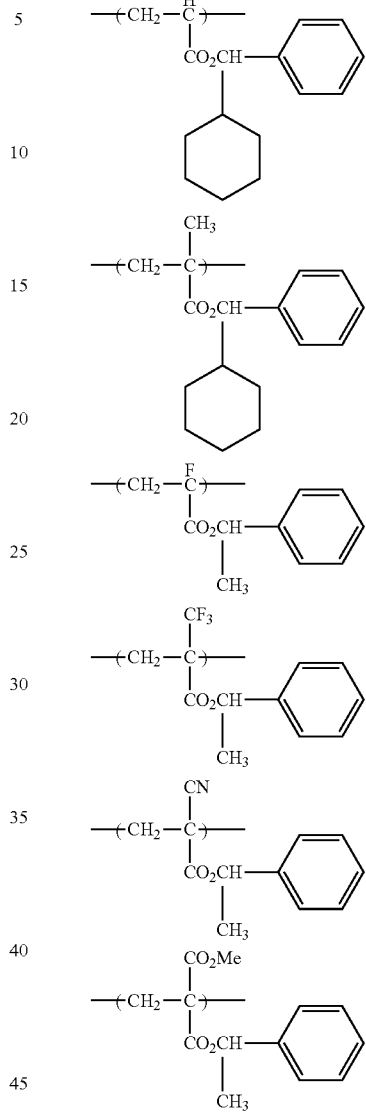

The content of the repeating unit having an acid-decomposable group in the resin P (or the total content of the repeating units in a case of containing a plurality of repeating units) is preferably 5 to 80 mol %, more preferably 5 to 75 mol %, and still more preferably 10 to 65 mol %, with respect to all repeating units in the resin P.

The resin P may contain a repeating unit represented by Formula (V) or Formula (VI).

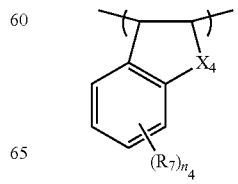

(V)

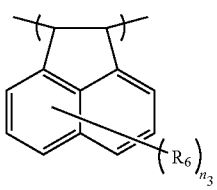

In the formulae, $R_6$ and $R_7$ each independently represent a hydrogen atom, a hydroxy group, a linear, branched, or cyclic alkyl group, alkoxy group or acyloxy group having 1 to 10 carbon atoms, a cyano group, a nitro group, an amino group, a halogen atom, an ester group (—OCOR or —COOR: R is an alkyl group or fluorinated alkyl group having 1 to 6 carbon atoms), or a carboxyl group.

$n_3$ represents an integer of 0 to 6.

$n_4$ represents an integer of 0 to 4.

$X_4$ is a methylene group, an oxygen atom, or a sulfur atom.

Specific examples of the repeating unit represented by Formula (V) or Formula (VI) are shown below, but the present invention is not limited thereto.

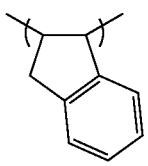 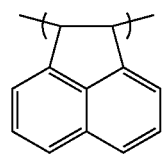 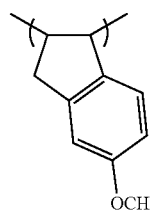

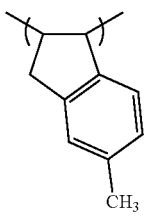 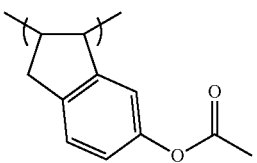

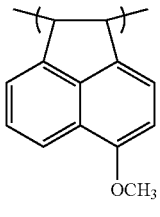 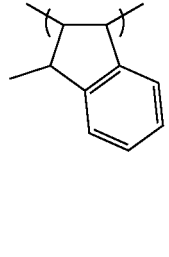

The resin P may further contain a repeating unit having a silicon atom in the side chain. Examples of the repeating unit having a silicon atom in the side chain include a (meth)acrylate-based repeating unit having a silicon atom and a vinyl-based repeating unit having a silicon atom. The repeating unit having a silicon atom in the side chain is typically a repeating unit having a group having a silicon atom in the side chain, and examples of the group having a silicon atom include a trimethylsilyl group, a triethylsilyl group, a triphenylsilyl group, a tricyclohexylsilyl group, a tristrimethylsiloxysilyl group, a tristrimethylsilylsilyl group, a methylbistrimethylsilylsilyl group, a methylbistrimethylsiloxysilyl group, a dimethyltrimethylsilylsilyl group, a dimethyltrimethylsiloxysilyl group, and a cyclic or linear polysiloxane structure, or a cage-type, ladder-type, or random-type silsesquioxane structure as shown below. In the formulae, R and $R^1$ each independently represent a monovalent substituent, and * represents a bond.

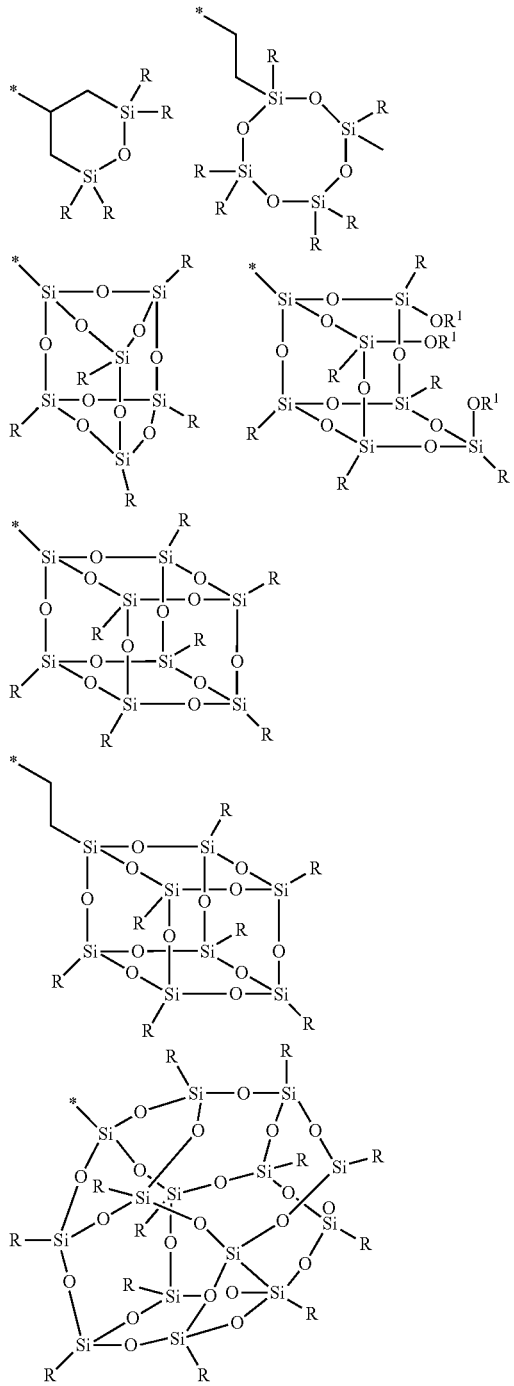

The repeating unit having the above group is preferably, for example, a repeating unit derived from an acrylate or methacrylate compound having the above group or a repeating unit derived from a compound having the above group and a vinyl group.

The repeating unit having a silicon atom is preferably a repeating unit having a silsesquioxane structure, whereby it is possible to exhibit very excellent collapse performance in the formation of a pattern that is ultrafine (for example, a line width of 50 nm or less) and whose sectional shape has a high aspect ratio (for example, film thickness/line width is 3 or more).

Examples of the silsesquioxane structure include a cage-type silsesquioxane structure, a ladder-type silsesquioxane structure, and a random-type silsesquioxane structure. Among them, preferred is a cage-type silsesquioxane structure.

Here, the cage-type silsesquioxane structure is a silsesquioxane structure having a cage-like skeleton. The cage-type silsesquioxane structure may be a complete cage-type silsesquioxane structure or an incomplete cage-type silsesquioxane structure, among which a complete cage-type silsesquioxane structure is preferred.

The ladder-type silsesquioxane structure is a silsesquioxane structure having a ladder-like skeleton.

The random-type silsesquioxane structure is a silsesquioxane structure whose skeleton is of random.

The cage-type silsesquioxane structure is preferably a siloxane structure represented by Formula (S).

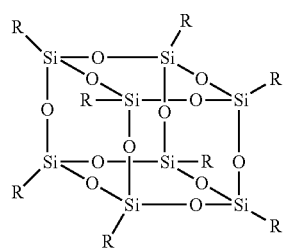

In Formula (S), R represents a monovalent organic group. A plurality of R's may be the same as or different from one another.

The organic group is not particularly limited, and specific examples thereof include a hydroxy group, a nitro group, a carboxy group, an alkoxy group, an amino group, a mercapto group, a blocked mercapto group (for example, an acyl group-blocked (protected) mercapto group), an acyl group, an imido group, a phosphine group, a phosphinyl group, a silyl group, a vinyl group, a hydrocarbon group which may have a heteroatom, a (meth)acrylic group-containing group, and an epoxy group-containing group.

Examples of the heteroatom in the hydrocarbon group which may have a heteroatom include an oxygen atom, a nitrogen atom, a sulfur atom, and a phosphorus atom.

Examples of the hydrocarbon group in the hydrocarbon group which may have a heteroatom include an aliphatic hydrocarbon group, an aromatic hydrocarbon group, and a group formed by combining these groups.

The aliphatic hydrocarbon group may be linear, branched, or cyclic. Specific examples of the aliphatic hydrocarbon group include a linear or branched alkyl group (particularly, having 1 to 30 carbon atoms), a linear or branched alkenyl group (particularly, having 2 to 30 carbon atoms), and a linear or branched alkynyl group (particularly, having 2 to 30 carbon atoms).

Examples of the aromatic hydrocarbon group include aromatic hydrocarbon groups having 6 to 18 carbon atoms, such as a phenyl group, a tolyl group, a xylyl group, and a naphthyl group.

In a case where the resin P has the above-mentioned repeating unit having a silicon atom in the side chain, the content thereof is preferably 1 to 30 mol %, more preferably 5 to 25 mol %, and still more preferably 5 to 20 mol %, with respect to all repeating units in the resin P.

The weight-average molecular weight of the resin P is preferably 1,000 to 200,000, more preferably 3,000 to 20,000, and still more preferably 5,000 to 15,000 as a value in terms of polystyrene by a gel permeation chromatography (GPC) method. In a case where the weight-average molecular weight is set to 1,000 to 200,000, deterioration of heat resistance and dry etching resistance can be prevented, and deterioration of developability and deterioration of film formability due to increase in viscosity can be prevented.

The dispersity (molecular weight distribution) is usually 1 to 5, preferably 1 to 3, more preferably 1.2 to 3.0, and still more preferably 1.2 to 2.0.

In the actinic ray-sensitive or radiation-sensitive resin composition, the content of the resin P is preferably 50 to 99.9 mass % and more preferably 60 to 99.0 mass %, with respect to the total solid content.

In the actinic ray-sensitive or radiation-sensitive resin composition, the resin P may be used alone or in combination of a plurality thereof.

<<Other Components>>

The actinic ray-sensitive or radiation-sensitive resin composition may further contain other components in addition to the resin represented by Formula (I) or the resin P, and among them, it is preferable to contain a photoacid generator and an organic solvent.

Hereinafter, the components which may further be contained in the actinic ray-sensitive or radiation-sensitive resin composition will be described.

(Photoacid Generator)

The actinic ray-sensitive or radiation-sensitive resin composition preferably contains a photoacid generator capable of generating an acid upon irradiation with actinic rays or radiation.

Known photoacid generators can be used as the photoacid generator. For example, those described in JP2016-057614A, JP2014-219664A, JP2016-138219A, and JP2015-135379A can be used.

The content of the photoacid generator in the actinic ray-sensitive or radiation-sensitive resin composition is usually 0.1 to 20 mass %, preferably 0.5 to 20 mass %, and more preferably 5 to 20 mass %, based on the total solid content of the actinic ray-sensitive or radiation-sensitive resin composition.

(Quencher)

In order to suppress the decomposition of the resin represented by Formula (I) or the resin P in the unexposed region, the actinic ray-sensitive or radiation-sensitive resin composition may contain a basic compound as a quencher for an acid diffused from the exposed region.

Known quenchers can be used as the quencher. For example, those described in JP2016-057614A, JP2014-219664A, JP2016-138219A, and JP2015-135379A can be used.

The content of the quencher in the actinic ray-sensitive or radiation-sensitive resin composition is usually 0.1 to 15 mass %, preferably 0.5 to 8 mass %, and more preferably 0.5 to 6 mass %, based on the total solid content of the actinic ray-sensitive or radiation-sensitive resin composition.

(Hydrophobic Resin)

From the viewpoint of controlling the static/dynamic contact angle of the resist film surface with respect to water, improving the immersion liquid tracking properties, suppressing outgassing, and the like, the actinic ray-sensitive or radiation-sensitive resin composition may contain a hydrophobic resin. The hydrophobic resin referred to here is preferably designed so as to be unevenly distributed on an interface; however, unlike a surfactant, it is not necessary to have a hydrophilic group in the molecule and it may not contribute to uniform mixing of polar/non-polar substances.

Known hydrophobic resins can be used as the hydrophobic resin. For example, those described in JP2016-057614A, JP2014-219664A, JP2016-138219A, and JP2015-135379A can be used.

The content of the hydrophobic resin in the actinic ray-sensitive or radiation-sensitive resin composition is usually 0.01 to 10 mass % and preferably 0.05 to 8 mass % based on the total solid content of the actinic ray-sensitive or radiation-sensitive resin composition.

The weight-average molecular weight of the hydrophobic resin is usually 1,000 to 100,000 and preferably 1,000 to 50,000. The weight-average molecular weight is based on the above-described measuring method.

(Organic Solvent)

The actinic ray-sensitive or radiation-sensitive resin composition preferably contains an organic solvent.

Examples of the organic solvent that can be used in preparing the composition include organic solvents such as alkylene glycol monoalkyl ether carboxylate, alkylene glycol monoalkyl ether, alkyl lactate, alkyl alkoxypropionate, cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

In addition, for example, those described in JP2016-057614A, JP2014-219664A, JP2016-138219A, and JP2015-135379A can be used as the organic solvent.

The organic solvent used in the actinic ray-sensitive or radiation-sensitive resin composition is preferably an organic solvent used in the chemical liquid of the present invention as described below because the effects of the present invention are superior.

The organic solvents may be used alone or in combination of two or more thereof.

As the organic solvent, at least one thereof is preferably propylene glycol monomethyl ether acetate from the viewpoint of excellent solubility of the resin and excellent drying properties after coating.

(Other Additives)

The actinic ray-sensitive or radiation-sensitive resin composition may further contain a surfactant, an acid proliferation agent, a dye, a plasticizer, a photosensitizer, a light absorber, an alkali-soluble resin other than the foregoing alkali-soluble resin, a dissolution inhibitor, or the like, if necessary.

[Chemical Liquid]

Hereinafter, individual components of the chemical liquid and a method of preparing the chemical liquid will be described.

<Organic Solvent>

The chemical liquid contains an organic solvent.

The organic solvent is not particularly limited, and a known organic solvent can be used.

Although the content of the organic solvent in the chemical liquid is not particularly limited, the organic solvent is contained as a main component in the chemical liquid and the content thereof is generally preferably 98 mass % or more, more preferably 99 mass % or more, still more preferably 99.5 mass % or more, and particularly preferably 99.8 mass % or more, with respect to the total mass of the chemical liquid. The upper limit value of the content of the organic solvent is not particularly limited, but is generally preferably 99.99 mass % or less. The organic solvents may be used alone or in combination of two or more thereof. In a case where two or more organic solvents are used in combination, the total content thereof is preferably within the above range.

The content of the organic solvent in the chemical liquid can be measured using gas chromatography mass spectrometry (GCMS). The measurement conditions and the like are as described in Examples which will be described later.

The boiling point of the organic solvent is not particularly limited, but the boiling point of the organic solvent is preferably lower than 210° C. from the viewpoint of obtaining a chemical liquid which further enhances the effects of the present invention.

In the present specification, the boiling point is intended to refer to a boiling point under 1 atm.

The organic solvent is not particularly limited and examples thereof include methanol, ethanol, 1-propanol, isopropanol, n-propanol, 2-methyl-1-propanol, n-butanol, 2-butanol, tert-butanol, 1-pentanol, 2-pentanol, 3-pentanol, n-hexanol, cyclohexanol, 2-methyl-2-butanol, 3-methyl-2-butanol, 2-methyl-1-butanol, 3-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2-ethyl-1-butanol, 2,2-dimethyl-3-pentanol, 2,3-dimethyl-3-pentanol, 2,4-dimethyl-3-pentanol, 4,4-dimethyl-2-pentanol, 3-ethyl-3-pentanol, 1-heptanol, 2-heptanol, 3-heptanol, 2-methyl-2-hexanol, 2-methyl-3-hexanol, 5-methyl-1-hexanol, 5-methyl-2-hexanol, 2-ethyl-1-hexanol, methylcyclohexanol, trimethylcyclohexanol, 4-methyl-3-heptanol, 6-methyl-2-heptanol, 1-octanol, 2-octanol, 3-octanol, 2-propyl-1-pentanol, 2,6-dimethyl-4-heptanol, 2-nonanol, 3,7-dimethyl-3-octanol, ethylene glycol, propylene glycol, diethyl ether, dipropyl ether, diisopropyl ether, butyl methyl ether, butyl ethyl ether, butyl propyl ether, dibutyl ether, diisobutyl ether, tert-butyl methyl ether, tert-butyl ethyl ether, tert-butyl propyl ether, di-tert-butyl ether, dipentyl ether, diisoamyl ether, cyclopentyl methyl ether, cyclohexyl methyl ether, bromomethyl methyl ether, α,α-dichloromethyl methyl ether, chloromethyl ethyl ether, 2-chloroethyl methyl ether, 2-bromoethyl methyl ether, 2,2-dichloroethyl methyl ether, 2-chloroethyl ethyl ether, 2-bromoethyl ethyl ether, (±)-1,2-dichloroethyl ethyl ether, 2,2,2-trifluoroethyl ether, ethyl vinyl ether, butyl vinyl ether, allyl ethyl ether, allyl propyl ether, allyl butyl ether, diallyl ether, 2-methoxypropene, ethyl-1-propenyl ether, cis-1-bromo-2-ethoxyethylene, 2-chloroethyl vinyl ether, allyl-1,1,2,2-tetrafluoroethyl ether, octane, isooctane, nonane, decane, methylcyclohexane, decalin, xylene, ethylbenzene, diethylbenzene, cumene, sec-butylbenzene, cymene, dipentene, methyl pyruvate, propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, butyl acetate, isoamyl acetate, amyl acetate, n-amyl acetate, chloroform, dichloromethane, 1,4-dioxane, hexyl alcohol, γ-butyrolactone, 2-heptanone, isoamyl acetate, isopropyl alcohol, and tetrahydrofuran.

Among others, from the viewpoint that the effects of the present invention are superior, the organic solvent is preferably at least one selected from the group consisting of propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, 1-hexanol, 2-heptanone, isoamyl acetate, and 4-methyl-2-pentanol.

In a case where the above chemical liquid is applied to a developer, butyl acetate is preferable from the viewpoint of superior developability. In a case where the above chemical liquid is applied to a pre-wetting liquid, cyclopentanone, cyclohexanone, or propylene glycol monomethyl ether acetate is preferable from the viewpoint of superior developability and defect suppression performance. In a case where the above chemical liquid is applied to a rinsing liquid, 4-methyl-2-pentanol is preferable from the viewpoint of superior developability.

In a case where the chemical liquid contains two or more organic solvents, the combination thereof is not particularly limited. In a case where the above-mentioned solvent contains two or more organic solvents, from the viewpoint of further improving the effects of the present invention, it is preferred that the boiling point, solubility parameter, and/or specific permittivity of each organic solvent are different.

For example, a chemical liquid containing two or more organic solvents having different specific permittivity has superior defect suppression performance. Although the reason for this is not clear, it is presumed that the occurrence of defects due to static electricity is more suppressed. For example, there is an example in which butyl acetate and isoamyl acetate are mixed at a certain mass.

In a case where the chemical liquid contains two or more organic solvents, it is preferable to contain two or more ethers as the organic solvents. A chemical liquid containing two or more ethers (corresponding to organic solvents) has superior defect suppression performance.

The ethers are not particularly limited, and known ethers can be used. The two or more ethers are preferably, for example, two or more ethers selected from the group consisting of propylene glycol monomethyl ether acetate, propylene glycol monomethyl ether, diethylene glycol monomethyl ether, diethylene glycol monoethyl ether, and diethylene glycol monobutyl ether.

In particular, it is preferred that the organic solvent contains propylene glycol monomethyl ether acetate and propylene glycol monomethyl ether.

In a case where the chemical liquid contains two organic solvents, the mass ratio of the respective organic solvents in the chemical liquid is not particularly limited, but is generally preferably 1/99 to 99/1, more preferably 10/90 to 90/10, and still more preferably 20/80 to 60/40.

In a case where the chemical liquid contains three organic solvents, the combination of the three organic solvents is not particularly limited, but the following combinations and the like of organic solvents are preferable.

propylene glycol monomethyl ether acetate (PGMEA)/propylene glycol monomethyl ether (PGME)/γ-butyrolactone
PGMEA/PGME/cyclohexanone
PGMEA/PGME/2-heptanone
PGMEA/cyclohexanone/γ-butyrolactone
PGMEA/γ-butyrolactone/2-heptanone <Organic Impurities Containing at Least Alcohol Impurities>

The chemical liquid contains organic impurities containing at least alcohol impurities.

The alcohol impurities are not particularly limited and known alcohol impurities containing one or more alcoholic hydroxyl groups per molecule can be used.

In the present specification, the alcohol impurities are organic impurities containing one or more alcoholic hydroxyl groups. That is, among the compounds corresponding to organic impurities, compounds containing one or more alcoholic hydroxyl groups are alcohol impurities. The definition of organic impurities will be described later in detail.

The alcohol impurities may be added to the chemical liquid or may be mixed in the chemical liquid inevitably in the production step of the chemical liquid. Examples of the case where the alcohol impurities are inevitably mixed in the production step of the chemical liquid include, but are not limited to, a case where the alcohol impurities are contained in a raw material (for example, an organic solvent) used for producing the chemical liquid, and a case where the alcohol impurities are mixed (for example, contamination) in the production step of the chemical liquid.

The total content of the alcohol impurities in the chemical liquid is 0.01 mass ppb to 1000 mass ppm, preferably 0.1 mass ppb to 700 mass ppm, more preferably 1 mass ppb to 500 mass ppm, and still more preferably 5 mass ppb to 200 mass ppm, with respect to the total mass of the chemical liquid.

The alcohol impurities may be used alone or in combination of two or more thereof. In a case where two or more alcohol impurities are used in combination, the total content thereof is preferably within the above range.

The alcohol impurities are not particularly limited and include linear, branched, and cyclic alcohols. Examples of the monohydric alcohol impurities include methanol, ethanol, propanol, isopropanol, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, and 4-octanol. Examples of the dihydric or higher alcohol impurities include alkylene glycol and glycerin.

Further, the alcohol impurities may be, for examples, alcohol-based by-products which are produced along with synthesis of an organic solvent and/or unreacted alcohol-based raw materials (hereinafter, also referred to as "alcohol-based by-products or the like"). For example, in a case where the organic solvent is, for example, an alcohol compound, the by-product or the like is often an alcohol compound (for example, in a case where the organic solvent is PGMEA, propylene glycol derived from the raw material is easily detected as alcohol impurities). Among others, alcohol-based by-products having 6 or more carbon atoms have a high boiling point and therefore are likely to remain on a semiconductor processing substrate, which tends to cause defects.

Examples of the alcohol-based by-products or the like having 6 or more carbon atoms include compounds represented by Formula I.

$$R_5-OH \quad \text{I}$$

In Formula I, $R_5$ represents an alkyl group or cycloalkyl group having 6 or more carbon atoms.

The alkyl group represented by $R_5$ is an alkyl group having 6 or more carbon atoms, preferably an alkyl group having 6 to 12 carbon atoms, and more preferably an alkyl group having 6 to 10 carbon atoms.

The alkyl group may have an ether bond in the chain and may have a substituent such as a hydroxy group.

The cycloalkyl group represented by $R_5$ is a cycloalkyl group having 6 or more carbon atoms, preferably a cycloalkyl group having 6 to 12 carbon atoms, and more preferably a cycloalkyl group having 6 to 10 carbon atoms.

That is, in a case where the chemical liquid contains alcohol impurities, it is preferred that the chemical liquid contains an alcohol-based by-product having less than 6 carbon atoms, or an alcohol-based compound having less than 6 carbon atoms is separately added. In a case where the number of carbon atoms of the alcohol impurities is set to be less than 6, this leads to superior developability and also superior defect suppression performance.

The alcohol-based compound having less than 6 carbon atoms may be, for example, a compound in which $R_5$ in Formula I is an alkyl group or cycloalkyl group having less than 6 carbon atoms. In addition, the alkyl group may have an ether bond in the chain and may have a substituent such as a hydroxy group.

(Organic Impurities)

In the present specification, the organic impurities are compounds different from the organic solvent which is a main component contained in the chemical liquid, and are intended to be organic substances contained in an amount of 5000 mass ppm or less with respect to the total mass of the chemical liquid. That is, in the present specification, the organic substances contained in an amount of 5000 mass ppm or less with respect to the total mass of the chemical liquid correspond to the organic impurities and do not correspond to the organic solvent. Water is not included in the organic impurities.

In a case where organic impurities including a plurality of compounds are contained in the chemical liquid, individual compounds correspond to organic impurities as long as individual compounds correspond to organic substances contained in the above-mentioned content of 5000 mass ppm or less.

The total content of the organic impurities in the chemical liquid is typically 20000 mass ppm or less in many cases, preferably 1 to 5000 mass ppm, more preferably 1 to 3500 mass ppm, still more preferably 1 to 1000 mass ppm, even more preferably 1 to 850 mass ppm, and particularly preferably 1 to 700 mass ppm, with respect to the total mass of the chemical liquid.

In a case where the total content of the organic impurities in the chemical liquid is 1 to 5,000 mass ppm with respect to the total mass of the chemical liquid, both of developability and defect suppression performance are superior.

The total content of the organic impurities is intended to be a total content of organic impurities including alcohol impurities.

The organic impurities may be used alone or in combination of two or more thereof. In a case where two or more organic impurities are used in combination, the total content thereof is preferably within the above range.

The content of organic impurities in the chemical liquid can be measured using gas chromatography mass spectrometry (GCMS). The measurement conditions and the like are as described in the Examples.

Examples of organic impurities other than the alcohol impurities include antioxidants such as dibutylhydroxytoluene (BHT), distearylthiodipropionate (DSTP), 4,4'-butylidenebis-(6-t-butyl-3-methylphenol), 2,2'-methylenebis-(4-ethyl-6-t-butylphenol), and an antioxidant described in JP2015-200775A; unreacted raw materials; structural isomers and by-products generated during the production of organic solvents; eluted substances (for example, plasticizers eluted from rubber members such as O-rings) from members or the like constituting an apparatus for producing organic solvents; and the like.

In addition to the above, examples of organic impurities other than the alcohol impurities include dioctyl phthalate (DOP), bis(2-ethylhexyl) phthalate (DEHP), bis(2-propylheptyl) phthalate (DPHP), dibutyl phthalate (DBP), benzyl butyl phthalate (BBzP), diisodecyl phthalate (DIDP), diisooctyl phthalate (DIOP), diethyl phthalate (DEP), diisobutyl phthalate (DIBP), dihexyl phthalate, diisononyl phthalate, trimethyl trimellitate (TMTM), tris(2-ethylhexyl) trimellitate (TEHTM), tris(n-octyl-n-decyl) trimellitate (ATM), tris(heptyl,nonyl) trimellitate (LTM), tris(octyl) trimellitate (OTM), bis(2-ethylhexyl)adipate (DEHA, also known as dioctyl adipate), dimethyl adipate (DMAD), monomethyl adipate (MMAD), diisononyl adipate (DNA), dibutyl sebacate (DBS), dibutyl maleate (DBM), diisobutyl maleate (DIBM), azelaic acid ester, benzoic acid ester, terephthalate (for example, dioctyl terephthalate (DEHT)), 1,2-cyclohexanedicarboxylic acid diisononyl ester (DINCH), epoxidized vegetable oils, alkyl sulphonic acid phenyl ester (ASE), sulfonamides (for example, N-ethyltoluene sulfonamide (ETSA), N-(2-hydroxypropyl)benzene sulfonamide (HPBSA), and N-(n-butyl)benzene sulfonamide (BBSA-NBBS)), organophosphates (for example, tricresyl phosphate (TCP) and tributyl phosphate (TBP)), triethylene glycol dihexanoate (3G6), tetraethylene glycol diheptanoate (4G7), acetylated monoglycerides, triethyl citrate (TEC), acetyl triethyl citrate (ATEC), tributyl citrate (TBC), acetyl tributyl citrate (ATBC), trioctyl citrate (TOC), acetyl trioctyl citrate (ATOC), trihexyl citrate (THC), acetyl trihexyl citrate (ATHC), butyryl trihexyl citrate (BTHC), trimethyl citrate (TMC), epoxidized soybean oils, nitroglycerin (NG), butanetriol trinitrate (BTTN), dinitrotoluene (DNT), trimethylolethane trinitrate (TMETN), diethylene glycol dinitrate (DEGDN), triethylene glycol dinitrate (TEGDN), bis(2,2-dinitropropyl) formal (BDNPF), bis(2,2-dinitropropyl) acetal (BDNPA), 2,2,2-trinitroethyl-2-nitroethyl ether (TNEN), polybutene, ethylene rubber, and polymeric plasticizers exemplified below.

These organic impurities are presumed to be incorporated from filters, piping, tanks, O-rings, containers, and the like, which are touched in the purification step. In particular, incorporation of a compound other than an alkyl olefin is particularly undesirable because it causes a bridge defect.

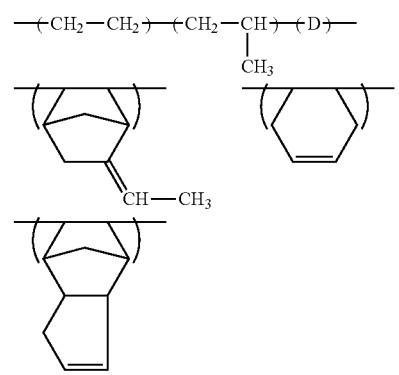

These organic impurities may be added to the chemical liquid or may be mixed in the chemical liquid inevitably in the production step of the chemical liquid. Examples of the case where the organic impurities are inevitably mixed in the production step of the chemical liquid include, but are not limited to, a case where the organic impurities are contained in a raw material (for example, an organic solvent) used for producing the chemical liquid, and a case where the organic impurities are mixed (for example, contamination) in the production step of the chemical liquid.

The organic impurities other than the alcohol impurities may be, for examples, by-products which are produced along with synthesis of an organic solvent and/or unreacted raw materials (hereinafter, also referred to as "by-products or the like"). For example, in a case where the organic solvent is, for example, a ketone compound, an ester compound, an ether compound, and an aldehyde compound, examples of by-products or the like include a ketone compound, an ester compound, an ether compound, and an aldehyde compound.

Examples of the by-products or the like include compounds represented by Formulae II to V.

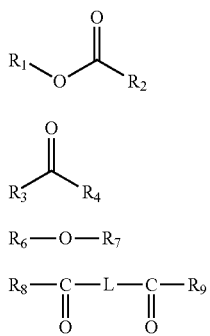

In Formula II, $R_1$ and $R_2$ each independently represent an alkyl group or a cycloalkyl group, or $R_1$ and $R_2$ are bonded to each other to form a ring.

The alkyl group or cycloalkyl group represented by $R_1$ and $R_2$ is preferably an alkyl group having 1 to 12 carbon atoms or a cycloalkyl group having 6 to 12 carbon atoms, and more preferably an alkyl group having 1 to 8 carbon atoms or a cycloalkyl group having 6 to 8 carbon atoms.

The ring formed by bonding of $R_1$ and $R_2$ to each other is a lactone ring, preferably a 4 to 9-membered lactone ring, and more preferably a 4 to 6-membered lactone ring.

Further, $R_1$ and $R_2$ satisfy the relationship that the number of carbon atoms of the compound represented by Formula II is 6 or more.

In Formula III, $R_3$ and $R_4$ each independently represent a hydrogen atom, an alkyl group, an alkenyl group, a cycloalkyl group, or a cycloalkenyl group, or $R_3$ and $R_4$ are bonded to each other to form a ring, provided that both of $R_3$ and $R_4$ are not hydrogen atoms.

The alkyl group represented by $R_3$ and $R_4$ is preferably an alkyl group having 1 to 12 carbon atoms and more preferably an alkyl group having 1 to 8 carbon atoms.

The alkenyl group represented by $R_3$ and $R_4$ is preferably an alkenyl group having 2 to 12 carbon atoms and more preferably an alkenyl group having 2 to 8 carbon atoms.

The cycloalkyl group represented by $R_3$ and $R_4$ is preferably a cycloalkyl group having 6 to 12 carbon atoms and more preferably a cycloalkyl group having 6 to 8 carbon atoms.

The cycloalkenyl group represented by $R_3$ and $R_4$ is preferably a cycloalkenyl group having 3 to 12 carbon atoms and more preferably a cycloalkenyl group having 6 to 8 carbon atoms.

The ring formed by bonding of $R_3$ and $R_4$ to each other is a cyclic ketone structure, which may be a saturated cyclic ketone or an unsaturated cyclic ketone. The cyclic ketone is preferably a 6- to 10-membered ring and more preferably a 6- to 8-membered ring.

Further, $R_3$ and $R_4$ satisfy the relationship that the number of carbon atoms of the compound represented by Formula III is 6 or more.

In Formula IV, $R_6$ and $R_7$ each independently represent an alkyl group or a cycloalkyl group, or $R_6$ and $R_7$ are bonded to each other to form a ring.

The alkyl group represented by $R_6$ and $R_7$ is preferably an alkyl group having 1 to 12 carbon atoms and more preferably an alkyl group having 1 to 8 carbon atoms.

The cycloalkyl group represented by $R_6$ and $R_7$ is preferably a cycloalkyl group having 6 to 12 carbon atoms and more preferably a cycloalkyl group having 6 to 8 carbon atoms.

The ring formed by bonding of $R_6$ and $R_7$ to each other is a cyclic ether structure. The cyclic ether structure is preferably a 4- to 8-membered ring and more preferably a 5- to 7-membered ring.

Further, $R_6$ and $R_7$ satisfy the relationship that the number of carbon atoms of the compound represented by Formula IV is 6 or more.

In Formula V, $R_8$ and $R_9$ each independently represent an alkyl group or a cycloalkyl group, or $R_8$ and $R_9$ are bonded to each other to form a ring. L represents a single bond or an alkylene group.

The alkyl group represented by $R_8$ and $R_9$ is, for example, preferably an alkyl group having 6 to 12 carbon atoms and more preferably an alkyl group having 6 to 10 carbon atoms.

The cycloalkyl group represented by $R_8$ and $R_9$ is preferably a cycloalkyl group having 6 to 12 carbon atoms and more preferably a cycloalkyl group having 6 to 10 carbon atoms.

The ring formed by bonding of $R_8$ and $R_9$ to each other is a cyclic diketone structure. The cyclic diketone structure is preferably a 6- to 12-membered ring and more preferably a 6- to 10-membered ring.

The alkylene group represented by L is preferably an alkylene group having 1 to 12 carbon atoms and more preferably an alkylene group having 1 to 10 carbon atoms.

Further, $R_8$, $R_9$, and L satisfy the relationship that the number of carbon atoms of the compound represented by Formula V is 6 or more.

Although there is no particular limitation, in a case where the organic solvent is an amide compound, an imide compound, or a sulfoxide compound, in one embodiment, an amide compound, an imide compound, and a sulfoxide compound each having 6 or more carbon atoms can be mentioned. For example, the following compounds can be mentioned.

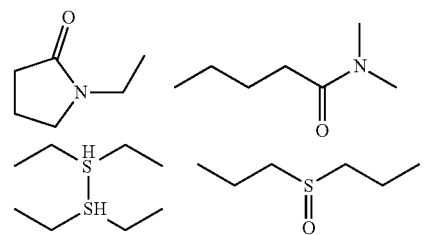

From the viewpoint of excellent defect suppression properties, the organic impurities other than the alcohol impurities are preferably one or more selected from the group consisting of dioctyl phthalate, diisononyl phthalate, dioctyl adipate, dibutyl phthalate, ethylene rubber, and ethylene propylene rubber.

<Metal Impurities>

The chemical liquid contains metal impurities containing a metal atom.

In the present specification, the term "metal impurities containing a metal atom" means metal impurities contained in a chemical liquid as a metal ion and as a solid (metal simple substance, metal-containing compound in the form of particles, or the like). For example, in a case where the metal atom is an Fe atom, it corresponds to a solid containing Fe ions and Fe atoms.

In addition, in the present specification, the content of metal atoms contained in metal impurities in the chemical liquid is intended to be a content of metal atoms measured by inductively coupled plasma mass spectrometry (ICP-MS). The method of measuring the content of metal atoms using ICP-MS is as described in the Examples which will be described later.

On the other hand, in SP-ICP-MS for the above method, the metal particle content is measured. Therefore, the content of metal ions in a sample can be calculated by subtracting the content of metal particles from the content of metal atoms in the sample.

The apparatus for SP-ICP-MS may be, for example, an Agilent 8800 triple quadrupole ICP-MS (inductively coupled plasma mass spectrometry, for semiconductor analysis, option #200, manufactured by Agilent Technologies, Inc.). In addition to the above, NexION 350S (manufactured by PerkinElmer, Inc.), or Agilent 8900 (manufactured by Agilent Technologies, Inc.) can also be mentioned.

The total content of the metal atoms contained in the metal impurities in the chemical liquid is preferably 0.1 to 500 mass ppt, more preferably 0.1 to 300 mass ppt, still more preferably 0.1 to 150 mass ppt, particularly preferably 0.1 to 100 mass ppt, and most preferably 0.1 to 50 mass ppt, with respect to the total mass of the chemical liquid.

The type of the metal atom contained in the metal impurities is not particularly limited and examples thereof include an Fe atom, a Ni atom, a Cr atom, and a Pb atom.

The content of at least one specific metal atom selected from the group consisting of an Fe atom, a Cr atom, a Ni atom, and a Pb atom among the above metal atoms is as follows.

In a case where the chemical liquid contains one specific metal atom selected from the group consisting of an Fe atom, a Cr atom, a Ni atom, and a Pb atom, the content of one specific metal atom is preferably 0.001 to 100 mass ppt, more preferably 0.1 to 100 mass ppt, still more preferably 0.1 to 40 mass ppt, and particularly preferably 0.1 to 10 mass ppt, with respect to the total mass of the chemical liquid.

In a case where the chemical liquid contains two or more specific metal atoms selected from the group consisting of an Fe atom, a Cr atom, a Ni atom, and a Pb atom, the content of each specific metal atom is preferably 0.001 to 100 mass ppt, more preferably 0.1 to 100 mass ppt, still more preferably 0.1 to 40 mass ppt, and particularly preferably 0.1 to 10 mass ppt, with respect to the total mass of the chemical liquid. That is, for example, in a case where two specific metal atoms of Fe atom and Cr atom are contained in the chemical liquid, both the content of Fe atoms and the content of Cr atoms are within the range of 0.001 to 100 mass ppt.

The metal impurities containing the metal atom may be added to the chemical liquid or may be mixed in the chemical liquid inevitably in the production step of the chemical liquid. Examples of the case where the metal impurities containing the metal atom are inevitably mixed in the production step of the chemical liquid include, but are not limited to, a case where the metal impurities containing the metal atom are contained in a raw material (for example, an organic solvent) used for producing the chemical liquid, and a case where the metal impurities containing the metal atom are mixed (for example, contamination) in the production step of the chemical liquid.

<Optional Components>

The chemical liquid may contain other components in addition to the components already described, within the range that exerts the effects of the present invention. Examples of other components include water.

(Water)

The chemical liquid may contain water. Water is not particularly limited. For example, distilled water, ion exchange water, pure water, or the like can be used.

Water may be added to the chemical liquid or may be mixed in the chemical liquid inevitably in the production step of the chemical liquid. Examples of the case where water is inevitably mixed in the production step of the chemical liquid include, but are not limited to, a case where water is contained in a raw material (for example, an organic solvent) used for producing the chemical liquid, and a case where water is mixed (for example, contamination) in the production step of the chemical liquid.

The content of water in the chemical liquid is not particularly limited, but is generally 0.005 to 3 mass %, preferably 0.01 to 1.0 mass %, and more preferably 0.1 to 0.4 mass %, with respect to the total mass of the chemical liquid.

In a case where the content of water in the chemical liquid is 0.01 mass % or more, the solubility of the metal ions is superior, and in a case where the content of water in the chemical liquid is 1.0 mass % or less, the occurrence of watermark or the like can be suppressed, which is excellent. Further, in a case where the content of water in the chemical liquid is 0.1 mass % or more, the solubility of metal ions is even superior. Further, in a case where the content of water in the chemical liquid is 0.4 mass % or less, the occurrence of watermark or the like can be suppressed, which is excellent.

In the present specification, the content of water is intended for the water content measured using a measuring principle of Karl Fischer water measuring method. The measuring method using the above apparatus is as described in the Examples.

<Physical Properties of Chemical Liquid>

In view of having superior effects of the present invention, it is preferable for the chemical liquid that the number of objects to be counted having a size of 0.1 µM or more, which is counted by a light scattering type in-liquid particle counter, is 100 objects to be counted/mL or less.

In the present specification, objects to be counted having a size of 0.1 µm or more, which are counted by a light scattering type in-liquid particle counter, are also referred to as "coarse particles".

Examples of coarse particles include, but are not limited to, particles such as dust, dirt, organic solids, and inorganic solids contained in a raw material (for example, an organic solvent) used for producing a chemical liquid, and dust, dirt, and solids (including organic matter, inorganic matter, and/or metal) brought in as contaminants during preparation of a chemical liquid.

In addition, coarse particles also include colloidal impurities containing metal atoms. There are no particular restrictions on the metal atom, but in a case where the content of at least one metal atom selected from the group consisting of Na, K, Ca, Fe, Cu, Mg, Mn, Li, Al, Cr, Ni, Zn, and Pb (preferably Fe, Cr, Ni, and Pb) is particularly low (for example, in a case where the contents of the metal atoms in the organic solvent are each 1000 mass ppt or less), impurities containing these metal atoms are likely to be colloidal.

<Method for Producing Chemical Liquid>

The method for producing the chemical liquid is not particularly limited, and a known production method can be used. Among others, a method for producing a chemical liquid containing the following steps in that order is preferable from the viewpoint that the chemical liquid can be more easily obtained. Individual steps will be described in detail below.

(1) Organic solvent preparation step of preparing an organic solvent
(2) Purification step of purifying the organic solvent to obtain a chemical liquid <<(1) Organic Solvent Preparation Step>>

The organic solvent preparation step is a step of preparing an organic solvent. A method of preparing an organic solvent is not particularly limited, and examples thereof include a method of procuring an organic solvent by purchasing or the like, and a method of reacting raw materials to obtain an organic solvent. As the organic solvent, it is preferable to prepare a material having a small content of metal impurities and/or alcohol impurities (for example, a material having a content of an organic solvent of 99 mass % or more) which has already been described. Examples of commercially available products of such organic solvents include those called "high purity grade products".

There is no particular limitation on the method of reacting raw materials to obtain an organic solvent, and a known method can be used. For example, there is a method of reacting one or a plurality of raw materials in the presence of a catalyst to obtain an organic solvent.

More specifically, for example, there are a method of reacting acetic acid and n-butanol in the presence of sulfuric acid to obtain butyl acetate; a method of reacting ethylene, oxygen, and water in the presence of $Al(C_2H_5)_3$ to obtain 1-hexanol; a method of reacting cis-4-methyl-2-pentene in the presence of Ipc2BH (diisopinocampheylborane) to obtain 4-methyl-2-pentanol; a method of reacting propylene oxide, methanol, and acetic acid in the presence of sulfuric acid to obtain PGMEA; a method of reacting acetone and hydrogen in the presence of copper oxide-zinc oxide-aluminum oxide to obtain isopropyl alcohol (IPA); and a method of reacting lactic acid and ethanol to obtain ethyl lactate.

<<(2) Purification Step of Purifying Organic Solvent to Obtain Chemical Liquid>>

The purification step is a step of purifying the organic solvent obtained in the step (1) to obtain a chemical liquid having desired characteristics.

A method of purifying an organic solvent is not particularly limited, and a known method can be used. As a method of purifying an organic solvent, for example, it is preferable to include at least one step selected from the group consisting of the following steps. Each step will be described in detail below.

The purification step may include the following respective steps once or a plurality of times. Further, the order of the following steps is not particularly limited.

Distillation step
Component adjustment step (Distillation Step)

It is preferred that the purification step (2) above includes a distillation step. The distillation step is intended to be a step of distilling an organic solvent to obtain a distilled organic solvent (hereinafter, also referred to as "purified product"). The method of distillation is not particularly limited and a known method can be used.

Among others, it is more preferred that the organic solvent is distilled using the following purification apparatus in that a purified product can be obtained more easily and in the distillation step, unintended impurities are less likely to be incorporated into the purified product.

Purification Apparatus

One embodiment of a purification apparatus that can be used in the above distillation step is, for example, a purification apparatus including a distillation column for distilling an organic solvent to obtain a purified product, in which a wetted part (for example, an inner wall and a pipe line) of the distillation column is formed of at least one selected from the group consisting of a non-metal material and an electropolished metal material.

The non-metal material is not particularly limited and a known material can be used.

Examples of the non-metal material include, but are not limited to, at least one selected from the group consisting of a polyethylene resin, a polypropylene resin, a polyethylene-polypropylene resin, a tetrafluoroethylene resin, a tetrafluoroethylene-perfluoroalkylvinylether copolymer resin, a tetrafluoroethylene-hexafluoropropylene copolymer resin, a tetrafluoroethylene-ethylene copolymer resin, a trifluorochloroethylene-ethylene copolymer resin, a vinylidene fluoride resin, a trifluorochloroethylene copolymer resin, and a vinyl fluoride resin.

The metal material is not particularly limited and a known material can be used.

The metal material may be, for example, a metal material having a total content of chromium and nickel of more than 25 mass % with respect to the total mass of the metal material, among which a metal material having a total content of chromium and nickel of 30 mass % or more is more preferable. The upper limit value of the total content of chromium and nickel in the metal material is not particularly limited, but is generally preferably 90 mass % or less.

Examples of the Metal Material Include Stainless Steel and Nickel-Chromium Alloy.

The stainless steel is not particularly limited and known stainless steel can be used. Among them, an alloy containing nickel in an amount of 8 mass % or more is preferable, and austenitic stainless steel containing nickel in an amount of 8 mass % or more is more preferable. Examples of the austenitic stainless steel include SUS (Steel Use Stainless) 304 (Ni content: 8 mass %, Cr content: 18 mass %), SUS 304L (Ni content: 9 mass %, Cr content: 18 mass %), SUS 316 (Ni content: 10 mass %, Cr content: 16 mass %), and SUS 316L (Ni content: 12 mass %, Cr content: 16 mass %).

The nickel-chromium alloy is not particularly limited, and a known nickel-chromium alloy can be used. Above all, a nickel-chromium alloy having a nickel content of 40 to 75 mass % and a chromium content of 1 to 30 mass % is preferable.

Examples of the nickel-chromium alloy include HASTELLOY (trade name, the same applies hereinafter), MONEL (trade name, the same applies hereinafter), and INCONEL (trade name, the same applies hereinafter). More specifically, HASTELLOY C-276 (Ni content: 63 mass %, Cr content: 16 mass %), HASTELLOY C (Ni content: 60 mass %, Cr content: 17 mass %), and HASTELLOY C-22 (Ni content: 61 mass %, Cr content: 22 mass %) can be mentioned.

Further, the nickel-chromium alloy may further contain boron, silicon, tungsten, molybdenum, copper, cobalt, and the like, if necessary, in addition to the above-mentioned alloy.

The method of electropolishing the metal material is not particularly limited and a known method can be used. For example, the methods described in paragraphs [0011] to [0014] of JP2015-227501A and paragraphs [0036] to [0042] of JP2008-264929A can be used.

It is presumed that the content of chromium in the passive layer on the surface of the metal material is higher than the content of chromium in the matrix by electropolishing. Therefore, it is presumed that metal impurities containing metal atoms are less likely to flow out into the organic solvent from the distillation column in which a wetted part is formed from an electropolished metal material, so that a distilled organic solvent having a reduced content of impurities can be obtained.

In addition, the metal material may be buffed. The method of buffing is not particularly limited, and a known method can be used. The size of the abrasive grains used for the finishing of the buffing is not particularly limited, but is preferably #400 or lower in that irregularities on the surface of the metal material tend to be smaller. In addition, the buffing is preferably carried out before the electropolishing.

Purification Apparatus (Another Embodiment)

Another embodiment of the purification apparatus that can be used in the distillation step may be, for example, a purification apparatus comprising a reaction section for reacting raw materials to obtain a reaction product which is an organic solvent, the distillation column as described above, and a transfer pipe line for connecting the reaction section and the distillation column and transferring the reaction product from the reaction section to the distillation column.

The reaction section has a function of reacting the supplied raw materials (in the presence of a catalyst as necessary) to obtain a reaction product which is an organic solvent. The reaction section is not particularly limited and a known reaction section can be used.

The reaction section may be, for example, an embodiment comprising a reaction tank to which raw materials are supplied and in which a reaction proceeds, a stirring section provided inside the reaction tank, a lid section joined to the reaction tank, an injection section for injecting the raw materials into the reaction tank, and a reaction product-withdrawing section for withdrawing a reaction product from the reaction tank. Raw materials can be continuously or discontinuously injected into the reaction section and the injected raw materials can be reacted (in the presence of a catalyst) to obtain a reaction product which is an organic solvent.

In addition, the reaction section may optionally include a reaction product isolating section, a temperature adjusting section, and a sensor section including a level gauge, a pressure gauge, a thermometer, and the like.

It is preferred that the wetted part (for example, the inner wall of the wetted part of the reaction tank) of the reaction section is formed of at least one selected from the group consisting of a non-metal material and an electropolished metal material. The embodiment of each of the above materials has already been described.

According to the purification apparatus including the above-mentioned reaction section, it is possible to obtain a purified product in which the impurity content is further reduced.

In the purification apparatus according to the foregoing embodiment, the reaction section and the distillation column are connected by a transfer pipe line. Since the reaction section and the distillation column are connected by a transfer pipe line, the transfer of the reaction product from the reaction section to the distillation column is carried out in a closed system, and incorporation of impurities including metal impurities from the environment into the reaction product is prevented. This makes it possible to obtain a purified product in which the impurity content is further reduced.

The transfer pipe line is not particularly limited and a known transfer pipe line can be used. The transfer pipe line may be, for example, an embodiment comprising a pipe, a pump, a valve, and the like.

It is preferred that the wetted part of the transfer pipe line is formed of at least one selected from the group consisting of a non-metal material and an electropolished metal material. The embodiment of each of the above materials has already been described.

According to the purification apparatus comprising the foregoing transfer pipe line, it is possible to more easily obtain a purified product in which the content of impurities is further reduced.

(Component Adjustment Step)

The purification step (2) preferably includes a component adjustment step.

The component adjustment step is a step of adjusting the content of metal impurities, organic impurities (particularly alcohol impurities), and water contained in reaction products, purified products, and organic solvents (hereinafter, referred to as "material to be purified").

The method for adjusting the content of metal impurities, organic impurities, water, and the like contained in the material to be purified is not particularly limited and a known method can be used.

The method for adjusting the content of metal impurities, alcohol impurities, organic impurities other than the alcohol impurities, water, and the like contained in the material to be purified may be, for example, a method of adding metal impurities, alcohol impurities, organic impurities other than the alcohol impurities, water, and the like to the material to be purified, or a method of removing metal impurities, alcohol impurities, organic impurities other than the alcohol impurities, water, and the like in the material to be purified.

The method of removing metal impurities, organic impurities, water, and the like in the material to be purified is not particularly limited and a known method can be used.

The method of removing metal impurities, organic impurities, water, and the like in the material to be purified is, for example, preferably a method of passing a material to be purified through a filter (The step of carrying out the above is hereinafter referred to as a "filtering step"). The method of passing a material to be purified through a filter is not particularly limited and may be, for example, a method in which a filter unit comprising a filter and a filter housing is disposed in the middle of a transfer pipe line for transferring a material to be purified and the material to be purified is allowed to pass through the filter unit with or without pressure.

The filter is not particularly limited and a known filter can be used.

Filtering Step

The component adjustment step preferably includes a filtering step.

The filter used in the filtering step is not particularly limited and a known filter can be used.

Examples of the material of the filter used in the filtering step include a fluororesin such as polytetrafluoroethylene (PTFE), a polyamide-based resin such as nylon, and a polyolefin resin such as polyethylene or polypropylene (PP) (including ones having a high density and an ultra-high molecular weight). Among them, a polyamide-based resin, PTFE, and polypropylene (including high density polypropylene) are preferable. By using the filter formed by these materials, it is possible to more effectively remove foreign matters having high polarity which are likely to cause particle defects, and it is possible to more efficiently reduce the amount of metal components (metal impurities).

With respect to the critical surface tension of the filter, the lower limit value is preferably 70 mN/m or more. The upper limit value is preferably 95 mN/m or less. In particular, the critical surface tension of the filter is more preferably 75 mN/m or more and 85 mN/m or less.

The value of the critical surface tension is a nominal value of the manufacturer. By using the filter having the critical surface tension within the above range, it is possible to more effectively remove foreign matters having high polarity which are likely to cause particle defects, and it is possible to more efficiently reduce the amount of the metal components (metal impurities).

The pore size of the filter is preferably about 0.001 to 1.0 μm, more preferably about 0.01 to 0.5 μm, and still more preferably about 0.01 to 0.1 μm. By setting the pore size of the filter within the above range, it becomes possible to reliably remove fine foreign matters contained in the material to be purified while suppressing filter clogging.

In a case of using filters, different filters may be used in combination. In that case, filtering by a first filter may be carried out only once or two or more times. In a case where filtering is carried out two or more times by combining different filters, the filters may be of the same type or different types from each other, but they are preferably different types from each other. Typically, it is preferred that at least one of the pore size or the constituent material is different between the first filter and the second filter.

The pore size for the second or subsequent filtering is preferably made equal to or smaller than that for the first filtering. In addition, first filters having a different pore size in the above-mentioned range may be used in combination. The pore size herein can be set by referring to nominal values of filter manufacturers. Commercially available filters can be selected from various filters provided by, for example, Nihon Pall Ltd., Advantec Toyo Kaisha, Ltd., Nihon Entegris K.K. (formerly Nihon Mykrolis K.K.) or Kitz Micro Filter Corporation. In addition, a "P-NYLON FILTER (pore size: 0.02 μm, critical surface tension: 77 mN/m)" made of polyamide; (manufactured by Nihon Pall Ltd.), a "PE•CLEAN FILTER (pore size: 0.02 μm)" made of high density polyethylene; (manufactured by Nihon Pall Ltd.), and a "PE•CLEAN FILTER (pore size: 0.01 μm)" made of high density polyethylene; (manufactured by Nihon Pall Ltd.) can also be used.

Although not particularly limited, for example, from the viewpoint of suppressing an increase in metal impurities (in particular, those present in a chemical liquid as solids) at the time of storage of a purified chemical liquid, in addition to the viewpoint of obtaining a desired effect for the chemical liquid of the present invention, the relationship between the material to be purified and the material of the filter used for filtering is a combination satisfying a relational expression (Ra/R0)≤1 of Ra and R0 by taking the interaction radius (R0) in the Hansen solubility parameter (HSP) space that can be derived from the material of the filter used for filtering and the radius (Ra) of the sphere of Hansen space that can be derived from the organic solvent contained in the material to be purified, so that it is preferable to be a material to be purified which is filtered with a filter material satisfying the relational expression. (Ra/R0)≤0.98 is preferable and (Ra/R0)≤0.95 is more preferable. The lower limit is preferably 0.5 or more, more preferably 0.6 or more, and still more preferably 0.7. Although the mechanism is not clear, an increase in the content of metal impurities in the chemical liquid at the time of long-term storage is suppressed within this range.

The combination of these filters and the material to be purified is not particularly limited, but may be the one disclosed in US2016/0089622A.

As the second filter, it is possible to use a filter formed of the same material as that of the first filter. A filter having the same pore size as that of the first filter can be used. In a case where the second filter has a smaller pore size than the first filter, the ratio of pore size of second filter to pore size of first filter (pore size of second filter/pore size of first filter) preferably 0.01 to 0.99, more preferably 0.1 to 0.9, and still more preferably 0.2 to 0.9. By setting the pore size of the second filter within the above range, fine foreign matters incorporated in the chemical liquid can be more reliably removed.

Since the filtration pressure affects the filtration accuracy, it is preferred that the pulsation of the pressure at the time of filtration is as low as possible.

In a case of using two or more filters, the differential pressure before and after passing through each filter (hereinafter, also referred to as "filtration differential pressure") is not particularly limited, but is preferably 250 kPa or less and more preferably 200 kPa or less. The lower limit of filtration differential pressure is not particularly limited, but is preferably 50 kPa or more. In a case where the filtration differential pressure is 250 kPa or less, it is possible to prevent an excessive pressure from being applied to the filter, and therefore it is expected to reduce the eluted substance.

In the above-mentioned method for producing a chemical liquid, the filtration rate is not particularly limited, but from the viewpoint of obtaining a chemical liquid which further enhances the effects of the present invention, it is preferably 1.0 L/min/m$^2$ or more, more preferably 0.75 L/min/m$^2$ or more, and still more preferably 0.6 L/min/m$^2$ or more.

A differential pressure resistance that ensures filter performance (filter will not break) is set in the filter, and in a case where this value is large, the filtration rate can be increased by increasing the filtration pressure. That is, the upper limit of the filtration rate usually depends on the differential pressure resistance of the filter, but is usually preferably 10.0 L/min/m$^2$ or less.

In the above method for producing a chemical liquid, the filtration pressure is preferably 0.001 to 1.0 MPa, more preferably 0.003 to 0.5 MPa, and still more preferably 0.005 to 0.3 MPa, from the viewpoint that a chemical liquid that further enhances the effects of the present invention can be obtained. In particular, in a case where a filter having a small pore size is used, it is possible to efficiently reduce the amount of particulate foreign matters or impurities dissolved in the material to be purified by increasing the filtration pressure. In a case of using a filter having a pore size smaller than 20 nm, the filtration pressure is particularly preferably 0.005 to 0.3 MPa.

In addition, the filtration rate decreases as the pore size of the filter decreases. However, in a case where a plurality of filters of the same type are connected in parallel, the filtration area is enlarged and the filtration pressure is lowered, which makes it possible to compensate for a reduction in the filtration rate.

The filter may be cleaned prior to use thereof. The method of cleaning the filter is not particularly limited, but there are a method of dipping the filter in a cleaning liquid, a method of passing the cleaning liquid through the filter, and a combination thereof.

In a case of cleaning the filter, it becomes easy to control the amount of components extracted from the filter, and as a result, a chemical liquid having superior effects of the present invention can be obtained.

The cleaning liquid is not particularly limited and a known cleaning liquid can be used. The cleaning liquid is not particularly limited and examples thereof include water and an organic solvent. Examples of the organic solvent include organic solvents that can be contained in chemical liquid, such as alkylene glycol monoalkyl ether carboxylate, alkylene glycol monoalkyl ether, alkyl lactate, alkyl alkoxypropionate, cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

More specific examples of the cleaning liquid include propylene glycol monomethyl ether, propylene glycol monomethyl ether acetate, dimethyl sulfoxide, n-methyl pyrrolidone, diethylene glycol, ethylene glycol, dipropylene glycol, propylene glycol, ethylene carbonate, propylene carbonate, sulfolane, cyclohexane, cyclohexanone, cycloheptanone, cyclopentanone, 2-heptanone, γ-butyrolactone, and a mixture thereof.

More preferably, the filtering step includes the following steps. The filtering step may include the following respective steps once or a plurality of times. Further, the order of the following steps is not particularly limited.

1. Particle removing step
2. Metal ion removing step
3. Organic impurity removing step
4. Ion exchange step Hereinafter, each of the above steps will be described.

Particle Removing Step

The particle removing step is a step of removing coarse particles and/or metal impurities (among others, those present in the chemical liquid as solids) in the material to be purified, using a particle removal filter. The particle removal filter is not particularly limited and a known particle removal filter can be used.

The particle removal filter may be, for example, a filter having a particle removal size of 20 nm or less. Coarse particles (the embodiment of coarse particles is as already explained) can be removed from an organic solvent by filtering the organic solvent using the above filter.

The particle removal size is preferably 1 to 15 nm and more preferably 1 to 12 nm. In a case where the particle removal size is 15 nm or less, finer coarse particles can be removed, and in a case where the particle removal size is 1 nm or more, the filtration efficiency is improved.

As used herein, the term "particle removal size" refers to a minimum size of filter removable particles. For example, in a case where the particle removal size of the filter is 20 nm, particles having a diameter of 20 nm or more can be removed.

Examples of the material of the filter include 6-nylon, 6,6-nylon, polyethylene, polypropylene, polystyrene, polyimide, polyamideimide, and fluororesin.

The polyimide and/or the polyamideimide may have at least one selected from the group consisting of a carboxy group, a salt-type carboxy group, and an —NH— bond. Fluororesin, polyimide and/or polyamideimide is excellent in terms of solvent resistance.

A plurality of filters may be used to constitute a filter unit. That is, the filter unit may further comprise a filter having a particle removal size of 50 nm or more (for example, a microfiltration membrane for removing fine particles having a pore size of 50 nm or more). In a case where fine particles other than colloidal impurities, particularly colloidal impurities containing metal atoms such as iron or aluminum, are present in the material to be purified, the filtration efficiency of a filter having a particle removal size of 20 nm or less (for example, a microfiltration membrane having a pore size of 20 nm or less) is improved and the performance of removing coarse particles thereof is further improved, by carrying out the filtration of a material to be purified using a filter having a particle removal size of 50 nm or more (for example, a microfiltration membrane for removing fine particles having a pore size of 50 nm or more) before filtration using a filter having a particle removal size of 20 nm or less (for example, a microfiltration membrane having a pore size of 20 nm or less).

Metal Ion Removing Step

It is preferred that the filtering step further includes a metal ion removing step. The metal ion removing step is preferably a step of passing a material to be purified through a metal ion adsorption filter. The method of passing a material to be purified through a metal ion adsorption filter is not particularly limited and may be, for example, a method in which a metal ion adsorption filter unit comprising a metal ion adsorption filter and a filter housing is disposed in the middle of a transfer pipe line for transferring a material to be purified and the material to be purified is allowed to pass through the metal ion adsorption filter unit with or without pressure.

The metal ion adsorption filter is not particularly limited and may be, for example, a known metal ion adsorption filter.

Among others, an ion exchangeable filter is preferable as the metal ion adsorption filter. Here, from the viewpoint that the metal ions to be adsorbed are likely to cause defects in semiconductor devices, ions of at least one metal selected from the group consisting of Fe, Cr, Ni, and Pb are preferable, and ions of all metals of Fe, Cr, Ni, and Pb are more preferable.

From the viewpoint of improving the metal ion adsorption performance, the metal ion adsorption filter preferably has an acid group on the surface thereof. Examples of the acid group include a sulfo group and a carboxy group.

Examples of the base material (material) constituting the metal ion adsorption filter include cellulose, diatomaceous earth, nylon, polyethylene, polypropylene, polystyrene, and fluororesin.

In addition, the metal ion adsorption filter may be made of a material containing polyimide and/or polyamideimide.

The metal ion adsorption filter may be, for example, a polyimide and/or polyamideimide porous membrane described in JP2016-155121A.

The polyimide and/or polyamideimide porous membrane may contain at least one selected from the group consisting of a carboxy group, a salt-type carboxy group, and an —NH— bond. In a case where the metal ion adsorption filter is made of fluororesin, polyimide and/or polyamideimide, it has superior solvent resistance.

Organic Impurity Removing Step

The filtering step preferably includes organic impurity removing means.

The organic impurity removing means is preferably a step of passing a material to be purified through an organic impurity adsorption filter. The method of passing a material to be purified through an organic impurity adsorption filter is not particularly limited and may be, for example, a method in which a filter unit comprising an organic impurity adsorption filter and a filter housing is disposed in the middle of a transfer pipe line for transferring a material to be purified and an organic solvent is allowed to pass through the filter unit with or without pressure.

The organic impurity adsorption filter is not particularly limited and may be, for example, a known organic impurity adsorption filter.

In particular, from the viewpoint of improving the organic impurity adsorption performance, the organic impurity adsorption filter is preferably one having an organic skeleton capable of interacting with organic impurities on the surface (in other words, one whose surface is modified by an organic skeleton capable of interacting with organic impurities). The organic skeleton capable of interacting with organic impurities may be, for example, a chemical structure capable of reacting with organic impurities to capture the organic impurities on an organic impurity adsorption filter. More specifically, for example, in a case where dibutylhydroxytoluene (BHT) is contained as organic impurities, a phenyl group may be mentioned as the organic skeleton. In addition, in a case where it is desired to further reduce the amount of alcohol impurities, an organic impurity adsorption filter which easily interacts with alcohol impurities is used.

Examples of the base material (material) constituting the organic impurity adsorption filter include activated carbon-supported cellulose, diatomaceous earth, nylon, polyethylene, polypropylene, polystyrene, and fluororesin.

In addition, a filter in which activated carbon is fixed to a nonwoven fabric, described in JP2002-273123A and JP2013-150979A, can also be used as the organic impurity adsorption filter.

As the organic impurity adsorption filter, a physical adsorption method can also be applied, besides the foregoing chemical adsorption (adsorption using an organic impurity removal filter having an organic skeleton capable of interacting with organic impurities on the surface thereof).

For example, in a case where BHT is contained as organic impurities, the structure of BHT is larger than 10 Å (=1 nm). Therefore, BHT cannot pass through the pores of the filter by using the organic impurity adsorption filter having a pore size of 1 nm. That is, since BHT is physically captured by the filter, it is removed from the material to be purified. As described above, it is also possible to apply not only chemical interaction but also a physical removal method for the removal of organic impurities. In this case, however, a filter having a pore size of 3 nm or more is used as a "particle removal filter", and a filter having a pore size of less than 3 nm is used as an "organic impurity adsorption filter".

In the present specification, 1 angstrom (Å) corresponds to 0.1 nm.

Ion Exchange Treatment Step

The filtering step may further include an ion exchange step.

The ion exchange step is preferably a step of passing a material to be purified through an ion exchange unit. The method of passing a material to be purified through an ion exchange unit is not particularly limited and may be, for example, a method in which an ion exchange unit is disposed in the middle of a transfer pipe line for transferring a material to be purified and an organic solvent is allowed to pass through the ion exchange unit with or without pressure.

The ion exchange unit is not particularly limited and a known ion exchange unit can be used. The ion exchange unit may be, for example, one in which a tower-like container is filled with an ion exchange resin, or an ion adsorption membrane.

One embodiment of the ion exchange step may be, for example, a step using one in which a cation exchange resin or anion exchange resin as an ion exchange resin is provided in a single bed, one in which a cation exchange resin and an anion exchange resin are provided in multiple beds, or one in which a cation exchange resin and an anion exchange resin are provided in a mixed bed.

As the ion exchange resin, in order to reduce the elution of water from the ion exchange resin, it is preferable to use a dry resin which does not contain water as much as possible. Such a dry resin may be a commercially available product, examples of which include 15JS-HG•DRY (trade name, dry cation exchange resin, water content: 2% or less) and MSPS 2-1•DRY (trade name, mixed bed resin, water content: 10% or less), which are manufactured by Organo Corporation.

It is preferred that the ion exchange step is carried out before the distillation step described above or before the water adjustment step described later.

Another embodiment of the ion exchange step may be, for example, a step using an ion adsorption membrane.

Processing at high flow velocity is possible by using the ion adsorption membrane. The ion adsorption membrane is not particularly limited and may be, for example, NEOSEPTA (trade name, manufactured by Astom Corporation).

It is preferred that the ion exchange step is carried out after the distillation step described above. Through the ion exchange step, the impurities can be removed in a case where the impurities accumulated in the purification apparatus flow out, and eluted substances from piping such as stainless steel (SUS) used as a transfer pipe line can be removed.

Water Adjustment Step

The water adjustment step is a step of adjusting the content of water contained in the material to be purified. The method for adjusting the content of water is not particularly limited and examples thereof include a method of adding water to the material to be purified and a method of removing water from the material to be purified.

The method of removing water is not particularly limited and a known dehydration method can be used.

Examples of the method of removing water include a dehydration membrane, a water adsorbent insoluble in an organic solvent, an aeration apparatus using a dry inert gas, and a heating or vacuum heating apparatus.

In a case where a dehydration membrane is used, membrane dehydration is carried out by pervaporation (PV) or vapor permeation (VP). The dehydration membrane is configured, for example, as a water permeable membrane module. As the dehydration membrane, a membrane made of a polymeric material such as a polyimide-based polymer, a cellulose-based polymer, or a polyvinyl alcohol-based polymer or a membrane made of an inorganic material such as zeolite can be used.

The water adsorbent is used by being added to the material to be purified. Examples of the water adsorbent include zeolite, diphosphorus pentaoxide, silica gel, calcium chloride, sodium sulfate, magnesium sulfate, anhydrous zinc chloride, fuming sulfuric acid, and soda lime.

In a case where zeolite (in particular, MOLECULAR SIEVE (trade name) manufactured by Union Showa K.K.) is used in the dehydration treatment, olefins can also be removed.

The component adjustment step described above is preferably carried out in an airtight state and under an inert gas atmosphere with a low possibility of incorporation of water into the material to be purified.

In addition, each treatment is preferably carried out under an inert gas atmosphere having a dew point temperature of −70° C. or lower in order to minimize incorporation of water. This is because the water concentration in the gas phase is 2 mass ppm or less under an inert gas atmosphere of −70° C. or lower, so that the possibility of incorporation of water into an organic solvent is lowered.

In addition to the above-mentioned individual steps, the method for producing a chemical liquid may include a step of adsorbing and purifying a metal component using silicon carbide, as described in, for example, WO2012/043496A.

<<Other Steps>>

In addition to the organic solvent preparation step and the purification step, the above-mentioned method for producing a chemical liquid may include other steps within the range that exerts the effects of the present invention. The other steps are not particularly limited, but for example, a neutralization step may be mentioned.

(Neutralization Step)

The neutralization step is a step of reducing a charge potential of a material to be purified by neutralizing the material to be purified.

The neutralization method is not particularly limited and a known neutralization method can be used. The neutralization method may be, for example, a method in which a material to be purified is brought into contact with a conductive material.

The contact time during which the material to be purified is brought into contact with the conductive material is preferably 0.001 to 60 seconds, more preferably 0.001 to 1 second, and still more preferably 0.01 to 0.1 second. Examples of the conductive material include stainless steel, gold, platinum, diamond, and glassy carbon.

The method of bringing a material to be purified into contact with a conductive material may be, for example, a method in which a grounded mesh made of a conductive material is disposed inside a pipe line and a material to be purified is passed through the mesh.

It is preferred that the neutralization step is included before at least one step selected from the group consisting of an organic solvent preparation step and a purification step.

In the method for producing a chemical liquid according to the present invention, the part in contact with the chemical liquid in the apparatus and step (including a connecting step, a filling step, an on-vehicle tank, and a storage tank) related to any one of production, storage, or transport is preferably cleaned before the production of the chemical liquid of the present invention. The liquid used for cleaning is not particularly limited, but in a case where the liquid is the chemical liquid itself of the present invention or is a dilution of the chemical liquid of the present invention, the effects of the present invention are significantly obtained. Alternatively, it is possible to use an organic solvent which is substantially free from particles containing metal atoms, metal ion components, and organic impurities, or from which these components are sufficiently reduced. Cleaning may be carried out a plurality of times, and two or more organic solvents may be used or may be used in admixture. The cleaning may be circulation cleaning.

Whether the apparatus related to production has been thoroughly cleaned can be judged by measuring the content of metal atoms contained in the liquid used for cleaning or the metal ion components in the liquid.

<<Clean Room>>

It is preferred that all of handling, treatment analysis, and measurement including production of a chemical liquid, opening and/or cleaning of a container, charging of a chemical liquid, and the like are carried out in a clean room. It is preferred that the clean room satisfies the 14644-1 clean room standards. The clean room preferably satisfies any one of International Organization for Standardization (ISO) class 1, ISO class 2, ISO class 3, or ISO class 4, more preferably satisfies ISO class 1 or ISO class 2, and still more preferably satisfies ISO class 1.

[Method for Producing Electronic Device]

Further, the present invention relates to a method for producing an electronic device including the above-mentioned pattern forming method according to the embodiment of the present invention. The electronic device produced by the method for producing an electronic device according to the embodiment of the present invention is suitably mounted on electrical and electronic equipment (for example, home electronic equipment, office automation (OA)-related equipment, media-related equipment, optical equipment, or communication equipment).

[Kit]

Further, the present invention relates to a kit comprising the above-mentioned chemical liquid and an actinic ray-sensitive or radiation-sensitive resin composition.

The actinic ray-sensitive or radiation-sensitive resin composition refers to an actinic ray-sensitive or radiation-sensitive resin composition containing the above-mentioned resin represented by Formula (I), or an actinic ray-sensitive or radiation-sensitive resin composition containing the above-mentioned resin (resin P) having a repeating unit having a phenolic hydroxyl group and having a group capable of decomposing by the action of an acid to generate a polar group.

According to the kit, it is possible to form a pattern having excellent developability and defect suppression performance.

Specific aspects of the kit according to the embodiment of the present invention are described below.

(Aspect 1) A kit comprising a developer and the above-mentioned actinic ray-sensitive or radiation-sensitive resin composition, in which the developer corresponds to the above-mentioned chemical liquid.

(Aspect 2) A kit comprising a developer, a rinsing liquid, and the above-mentioned actinic ray-sensitive or radiation-sensitive resin composition, in which the developer and the rinsing liquid correspond to the above-mentioned chemical liquid.

(Aspect 3) A kit according to the aspect as shown in the above (Aspect 1) and (Aspect 2), in which the actinic ray-sensitive or radiation-sensitive resin composition contains an organic solvent,
organic impurities containing at least alcohol impurities, and
metal impurities containing a metal atom, and
the total content of the alcohol impurities is 0.01 mass ppb to 1000 mass ppm with respect to the total mass of the composition.

(Aspect 4) A kit according to the aspect as shown in the above (Aspect 1) and (Aspect 2), in which the actinic ray-sensitive or radiation-sensitive resin composition contains
an organic solvent,
organic impurities containing at least alcohol impurities, and
metal impurities containing a metal atom,
the total content of the alcohol impurities is 0.01 mass ppb to 1000 mass ppm with respect to the total mass of the composition,
the metal impurities contain at least one specific metal atom selected from the group consisting of an Fe atom, a Cr atom, a Ni atom, and a Pb atom,
in a case where the specific metal atom is one selected from the group consisting of an Fe atom, a Cr atom, a Ni atom, and a Pb atom, the content of the specific metal atom is 0.001 to 100 mass ppt with respect to the total mass of the composition,
in a case where the specific metal atom is two or more selected from the group consisting of an Fe atom, a Cr atom, a Ni atom, and a Pb atom, the content of each specific metal atom is 0.001 to 100 mass ppt with respect to the total mass of the composition, and
the total content of the metal atoms contained in the composition is 0.1 to 500 mass ppt with respect to the total mass of the composition.

From the viewpoint of easy production while obtaining excellent developability and excellent defect suppression properties, the (Aspect 1) or (Aspect 2) is preferable and the (Aspect 1) is more preferable, among the above-mentioned kits.

EXAMPLES

Hereinafter, the present invention will be described in more detail with reference to Examples. Materials, amounts of use, proportions, treatment contents, treatment procedures, and the like shown in the following Examples can be appropriately modified without departing from the spirit and scope of the present invention. Therefore, the scope of the present invention should not be interpreted restrictively by the following Examples.

[Evaluation 1 of Developability, Defect Suppression Performance, and Bridge Defect Suppression Performance]

[Preparation of Organic Solvent]

The following organic solvents were prepared for producing chemical liquids of Examples and Comparative Examples. As each organic solvent, a high purity grade having a purity of 99 mass % or more was used. The parenthesis indicates the abbreviation of each organic solvent.

Butyl acetate (nBA)
Propylene glycol monomethyl ether (PGME)
Propylene glycol monoethyl ether (PGEE)
Propylene glycol monopropyl ether (PGPE)
Ethyl lactate (EL)
Cyclopentanone (CyPe)
Cyclohexanone (CyHe)
Propylene glycol monomethyl ether acetate (PGMEA)
Butyl acetate (nBA)
4-methyl-2-pentanol (MIBC)
1-Hexanol
2-Heptanone
Isoamyl acetate
Isopropyl alcohol (IPA)

[Preparation of Chemical Liquid for Developer]

<Preparation of Chemical Liquid A1 for Developer>

Butyl acetate (nBA) was prepared as an organic solvent, and a chemical liquid A1 for a developer was produced by the following method.

For production, an apparatus in which a stainless steel tank whose wetted part is formed of a tetrafluoroethylene resin (polytetrafluoroethylene; PTFE) and a plurality of filter units are connected by a circulation pipe line was used. Also, a pump was disposed in the middle of the circulation pipe line. The circulation pipe line and the wetted part of the pump are formed of a tetrafluoroethylene resin. The filters used are as follows from the tank side in order.

First metal ion adsorption filter (Entegris's 15 nm IEX PTFE (filter having a pore size of 15 nm and having a sulfo group on the surface of PTFE base material))
Particle removal filter (Entegris's 12 nm PTFE (PTFE filter having a particle removal size of 12 nm))
Second metal ion adsorption filter (Entegris's 15 nm IEX PTFE (filter having a pore size of 15 nm and having a sulfo group on the surface of PTFE base material))
Organic impurity adsorption filter (special filter A (filter in which activated carbon is fixed to a nonwoven fabric, described in JP2013-150979A))

Further, a water adjusting means containing MOLECULAR SIEVE 3A (dehydrating agent, manufactured by Union Showa K.K.) was provided on the downstream side of the organic impurity adsorption filter.

The tank was filled with butyl acetate (nBA) which was then circulated a plurality of times through the pipe line including the filter and the water adjusting means to obtain a chemical liquid A1 for a developer.

<Preparation of Chemical Liquids A2 to A140 for Developers>

Raw materials to be used and/or the number of times to pass the filter, and the like were appropriately adjusted, and chemical liquids A2 to A140 for developers were obtained in the compositions shown in the following Tables 1, 3, 5, 7, 9, and 11 by the same method as in the chemical liquid A1 for a developer.

<Method for Measuring Content or the Like of Each Component Contained in Chemical Liquid>

The following method was used for measuring the content or the like of each component contained in the chemical liquid prepared in each of Examples and Comparative Examples. In addition, all of the following measurements were carried out in a clean room at a level that satisfies ISO (International Organization for Standardization) Class 2 or lower. In order to improve the measurement accuracy, in the measurement of each component, in a case where the component is below the detection limit by ordinary measurement, the component is concentrated to 1/100 in terms of volume and the measurement is carried out, and the content of the component is calculated in terms of the content of the organic solvent before concentration. The results are shown in Tables 1, 3, 5, 7, 9, and 11.

(Content of Organic Solvent, Alcohol Impurities, and Organic Impurities)

The content of the organic solvent, alcohol impurities, and organic impurities contained in the chemical liquid prepared in each of Examples and Comparative Examples was measured by gas chromatography mass spectrometry (product name "GCMS-2020", manufactured by Shimadzu Corporation). The results are shown in Tables 1, 3, 5, 7, 9, and 11. The content of the organic impurities referred to herein is intended to be a total content of organic impurities including alcohol impurities.

<<Measurement Conditions>>

Capillary column: InertCap 5MS/NP 0.25 mm I.D.×30 mdf=0.25 μm, sample introduction method: split 75 kPa pressure constant, vaporization chamber temperature: 230° C., column oven temperature: 80° C. (2 min) to 500° C. (13 min), heating rate: 15° C./min, carrier gas: helium, septum purge flow rate: 5 mL/min, split ratio: 25:1, interface temperature: 250° C., ion source temperature: 200° C., measuring mode: Scan m/z=85 to 500, and sample introduction volume: 1 μL <<Organic Impurities Other than Alcohol Impurities>>

Organic impurities other than alcohol impurities represented by abbreviations in the table correspond to the following compounds.

ENB: addition polymer of 5-ethylidene-2-norbornene (structural formula shown below)

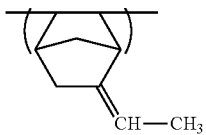

DCP: addition polymer of cyclopentadiene (structural formula shown below)

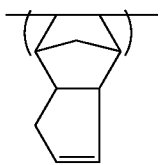

DOP: dioctyl phthalate
HD: addition polymer of 1,4-hexadiene (structural formula shown below)

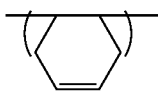

DIDP: diisodecyl phthalate
DINA: diisononyl adipate
DPHP: bis(2-propylheptyl) phthalate
DINP: diisononyl phthalate
DBP: dibutyl phthalate
BBzP: benzyl butyl phthalate
DIDP: diisodecyl phthalate
DIOP: diisooctyl phthalate
DEP: diethyl phthalate
DIBP: diisobutyl phthalate
TMTM: trimethyl trimellitate
ATM: tris(n-octyl-n-decyl) trimellitate
LTM: tris(heptyl, nonyl) trimellitate
OTM: tris(octyl) trimellitate
DEHA: dioctyl adipate
DMAD: dimethyl adipate
MMAD: monomethyl adipate
DBS: dibutyl sebacate
DBM: dibutyl maleate
DIBM: dibutyl maleate
Azelates: azelaic acid ester
Benzoates: benzoic acid ester
DEHT: dioctyl terephthalate
DINCH: 1,2-cyclohexanedicarboxylic acid diisononyl ester
Epoxidized vegetable oils: epoxidized vegetable oils
ASE: alkylsulfonic acid phenyl ester
ETSA: N-ethyl-toluenesulfonamide
HPBSA: N-(2-hydroxypropyl)benzenesulfonamide
BBSA-NBBS: N-(n-butyl)benzenesulfonamide
TCP: tricresyl phosphate
TBP: tributyl phosphate
3G6: triethylene glycol dihexanoate
4G7: tetraethylene glycol diheptanoate
TEC: triethyl citrate
ATEC: acetyl triethyl citrate
TBC: tributyl citrate
ATBC: acetyl tributyl citrate
TOC: trioctyl citrate
ATOC: trioctyl acetyl citrate
THC: trihexyl citrate
ATHC: acetyl trihexyl citrate
BTHC: trihexyl butyryl citrate
TMC: trimethyl citrate
ESBO: epoxidized soybean oils
NG: nitroglycerin
BTTN: butanetriol trinitrate
DNT: dinitrotoluene
TMETN: trimethylolethane trinitrate
DEGDN: diethylene glycol dinitrate
TEGDN: triethylene glycol dinitrate
BDNPF: bis(2,2-dinitropropyl) formal
BDNPA: bis(2,2-dinitropropyl) acetal
TNEN: 2,2,2-trinitroethyl-2-nitroethyl ether (Measurement of Content of Water)

The content of water contained in the chemical liquid prepared in each of Examples and Comparative Examples was measured. For the measurement, a Karl Fischer water meter (product name "MKC-710M", manufactured by Kyoto Electronics Manufacturing Co., Ltd., Karl Fischer coulometric titration type) was used. The results are shown in Tables 1, 3, 5, 7, 9, and 11.

(Measurement of Content of Metal Atoms)

The content of metal atoms contained in the metal impurities in the chemical liquid prepared in each of Examples and Comparative Examples was measured using an Agilent 8800 triple quadrupole ICP-MS (for semiconductor analysis, Option #200). The results are shown in Tables 1, 3, 5, 7, 9, and 11.

(Measurement Conditions)

For the sample introduction system, a quartz torch and a concentric perfluoroalkoxy alkane (PFA) nebulizer (for self-priming), and a platinum interface cone were used. The measurement parameters of the cool plasma conditions are as follows.

Radio Frequency (RF) output (W): 600
Carrier gas flow rate (L/min): 0.7
Make-up gas flow rate (L/min): 1
Sampling depth (mm): 18

(Number of Coarse Particles)

The number of coarse particles contained in the chemical liquid prepared in each of Examples and Comparative Examples was measured.

With respect to the above-mentioned chemical liquid, after allowing the chemical liquid to stand at room temperature for 1 day after the preparation thereof, counting of the number of objects to be counted having a size of 0.1 μm or more contained in 1 mL is carried out five times using a light scattering type in-liquid particle counter based on a dynamic light scattering method (model number: KS-18F, manufactured by RION Co., Ltd., light source: semiconductor laser-pumped solid-state laser (wavelength: 532 nm, rated output: 500 mW), flow rate: 10 mL/min), and the average value of the calculated values was taken as the measured value.

The light scattering type in-liquid particle counter was used after calibration with a polystyrene latex (PSL) standard particle liquid. The results are shown in Tables 1, 3, 5, 7, 9, and 11.

[Preparation of Chemical Liquid for Pre-Wetting]
<Preparation of Chemical Liquids B1 to B136 for Pre-Wetting>

Raw materials to be used and/or the number of times to pass the filter, and the like were appropriately adjusted, and chemical liquids B1 to B136 for pre-wetting were obtained in the compositions shown in the following Tables 2, 4, 6, 8, 10, and 12 by the same method as in the chemical liquid A1 for a developer.

[Preparation of Chemical Liquid for Rinsing]
<Preparation of Chemical Liquids C1 to C44 for Rinsing>

Raw materials to be used and/or the number of times to pass the filter, and the like were appropriately adjusted, and chemical liquids C1 to C44 for rinsing were obtained in the compositions shown in the following Tables 2, 4, 6, 8, 10, and 12 by the same method as in the chemical liquid A1 for a developer.

[Preparation of Actinic Ray-Sensitive or Radiation-Sensitive Resin Composition]
<Preparation of Actinic Ray-Sensitive or Radiation-Sensitive Resin Compositions 1 to 4>

The following compositions were used as the actinic ray-sensitive or radiation-sensitive resin compositions. For the actinic ray-sensitive or radiation-sensitive resin composition, individual components were mixed and then filtered through a polyethylene filter having a pore size of 0.03 μm to prepare the composition.

Hereinafter, the actinic ray-sensitive or radiation-sensitive resin compositions 1 to 4 are respectively shown.

(Actinic Ray-Sensitive or Radiation-Sensitive Resin Composition 1)

Acid-decomposable resin (resin represented by the following formula (weight-average molecular weight (Mw): 7500): numerical value described in each repeating unit means mol %): 100 parts by mass

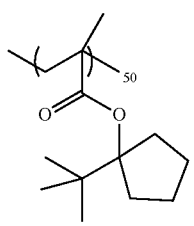 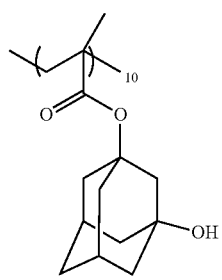

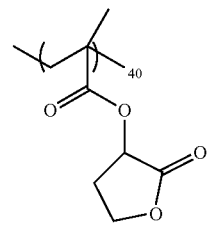

Photoacid generator shown below: 8 parts by mass

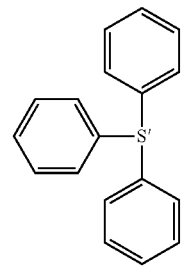

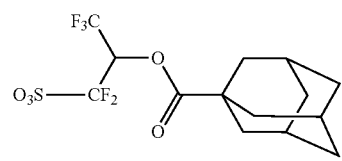

Quencher shown below: 5 parts by mass (the mass ratio was 0.1:0.3:0.3:0.2 in order from the left). Among the quenchers described below, those of the polymer type had a weight-average molecular weight (Mw) of 5000. In addition, the numerical value described in each repeating unit means a molar ratio.

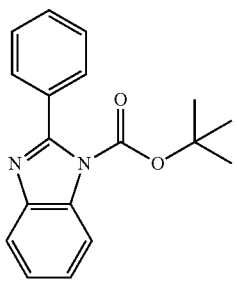 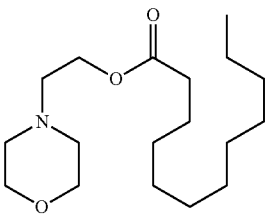

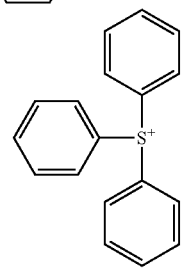 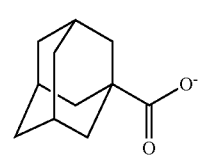

-continued

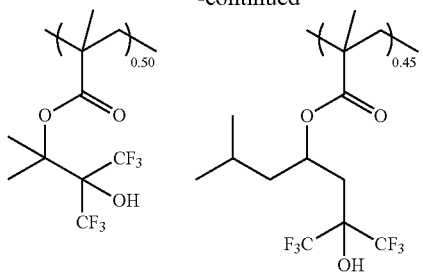

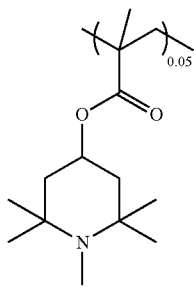

Hydrophobic resin shown below: 4 parts by mass (the mass ratio was 0.5:0.5 in order from the left.). Among the hydrophobic resins described below, the hydrophobic resin on the left side had a weight-average molecular weight (Mw) of 7000 and the hydrophobic resin on the right side had a weight-average molecular weight (Mw) of 8000. In each hydrophobic resin, the numerical value described in each repeating unit means a molar ratio.

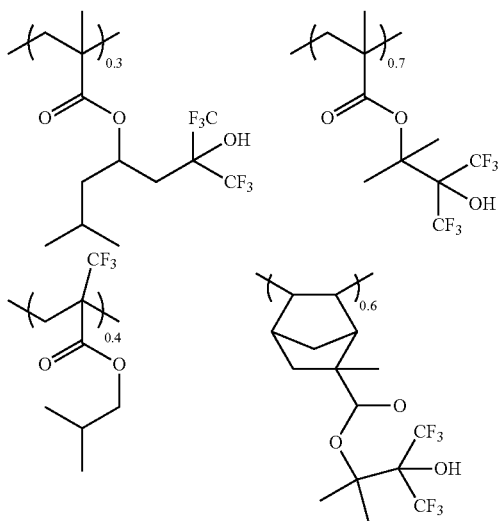

Solvent:
Propylene glycol monomethyl ether acetate (PGMEA): 3 parts by mass
Cyclohexanone: 600 parts by mass
γ-Butyrolactone (γ-BL): 100 parts by mass
(Actinic Ray-Sensitive or Radiation-Sensitive Resin Composition 2)
Acid-decomposable resin (resin represented by the following formula (weight-average molecular weight (Mw): 8000): numerical value described in each repeating unit means mol %): 100 parts by mass

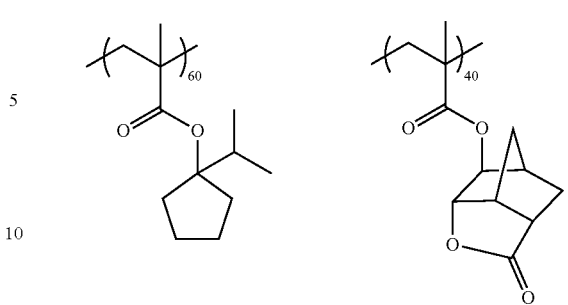

Photoacid generator shown below: 12 parts by mass (the mass ratio was 0.5:0.5 in order from the left.)

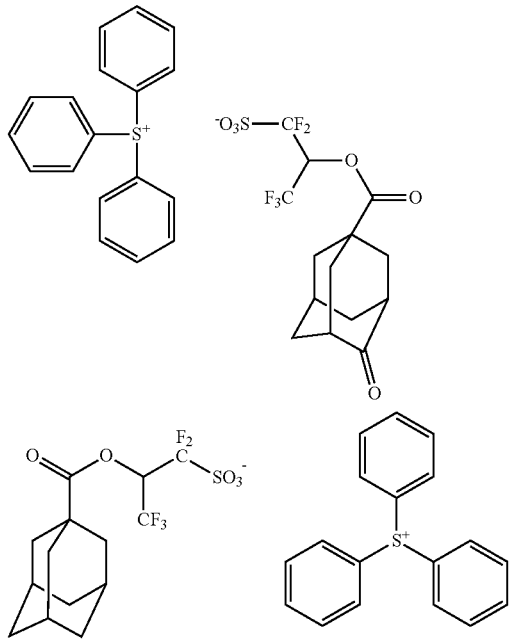

Quencher shown below: 5 parts by mass (the mass ratio was 0.3:0.7 in order from the left.)

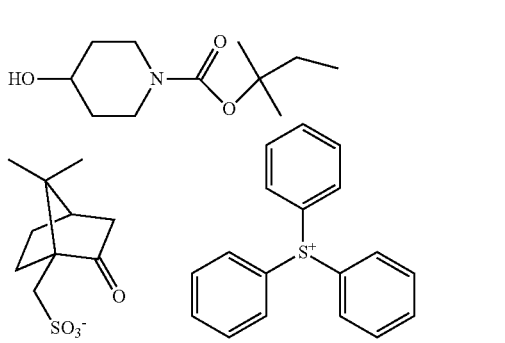

5 parts by mass of a hydrophobic resin shown below (the mass ratio was 0.8:0.2 in order from the upper side). Among the hydrophobic resins shown below, the weight-average molecular weight of the upper hydrophobic resin (Mw) was 8000, and the weight-average molecular weight (Mw) of the lower hydrophobic resin was 6000. In each hydrophobic resin, the numerical value described in each repeating unit means a molar ratio.

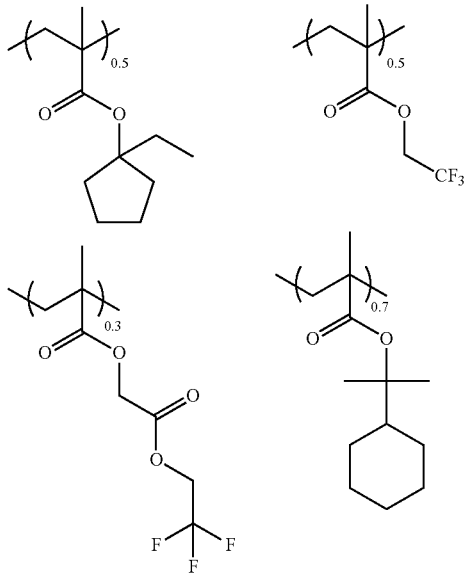

Solvent:

PGMEA (propylene glycol monomethyl ether acetate): 3 parts by mass

Cyclohexanone: 600 parts by mass

γ-BL (γ-butyrolactone): 100 parts by mass (Actinic Ray-Sensitive or Radiation-Sensitive Resin Composition 3)

Acid-decomposable resin (resin represented by the following formula (weight-average molecular weight (Mw): 8000): numerical value described in each repeating unit means mol %): 100 parts by mass

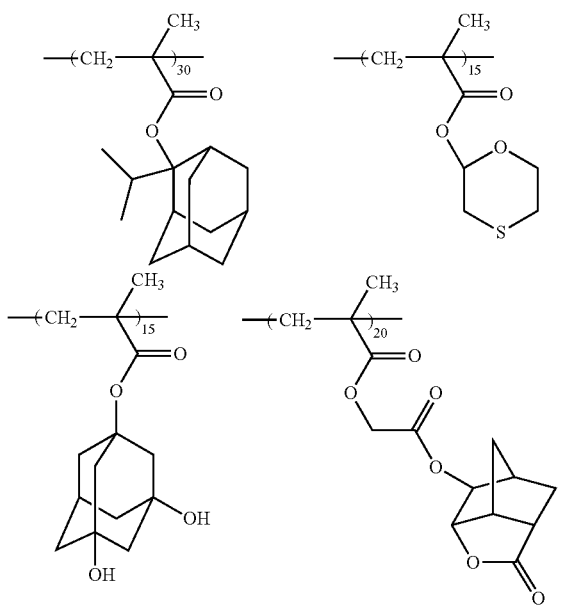

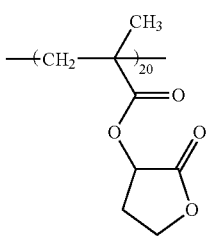

Photoacid generator shown below: 15 parts by mass

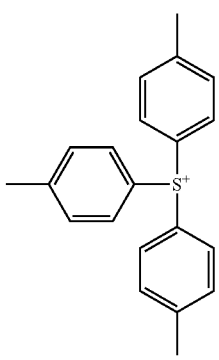

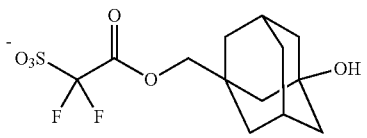

Quencher shown below: 7 parts by mass (the mass ratio was 1:1 in order from the left.)

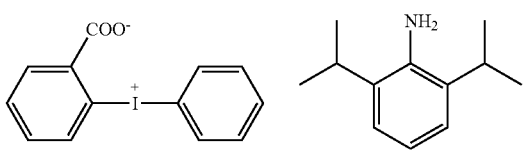

Hydrophobic resin shown below: 20 parts by mass (the mass ratio was 3:7 in order from the upper side.)

The weight-average molecular weight (Mw) of the upper hydrophobic resin among the following hydrophobic resins was 10,000, and the weight-average molecular weight (Mw) of the lower hydrophobic resin was 7,000. In the lower hydrophobic resin, the molar ratio of each repeating unit was 0.67 and 0.33 in order from the left.

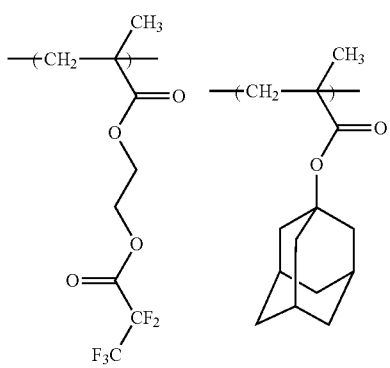
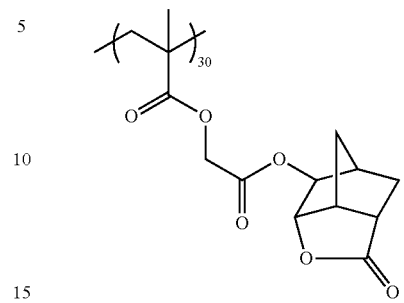

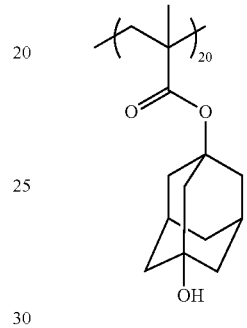

Solvent:

PGMEA (propylene glycol monomethyl ether acetate): 50 parts by mass

PGME (propylene glycol monomethyl ether): 100 parts by mass

2-Heptanone: 100 parts by mass

γ-BL (γ-butyrolactone): 500 parts by mass (Actinic Ray-Sensitive or Radiation-Sensitive Resin Composition 4)

Acid-decomposable resin (resin represented by the following formula (weight-average molecular weight (Mw): 6500): numerical value described in each repeating unit means mol %): 80 parts by mass

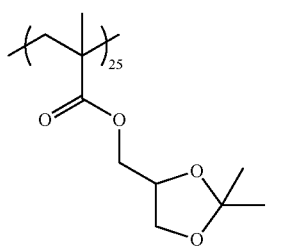

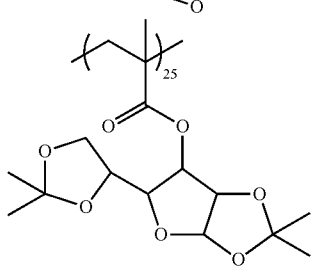

Photoacid generator shown below: 15 parts by mass

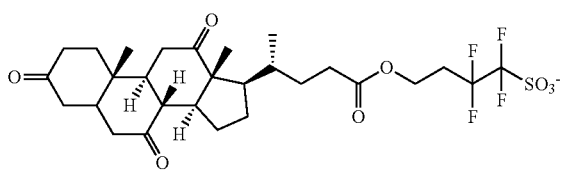

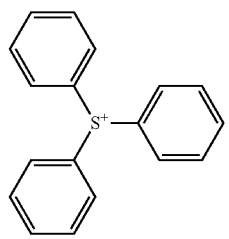

Quencher shown below: 5 parts by mass

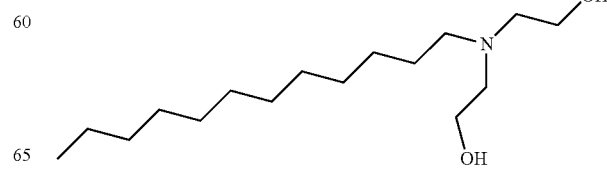

Hydrophobic resin (weight-average molecular weight (Mw): 5000) shown below: 60 parts by mass

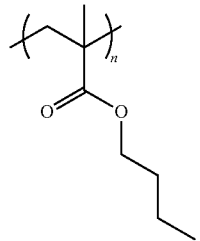

Solvent:
PGMEA (propylene glycol monomethyl ether acetate): 70 parts by mass
HBM (methyl-2-hydroxybutyrate): 100 parts by mass
Cyclohexanone: 700 parts by mass The weight-average molecular weight (Mw) of various resins contained in the actinic ray-sensitive or radiation-sensitive resin compositions 1 to 4 is a value in terms of polystyrene determined by a GPC method using tetrahydrofuran (THF) as a developing solvent.

A specific apparatus is as follows.
Apparatus: HLC-8120 (manufactured by Tosoh Corporation)
Column: TSK gel Multipore HXL-M (manufactured by Tosoh Corporation)

(Actinic Ray-Sensitive or Radiation-Sensitive Resin Composition 1A)

In addition, an actinic ray-sensitive or radiation-sensitive resin composition 1A was prepared in the same manner as in the actinic ray-sensitive or radiation-sensitive resin composition 1, except that the organic solvent was changed to a chemical liquid X1 (PGMEA: 3 parts by mass, cyclohexanone: 600 parts by mass, γ-BL: 100 parts by mass) shown in the following Table 13.

(Actinic Ray-Sensitive or Radiation-Sensitive Resin Composition 2A)

In addition, an actinic ray-sensitive or radiation-sensitive resin composition 2A was prepared in the same manner as in the actinic ray-sensitive or radiation-sensitive resin composition 2, except that the organic solvent was changed to a chemical liquid X2 (PGMEA: 3 parts by mass, cyclohexanone: 600 parts by mass, γ-BL: 100 parts by mass) shown in the following Table 13.

(Actinic Ray-Sensitive or Radiation-Sensitive Resin Composition 3A)

In addition, an actinic ray-sensitive or radiation-sensitive resin composition 3A was prepared in the same manner as in the actinic ray-sensitive or radiation-sensitive resin composition 3, except that the organic solvent was changed to a chemical liquid X3 (PGMEA: 50 parts by mass, PGME: 100 parts by mass, 2-heptanone: 100 parts by mass, γ-BL: 500 parts by mass) shown in the following Table 13.

(Actinic Ray-Sensitive or Radiation-Sensitive Resin Composition 4A)

In addition, an actinic ray-sensitive or radiation-sensitive resin composition 4A was prepared in the same manner as in the actinic ray-sensitive or radiation-sensitive resin composition 4, except that the organic solvent was changed to a chemical liquid X4 (PGMEA: 70 parts by mass, HBM: 100 parts by mass, cyclohexanone: 700 parts by mass) shown in the following Table 13.

[Evaluation]
<Evaluation of Resist by NTI Pattern Development>
<<Formation of Resist Pattern>>

A resist pattern was formed by the following operation.
(Preparation Step of Substrate)

An organic antireflection film forming composition ARC29SR (manufactured by Nissan Chemical Industries, Ltd.) was applied onto a silicon wafer and baked at 205° C. for 60 seconds to form an antireflection film having a film thickness of 78 nm.

(Pre-Wetting Step)

In order to improve coatability, a pre-wetting liquid (any one of chemical liquid for pre-wetting B1, . . . , or B136 described in the following Tables 2, 4, 6, 8, 10, and 12 was used, but in a case of being indicated as "-" in the table, the pre-wetting step was not carried out) was added dropwise onto the surface on the side of the antireflection film of the silicon wafer on which the antireflection film was formed and spin coating was then carried out.

(Resist Film Forming Step)

Next, the prepared actinic ray-sensitive or radiation-sensitive resin composition (any one of the actinic ray-sensitive or radiation-sensitive resin composition 1, 2, 3, 4, 1A, 2A, 3A, or 4A described in the following Tables 1, 3, 5, 7, 9, and 11 was used) was applied onto the antireflection film after the pre-wetting step and prebaked (PB) at 100° C. for 60 seconds to form a resist film having a film thickness of 150 nm.

(Exposing and Developing Step)

The obtained wafer was subjected to pattern-wise exposure with an ArF excimer laser scanner (NA 0.75) at 25 [mJ/cm$^2$]. This was followed by heating (PEB) at 120° C. for 60 seconds. Then, development was carried out by puddling for 30 seconds with a developer (any one of chemical liquid A1, . . . , or A140 for a developer described in the following Tables 1, 3, 5, 7, 9, and 11 was used). This was followed by cleaning by puddling with a rinsing liquid (any one of the chemical liquid C1, . . . , or C44 for rinsing described in the following Tables 1, 3, 5, 7, 9, and 11 was used, but in a case of being indicated as "-" in the table, the rinsing step was not carried out) for 30 seconds. Subsequently, the wafer was rotated at a rotation speed of 4000 rpm for 30 seconds to form a negative-tone resist pattern. Thereafter, the obtained negative-tone resist pattern was post-baked (POB) at 200° C. for 300 seconds. Through the above steps, an L/S pattern having line/space of 1:1 was obtained.

The evaluation of developability and defect suppression performance was carried out for each of the patterns of Examples 1 to 128 and Comparative Examples 1 to 12 obtained above. Evaluation methods are as follows.

<<Defect Suppression Performance>>

The number of defects on the pattern of the wafer on which the resist pattern was formed was measured using a pattern defect review apparatus (multipurpose SEM (Scanning Electron Microscope) "Inspago" RS6000 series, manufactured by Hitachi High-Technologies Corporation). The results were evaluated according to the following standards. The results are shown in Tables 1, 3, 5, 7, 9, and 11, respectively.

—Evaluation Standards—
AA: The number of defects was 30 or less.
A: The number of defects was more than 30 and 50 or less.
B: The number of defects was more than 50 and 100 or less.
C: The number of defects was more than 100 and 150 or less.

D: The number of defects was more than 150 and 200 or less.
E: The number of defects was more than 200.

<<Bridge Defect Suppression Performance>>

The number of defects on the pattern of the wafer on which the resist pattern was formed was measured using a pattern defect review apparatus (multipurpose SEM (Scanning Electron Microscope) "Inspago" RS6000 series, manufactured by Hitachi High-Technologies Corporation). The form of each defect was confirmed by SEM based on the coordinates of the defect. The results were evaluated according to the following standards. The results are shown in Tables 1, 3, 5, 7, 9, and 11, respectively.

—Evaluation Standards—
AA: The number of bridege defects was 5 or less.
A: The number of bridge defects was more than 5 and 10 or less.
B: The number of bridge defects was more than 10 and 20 or less.
C: The number of bridge defects was more than 20 and 50 or less.
D: The number of bridge defects was more than 50 and 100 or less.
E: The number of bridge defects was more than 100.

<<Developability>>

After pattern formation, the line pattern upper surface and the space portion were observed using a critical dimension scanning electron microscope (S9380II, manufactured by Hitachi, Ltd.). The developability was evaluated with the width of the line pattern that could be formed as a practically preferable shape without breaking the line pattern. A smaller value of the formed pattern dimension indicates the better performance. In the following evaluations, for example, in a case where L/S is less than 80 nm, it means that a pattern with each line and space width of less than 80 nm could be formed. The results are shown in Tables 1, 3, 5, 7, 9, and 11, respectively.

AA: L/S=less than 80 nm
A: L/S=80 nm or more and less than 120 nm
B: L/S=120 nm or more and less than 150 nm
C: L/S=150 nm or more and less than 200 nm
D: L/S=200 nm or more and less than 250 nm
E: L/S=250 nm or more In the table, the "resist composition" means an actinic ray-sensitive or radiation-sensitive resin composition.

In addition, the content of the organic solvent corresponds to an amount obtained by subtracting the total amount of organic impurities, water, and metal impurities from the total mass of the chemical liquid, and it was 98 mass % or more in any of the Examples.

In addition, the chemical liquid number of the pre-wetting liquid described in Table 1 corresponds to the chemical liquid number of the pre-wetting liquid described in Table 2. That is, for example, the pre-wetting liquid B1 described in Table 2 shows the composition of the pre-wetting liquid B1 described in Table 1 in detail. The same is true for the rinsing liquids described in Table 1. The same applies to Tables 3 to 12.

The "Others" in the column of "Metal atom content (mass ppt)" in the table represents the amount of metal atoms other than an Fe atom, a Cr atom, a Ni atom, and a Pb atom, specifically represents metal atoms such as Na, K, Ca, Cu, Mg, Mn, Li, Al, and Sn.

In addition, the "Content" in the column of "Organic impurities" in the table represents the total content of organic impurities. In addition, the "type of organic impurities other than alcohol impurities" contained in the chemical liquid is also described in the column of "Organic impurities".

In addition, the column of "Alcohol impurities" in the table represents the total content of alcohol impurities.

In addition, the notation "<A" in the table is intended to be less than A. For example, a case of "<0.1" is intended to be less than 0.1.

TABLE 1

| | | Composition of chemical liquid for developer | | | | | | | | |
|---|---|---|---|---|---|---|---|---|---|---|
| | | Pre-wetting liquid Chemical liquid number and solvent | | | | Organic impurities | | | | |
| | Type of resist composition | type of pre-wetting liquid (details of components are shown in Table 2) | Chemical liquid number | Organic solvent (remaining part) | Content (mass ppm) | Organic impurities other than alcohol impurities (type) | Alcohol impurities (mass ppm) | Water (mass %) | Content or metal atoms (mass ppt) | |
| | | | | | | | | | Fe | Cr |
| Example 1  | 1 | B1  | PGME  | A1  | nBA | 150 | DOP | 100 | 0.10% | 2  | 1 |
| Example 2  | 1 | B2  | PGEE  | A2  | nBA | 150 | DOP | 100 | 0.10% | 2  | 1 |
| Example 3  | 1 | B3  | PGPE  | A3  | nBA | 150 | DOP | 100 | 0.10% | 2  | 1 |
| Example 4  | 1 | B4  | EL    | A4  | nBA | 150 | DOP | 100 | 0.10% | 2  | 1 |
| Example 5  | 1 | B5  | CyPe  | A5  | nBA | 150 | DOP | 100 | 0.10% | 2  | 1 |
| Example 6  | 1 | B6  | CyHe  | A6  | nBA | 150 | DOP | 100 | 0.10% | 2  | 1 |
| Example 7  | 1 | B7  | PGMEA | A7  | nBA | 150 | DOP | 100 | 0.10% | 2  | 1 |
| Example 8  | 1 | —   | —     | A8  | nBA | 150 | DOP | 100 | 0.10% | 2  | 1 |
| Example 9  | 1 | B8  | CyHe  | A9  | nBA | 150 | DOP | 100 | 0.10% | 2  | 1 |
| Example 10 | 1 | B9  | CyHe  | A10 | nBA | 150 | DOP | 300 | 0.10% | 6  | 4 |
| Example 11 | 1 | B10 | CyHe  | A11 | nBA | 150 | DOP | 600 | 0.10% | 11 | 5 |
| Example 12 | 1 | B11 | CyHe  | A12 | nBA | 150 | DOP | 750 | 0.10% | 15 | 13 |
| Example 13 | 1 | B12 | CyHe  | A13 | nBA | 150 | DOP | 100 | 0.10% | 10 | 9 |
| Example 14 | 1 | B13 | CyHe  | A14 | nBA | 150 | DOP | 100 | 0.10% | 18 | 12 |
| Example 15 | 1 | B14 | CyHe  | A15 | nBA | 150 | DOP | 100 | 0.10% | 23 | 21 |
| Example 16 | 1 | B15 | CyHe  | A16 | nBA | 150 | DOP | 100 | 0.50% | 2  | 1 |

TABLE 1-continued

| | | | | | | | | | | | |
|---|---|---|---|---|---|---|---|---|---|---|---|
| Example 17 | 1 | B16 | CyHe | A17 | nBA | 150 | DOP | 100 | 1.50% | 2 | 1 |
| Example 18 | 1 | B17 | CyHe | A18 | nBA | 150 | DOP | 100 | 0.10% | 15 | 9 |
| Example 19 | 1 | B18 | CyHe | A19 | nBA | 150 | DOP | 100 | 0.10% | 41 | 35 |
| Example 20 | 1 | B19 | CyHe | A20 | nBA | 150 | DOP | 100 | 0.10% | 2 | 1 |
| Example 21 | 1 | B20 | CyHe | A21 | nBA | 150 | DOP | 100 | 0.10% | 2 | 1 |
| Example 22 | 1 | B21 | CyHe | A22 | MIBC | 200 | DOP | 60 | 0.10% | 3 | 1 |
| Example 23 | 1 | B22 | CyHe | A23 | 1-Hexanol | 300 | DOP | 210 | 0.10% | 4 | 2 |
| Example 24 | 1 | B23 | CyHe | A24 | 2-Heptanone | 350 | DOP | 170 | 0.10% | 2 | 3 |
| Example 25 | 1 | B24 | CyHe | A25 | Isoamyl acetate | 400 | DOP | 150 | 0.10% | 2 | 2 |
| Example 26 | 1 | B25 | CyHe | A26 | nBA | 150 | DOP | 100 | <0.01% | 2 | 1 |
| Example 27 | 1A | B26 | CyHe | A27 | nBA | 500 | DOP | 300 | 0.10% | 6 | 4 |

| | Composition of chemical liquid for developer | | | | Number of coarse particles (number of objects to be counted) | Rinsing liquid Chemical liquid number and solvent type of rinsing liquid (details of components are shown in Table 2) | Evaluation | | |
|---|---|---|---|---|---|---|---|---|---|
| | Content or metal atoms (mass ppt) | | | | | | Develop-ability | Defect suppression performance | Bridge defect suppression performance |
| | Ni | Pb | Others | Total | (objects to be counted/mL) | | | | |
| Example 1 | 3 | 1 | 16 | 23 | 6 | — — | B | A | A |
| Example 2 | 3 | 1 | 16 | 23 | 6 | — — | B | A | A |
| Example 3 | 3 | 1 | 16 | 23 | 6 | — — | B | A | A |
| Example 4 | 3 | 1 | 16 | 23 | 6 | — — | B | A | A |
| Example 5 | 3 | 1 | 16 | 23 | 6 | — — | A | A | A |
| Example 6 | 3 | 1 | 16 | 23 | 6 | — — | AA | AA | AA |
| Example 7 | 3 | 1 | 16 | 23 | 6 | — — | AA | AA | AA |
| Example 8 | 3 | 1 | 16 | 23 | 6 | — — | A | A | A |
| Example 9 | 3 | 1 | 16 | 23 | 6 | C1 MIBC | AA | AA | AA |
| Example 10 | 3 | 2 | 21 | 36 | 16 | — — | A | A | A |
| Example 11 | 6 | 4 | 31 | 57 | 28 | — — | B | B | B |
| Example 12 | 9 | 6 | 44 | 87 | 21 | — — | C | C | C |
| Example 13 | 6 | 5 | 18 | 48 | 14 | — — | A | A | A |
| Example 14 | 17 | 15 | 29 | 91 | 26 | — — | A | B | B |
| Example 15 | 25 | 18 | 45 | 132 | 32 | — — | A | B | B |
| Example 16 | 3 | 1 | 16 | 23 | 6 | — — | B | B | B |
| Example 17 | 3 | 1 | 16 | 23 | 6 | — — | C | C | C |
| Example 18 | 18 | 6 | 28 | 76 | 10 | — — | A | B | B |
| Example 19 | 47 | 24 | 72 | 219 | 21 | — — | A | C | C |
| Example 20 | 3 | 1 | 16 | 23 | 6 | C2 IPA | A | A | A |
| Example 21 | 3 | 1 | 16 | 23 | 6 | C3 PGMEA | A | A | A |
| Example 22 | 3 | 1 | 13 | 21 | 6 | — — | C | B | B |
| Example 23 | 2 | 2 | 14 | 24 | 7 | — — | B | B | B |
| Example 24 | 2 | 1 | 15 | 23 | 6 | — — | B | B | B |
| Example 25 | 3 | 1 | 16 | 24 | 5 | — — | B | B | B |
| Example 26 | 3 | 1 | 16 | 23 | 6 | — — | B | C | C |
| Example 27 | 3 | 2 | 21 | 36 | 16 | — — | A | AA | AA |

TABLE 2

| | Composition of chemical liquid for pre-wetting liquid | | | | | | | | | | | Number of coarse particles |
|---|---|---|---|---|---|---|---|---|---|---|---|---|
| | | Organic impurities | | | | | | | | | | (number of objects to be counted) (objects to be content/ |
| | Chemical liquid number | Organic solvent (remaining part) | Content (mass ppm) | Organic impurities other than alcohol impurities (type) | Alcohol impurities (mass ppm) | Water (mass %) | Content of metal atoms (mass ppt) | | | | | mL) |
| | | | | | | | Fe | Cr | Ni | Pb | Others | Total | |
| Example 1 | B1 | PGME | 200 | DOP | 150 | 0.10% | 2 | 1 | 4 | 1 | 21 | 29 | 9 |
| Example 2 | B2 | PGEE | 250 | DOP | 140 | 0.10% | 3 | 1 | 3 | 2 | 18 | 27 | 12 |
| Example 3 | B3 | POPE | 310 | DOP | 160 | 0.10% | 5 | 1 | 2 | 1 | 26 | 35 | 8 |
| Example 4 | B4 | EL | 280 | DOP | 150 | 0.10% | 4 | 2 | 3 | 1 | 25 | 35 | 7 |
| Example 5 | B5 | CyPe | 500 | DOP | 400 | 0.10% | 2 | 1 | 4 | 2 | 24 | 33 | 11 |
| Example 6 | B6 | CyHe | 210 | DOP | 150 | 0.10% | 4 | 2 | 3 | 3 | 31 | 43 | 10 |
| Example 7 | B7 | PGMEA | 200 | DOP | 100 | 0.10% | 3 | 3 | 2 | 1 | 22 | 31 | 15 |
| Example 8 | — | — | — | — | — | — | — | — | — | — | — | — | — |
| Example 9 | B8 | CyHe | 300 | DOP | 150 | 0.10% | 2 | 1 | 3 | 1 | 25 | 32 | 11 |
| Example 10 | B9 | CyHe | 300 | DOP | 150 | 0.10% | 2 | 1 | 3 | 1 | 25 | 32 | 11 |
| Example 11 | B10 | CyHe | 300 | DOP | 150 | 0.10% | 2 | 1 | 3 | 1 | 25 | 32 | 11 |
| Example 12 | B11 | CyHe | 300 | DOP | 150 | 0.10% | 2 | 1 | 3 | 1 | 25 | 32 | 11 |
| Example 13 | B12 | CyHe | 300 | DOP | 150 | 0.10% | 2 | 1 | 3 | 1 | 25 | 32 | 11 |
| Example 14 | B13 | CyHe | 300 | DOP | 150 | 0.10% | 2 | 1 | 3 | 1 | 25 | 32 | 11 |
| Example 15 | B14 | CyHe | 300 | DOP | 150 | 0.10% | 2 | 1 | 3 | 1 | 25 | 32 | 11 |
| Example 16 | B15 | CyHe | 300 | DOP | 150 | 0.10% | 2 | 1 | 3 | 1 | 25 | 32 | 11 |
| Example 17 | B16 | CyHe | 300 | DOP | 150 | 0.10% | 2 | 1 | 3 | 1 | 25 | 32 | 11 |
| Example 18 | B17 | CyHe | 300 | DOP | 150 | 0.10% | 2 | 1 | 3 | 1 | 25 | 32 | 11 |
| Example 19 | B18 | CyHe | 300 | DOP | 150 | 0.10% | 2 | 1 | 3 | 1 | 25 | 32 | 11 |
| Example 20 | B19 | CyHe | 300 | DOP | 150 | 0.10% | 2 | 1 | 3 | 1 | 25 | 32 | 11 |
| Example 21 | B20 | CyHe | 300 | DOP | 150 | 0.10% | 2 | 1 | 3 | 1 | 25 | 32 | 11 |
| Example 22 | B21 | CyHe | 300 | DOP | 150 | 0.10% | 2 | 1 | 3 | 1 | 25 | 32 | 11 |
| Example 23 | B22 | CyHe | 300 | DOP | 150 | 0.10% | 2 | 1 | 3 | 1 | 25 | 32 | 11 |
| Example 24 | B23 | CyHe | 300 | DOP | 150 | 0.10% | 2 | 1 | 3 | 1 | 25 | 32 | 11 |
| Example 25 | B24 | CyHe | 300 | DOP | 150 | 0.10% | 2 | 1 | 3 | 1 | 25 | 32 | 11 |
| Example 26 | B25 | CyHe | 300 | DOP | 150 | 0.10% | 2 | 1 | 3 | 1 | 25 | 32 | 11 |
| Example 27 | B26 | CyHe | 300 | DOP | 150 | 0.10% | 2 | 1 | 3 | 1 | 25 | 32 | 11 |
| | Composition of chemical liquid for rinsing liquid | | | | | | | | | | | Number of coarse particles |
| | | Organic impurities | | | | | | | | | | (number of objects to be counted) (objects to be content/ |
| | Chemical liquid number | Organic solvent type (remaining part) | Content (mass ppm) | Organic impurities other than alcohol impurities (type) | Alcohol impurities (mass ppm) | Water (mass %) | Content of metal atoms (mass ppt) | | | | | mL) |
| | | | | | | | Fe | Cr | Ni | Pb | Others | Total | |
| Example 1 | — | — | — | — | — | — | — | — | — | — | — | — | — |
| Example 2 | — | — | — | — | — | — | — | — | — | — | — | — | — |
| Example 3 | — | — | — | — | — | — | — | — | — | — | — | — | — |
| Example 4 | — | — | — | — | — | — | — | — | — | — | — | — | — |
| Example 5 | — | — | — | — | — | — | — | — | — | — | — | — | — |
| Example 6 | — | — | — | — | — | — | — | — | — | — | — | — | — |
| Example 7 | — | — | — | — | — | — | — | — | — | — | — | — | — |
| Example 8 | — | — | — | — | — | — | — | — | — | — | — | — | — |
| Example 9 | C1 | MIBC | 650 | DOP | 450 | 0.20% | 4 | 3 | 2 | 1 | 29 | 39 | 15 |
| Example 10 | — | — | — | — | — | — | — | — | — | — | — | — | — |
| Example 11 | — | — | — | — | — | — | — | — | — | — | — | — | — |
| Example 12 | — | — | — | — | — | — | — | — | — | — | — | — | — |
| Example 13 | — | — | — | — | — | — | — | — | — | — | — | — | — |
| Example 14 | — | — | — | — | — | — | — | — | — | — | — | — | — |
| Example 15 | — | — | — | — | — | — | — | — | — | — | — | — | — |
| Example 16 | — | — | — | — | — | — | — | — | — | — | — | — | — |

TABLE 2-continued

| Example | | | | | | | | | | | | | | |
|---|---|---|---|---|---|---|---|---|---|---|---|---|---|---|
| Example 17 | — | — | — | — | — | — | — | — | — | — | — | — | — | — |
| Example 18 | — | — | — | — | — | — | — | — | — | — | — | — | — | — |
| Example 19 | — | — | — | — | — | — | — | — | — | — | — | — | — | — |
| Example 20 | C2 | IPA | 650 | DOP | 500 | 0.10% | 4 | 5 | 6 | 1 | 31 | 47 | 11 | |
| Example 21 | C3 | PGMEA | 300 | DOP | 210 | 0.10% | 8 | 3 | 4 | 1 | 33 | 49 | 19 | |
| Example 22 | — | — | — | — | — | — | — | — | — | — | — | — | — | — |
| Example 23 | — | — | — | — | — | — | — | — | — | — | — | — | — | — |
| Example 24 | — | — | — | — | — | — | — | — | — | — | — | — | — | — |
| Example 25 | — | — | — | — | — | — | — | — | — | — | — | — | — | — |
| Example 26 | — | — | — | — | — | — | — | — | — | — | — | — | — | — |
| Example 27 | — | — | — | — | — | — | — | — | — | — | — | — | — | — |

TABLE 3

| | Type of resist composition | Pre-wetting liquid (details of components are shown in Table 4) | Chemical liquid number | Organic solvent (remaining part) | Content (mass ppm) | Organic impurities other than alcohol impurities (type) | Alcohol impurities (mass ppm) | Water (mass %) | Fe | Cr |
|---|---|---|---|---|---|---|---|---|---|---|
| Example 28 | 2 | B27 PGME | A28 | nBA | 150 | DOP | 100 | 0.10% | 2 | 1 |
| Example 29 | 2 | B28 PGEE | A29 | nBA | 150 | DOP | 100 | 0.10% | 2 | 1 |
| Example 30 | 2 | B29 PGPE | A30 | nBA | 150 | DOP | 100 | 0.10% | 2 | 1 |
| Example 31 | 2 | B30 EL | A31 | nBA | 150 | DOP | 100 | 0.10% | 2 | 1 |
| Example 32 | 2 | B31 CyPe | A32 | nBA | 150 | DOP | 100 | 0.10% | 2 | 1 |
| Example 33 | 2 | B32 CyHe | A33 | nBA | 150 | DOP | 100 | 0.10% | 2 | 1 |
| Example 34 | 2 | B33 PGMEA | A34 | nBA | 150 | DOP | 100 | 0.10% | 2 | 1 |
| Example 35 | 2 | — — | A35 | nBA | 150 | DOP | 100 | 0.10% | 2 | 1 |
| Example 36 | 2 | B34 CyHe | A36 | nBA | 150 | DOP | 100 | 0.10% | 2 | 1 |
| Example 37 | 2 | B35 CyHe | A37 | nBA | 500 | DOP | 300 | 0.10% | 6 | 4 |
| Example 38 | 2 | B36 CyHe | A38 | nBA | 800 | DOP | 600 | 0.10% | 11 | 5 |
| Example 39 | 2 | B37 CyHe | A39 | nBA | 900 | DOP | 750 | 0.10% | 15 | 13 |
| Example 40 | 2 | B38 CyHe | A40 | nBA | 150 | DOP | 100 | 0.10% | 10 | 9 |
| Example 41 | 2 | B39 CyHe | A41 | nBA | 150 | DOP | 100 | 0.10% | 18 | 12 |
| Example 42 | 2 | B40 CyHe | A42 | nBA | 150 | DOP | 100 | 0.10% | 23 | 21 |
| Example 43 | 2 | B41 CyHe | A43 | nBA | 150 | DOP | 100 | 0.50% | 2 | 1 |
| Example 44 | 2 | B42 CyHe | A44 | nBA | 150 | DOP | 100 | 1.50% | 2 | 1 |
| Example 45 | 2 | B43 CyHe | A45 | nBA | 150 | DOP | 100 | 0.10% | 15 | 9 |
| Example 46 | 2 | B44 CyHe | A46 | nBA | 150 | DOP | 100 | 0.10% | 41 | 35 |
| Example 47 | 2 | B45 CyHe | A47 | nBA | 150 | DOP | 100 | 0.10% | 2 | 1 |
| Example 48 | 2 | B46 CyHe | A48 | nBA | 150 | DOP | 100 | 0.10% | 2 | 1 |
| Example 49 | 2 | B47 CyHe | A49 | MIBC | 200 | DOP | 60 | 0.10% | 3 | 1 |
| Example 50 | 2 | B48 CyHe | A50 | 1-Hexanol | 300 | DOP | 210 | 0.10% | 4 | 2 |
| Example 51 | 2 | B49 CyHe | A51 | 2-Heptanone | 350 | DOP | 170 | 0.10% | 2 | 3 |
| Example 52 | 2 | B50 CyHe | A52 | Isoamyl acetate | 400 | DOP | 150 | 0.10% | 2 | 2 |
| Example 53 | 2 | B51 CyHe | A53 | nBA | 150 | DOP | 100 | <0.01% | 2 | 1 |
| Example 54 | 2A | B52 CyHe | A54 | nBA | 500 | DOP | 300 | 0.10% | 6 | 4 |
| Example 27 | 1A | B26 CyHe | A27 | nBA | 500 | DOP | 300 | 0.10% | 6 | 4 |

TABLE 3-continued

| | | Composition of chemical liquid for developer | | | | Rinsing | | Evaluation | | |
|---|---|---|---|---|---|---|---|---|---|---|
| | | Content or metal atoms (mass ppt) | | | | Number of coarse particles (number of objects to be counted) (objects to be counted/ mL) | liquid Chemical liquid number and solvent type of rinsing liquid (details of components are shown in Table 4) | Develop-ability | Defect suppression performance | Bridge defect suppression performance |
| | | Ni | Pb | Others | Total | | | | | |
| Example 28 | | 3 | 1 | 16 | 23 | 6 | — — | B | A | A |
| Example 29 | | 3 | 1 | 16 | 23 | 6 | — — | B | A | A |
| Example 30 | | 3 | 1 | 16 | 23 | 6 | — — | B | A | A |
| Example 31 | | 3 | 1 | 16 | 23 | 6 | — — | B | A | A |
| Example 32 | | 3 | 1 | 16 | 23 | 6 | — — | A | A | A |
| Example 33 | | 3 | 1 | 16 | 23 | 6 | — — | AA | AA | AA |
| Example 34 | | 3 | 1 | 16 | 23 | 6 | — — | AA | AA | AA |
| Example 35 | | 3 | 1 | 16 | 23 | 6 | — — | A | A | A |
| Example 36 | | 3 | 1 | 16 | 23 | 6 | C4 MIBC | AA | AA | AA |
| Example 37 | | 3 | 2 | 21 | 36 | 16 | — — | A | A | A |
| Example 38 | | 6 | 4 | 31 | 57 | 28 | — — | B | B | B |
| Example 39 | | 9 | 6 | 44 | 87 | 21 | — — | C | C | C |
| Example 40 | | 6 | 5 | 18 | 48 | 14 | — — | A | A | A |
| Example 41 | | 17 | 15 | 29 | 91 | 26 | — — | A | B | B |
| Example 42 | | 25 | 18 | 45 | 132 | 32 | — — | A | B | B |
| Example 43 | | 3 | 1 | 16 | 23 | 6 | — — | B | B | B |
| Example 44 | | 3 | 1 | 16 | 23 | 6 | — — | C | C | C |
| Example 45 | | 18 | 6 | 28 | 76 | 10 | — — | A | B | B |
| Example 46 | | 47 | 24 | 72 | 219 | 21 | — — | A | C | C |
| Example 47 | | 3 | 1 | 16 | 23 | 6 | C5 IPA | A | A | A |
| Example 48 | | 3 | 1 | 16 | 23 | 6 | C6 PGMEA | A | A | A |
| Example 49 | | 3 | 1 | 13 | 21 | 6 | — — | C | C | B |
| Example 50 | | 2 | 2 | 14 | 24 | 7 | — — | B | B | B |
| Example 51 | | 2 | 1 | 15 | 23 | 6 | — — | B | B | B |
| Example 52 | | 3 | 1 | 16 | 24 | 5 | — — | B | B | B |
| Example 53 | | 3 | 1 | 16 | 23 | 6 | — — | B | C | C |
| Example 54 | | 3 | 2 | 21 | 36 | 16 | — — | A | AA | AA |

TABLE 4

| | | Composition of chemical liquid for pre-wetting liquid | | | | | | | | | | | |
|---|---|---|---|---|---|---|---|---|---|---|---|---|---|
| | | | | Organic impurities | | | | | | | | | |
| | Chemical liquid number | Organic solvent (remaining part) | Content (mass ppm) | Organic impurities other than alcohol impurities (type) | Alcohol impurities (mass ppm) | Water (mass %) | Content of metal atoms (mass ppt) | | | | | | Number of coarse particles (number of objects to be counted) (objects to be counted/mL) |
| | | | | | | | Fe | Cr | Ni | Pb | Others | Total | |
| Example 28 | B27 | PGME | 200 | DOP | 150 | 0.10% | 2 | 1 | 4 | 1 | 21 | 29 | 9 |
| Example 29 | B28 | PGEE | 250 | DOP | 140 | 0.10% | 3 | 1 | 3 | 2 | 18 | 27 | 12 |
| Example 30 | B29 | PGPE | 310 | DOP | 160 | 0.10% | 5 | 1 | 2 | 1 | 26 | 35 | 8 |
| Example 31 | B30 | EL | 280 | DOP | 150 | 0.10% | 4 | 2 | 3 | 1 | 25 | 35 | 7 |
| Example 32 | B31 | CyPe | 500 | DOP | 400 | 0.10% | 2 | 1 | 4 | 2 | 24 | 33 | 11 |
| Example 33 | B32 | CyHe | 210 | DOP | 150 | 0.10% | 4 | 2 | 3 | 3 | 31 | 43 | 10 |
| Example 34 | B33 | PGMEA | 200 | DOP | 100 | 0.10% | 3 | 3 | 2 | 1 | 22 | 31 | 15 |
| Example 35 | — | — | — | — | — | — | — | — | — | — | — | — | — |
| Example 36 | B34 | CyHe | 300 | DOP | 150 | 0.10% | 2 | 1 | 3 | 1 | 25 | 32 | 11 |
| Example 37 | B35 | CyHe | 300 | DOP | 150 | 0.10% | 2 | 1 | 3 | 1 | 25 | 32 | 11 |
| Example 38 | B36 | CyHe | 300 | DOP | 150 | 0.10% | 2 | 1 | 3 | 1 | 25 | 32 | 11 |
| Example 39 | B37 | CyHe | 300 | DOP | 150 | 0.10% | 2 | 1 | 3 | 1 | 25 | 32 | 11 |
| Example 40 | B38 | CyHe | 300 | DOP | 150 | 0.10% | 2 | 1 | 3 | 1 | 25 | 32 | 11 |
| Example 41 | B39 | CyHe | 300 | DOP | 150 | 0.10% | 2 | 1 | 3 | 1 | 25 | 32 | 11 |
| Example 42 | B40 | CyHe | 300 | DOP | 150 | 0.10% | 2 | 1 | 3 | 1 | 25 | 32 | 11 |
| Example 43 | B41 | CyHe | 300 | DOP | 150 | 0.10% | 2 | 1 | 3 | 1 | 25 | 32 | 11 |
| Example 44 | B42 | CyHe | 300 | DOP | 150 | 0.10% | 2 | 1 | 3 | 1 | 25 | 32 | 11 |

TABLE 4-continued

| | | | | | | | | | | | | | |
|---|---|---|---|---|---|---|---|---|---|---|---|---|---|
| Example 45 | B43 | CyHe | 300 | DOP | 150 | 0.10% | 2 | 1 | 3 | 1 | 25 | 32 | 11 |
| Example 46 | B44 | CyHe | 300 | DOP | 150 | 0.10% | 2 | 1 | 3 | 1 | 25 | 32 | 11 |
| Example 47 | B45 | CyHe | 300 | DOP | 150 | 0.10% | 2 | 1 | 3 | 1 | 25 | 32 | 11 |
| Example 48 | B46 | CyHe | 300 | DOP | 150 | 0.10% | 2 | 1 | 3 | 1 | 25 | 32 | 11 |
| Example 49 | B47 | CyHe | 300 | DOP | 150 | 0.10% | 2 | 1 | 3 | 1 | 25 | 32 | 11 |
| Example 50 | B48 | CyHe | 300 | DOP | 150 | 0.10% | 2 | 1 | 3 | 1 | 25 | 32 | 11 |
| Example 51 | B49 | CyHe | 300 | DOP | 150 | 0.10% | 2 | 1 | 3 | 1 | 25 | 32 | 11 |
| Example 52 | B50 | CyHe | 300 | DOP | 150 | 0.10% | 2 | 1 | 3 | 1 | 25 | 32 | 11 |
| Example 53 | B51 | CyHe | 300 | DOP | 150 | 0.10% | 2 | 1 | 3 | 1 | 25 | 32 | 11 |
| Example 54 | B52 | CyHe | 300 | DOP | 150 | 0.10% | 2 | 1 | 3 | 1 | 25 | 32 | 11 |

Composition of chemical liquid for rinsing liquid

| | Chemical liquid number | Organic solvent type (remaining part) | Content (mass ppm) | Organic impurities other than alcohol impurities (type) | Alcohol impurities (mass ppm) | Water (mass %) | Fe | Cr | Ni | Pb | Others | Total | Number of coarse particles (number of objects to be counted) (objects to be counted/mL) |
|---|---|---|---|---|---|---|---|---|---|---|---|---|---|
| Example 28 | — | — | — | — | — | — | — | — | — | — | — | — | — |
| Example 29 | — | — | — | — | — | — | — | — | — | — | — | — | — |
| Example 30 | — | — | — | — | — | — | — | — | — | — | — | — | — |
| Example 31 | — | — | — | — | — | — | — | — | — | — | — | — | — |
| Example 32 | — | — | — | — | — | — | — | — | — | — | — | — | — |
| Example 33 | — | — | — | — | — | — | — | — | — | — | — | — | — |
| Example 34 | — | — | — | — | — | — | — | — | — | — | — | — | — |
| Example 35 | — | — | — | — | — | — | — | — | — | — | — | — | — |
| Example 36 | C4 | MIBC | 650 | DOP | 450 | 0.20% | 4 | 3 | 2 | 1 | 29 | 39 | 15 |
| Example 37 | — | — | — | — | — | — | — | — | — | — | — | — | — |
| Example 38 | — | — | — | — | — | — | — | — | — | — | — | — | — |
| Example 39 | — | — | — | — | — | — | — | — | — | — | — | — | — |
| Example 40 | — | — | — | — | — | — | — | — | — | — | — | — | — |
| Example 41 | — | — | — | — | — | — | — | — | — | — | — | — | — |
| Example 42 | — | — | — | — | — | — | — | — | — | — | — | — | — |
| Example 43 | — | — | — | — | — | — | — | — | — | — | — | — | — |
| Example 44 | — | — | — | — | — | — | — | — | — | — | — | — | — |
| Example 45 | — | — | — | — | — | — | — | — | — | — | — | — | — |
| Example 46 | — | — | — | — | — | — | — | — | — | — | — | — | — |
| Example 47 | C5 | IPA | 650 | DOP | 500 | 0.10% | 4 | 5 | 6 | 1 | 31 | 47 | 11 |
| Example 48 | C6 | PGMEA | 300 | DOP | 210 | 0.10% | 8 | 3 | 4 | 1 | 33 | 49 | 19 |
| Example 49 | — | — | — | — | — | — | — | — | — | — | — | — | — |
| Example 50 | — | — | — | — | — | — | — | — | — | — | — | — | — |
| Example 51 | — | — | — | — | — | — | — | — | — | — | — | — | — |
| Example 52 | — | — | — | — | — | — | — | — | — | — | — | — | — |
| Example 53 | — | — | — | — | — | — | — | — | — | — | — | — | — |
| Example 54 | — | — | — | — | — | — | — | — | — | — | — | — | — |

TABLE 5

| | Type of resist composition | Pre-wetting liquid Chemical liquid number and solvent type of pre-wetting liquid (details of components are shown in Table 6) | Chemical liquid number | Organic solvent (remaining part) | Content (mass ppm) | Organic impurities other than alcohol impurities (type) | Alcohol impurities (mass ppm) | Water (mass %) | Fe | Cr |
|---|---|---|---|---|---|---|---|---|---|---|
| Example 55 | 3 | B53 PGME | A55 | nBA | 150 | DOP | 100 | 0.10% | 2 | 1 |
| Example 56 | 3 | B54 PGEE | A56 | nBA | 150 | DOP | 100 | 0.10% | 2 | 1 |
| Example 57 | 3 | B55 POPE | A57 | nBA | 150 | DOP | 100 | 0.10% | 2 | 1 |
| Example 58 | 3 | B56 EL | A58 | nBA | 150 | DOP | 100 | 0.10% | 2 | 1 |
| Example 59 | 3 | B57 CyPe | A59 | nBA | 150 | DOP | 100 | 0.10% | 2 | 1 |
| Example 60 | 3 | B58 CyHe | A60 | nBA | 150 | DOP | 100 | 0.10% | 2 | 1 |

TABLE 5-continued

| | | | | | | | | | | | |
|---|---|---|---|---|---|---|---|---|---|---|---|
| Example 61 | 3 | B59 | PGMEA | A61 | nBA | 150 | DOP | 100 | 0.10% | 2 | 1 |
| Example 62 | 3 | — | — | A62 | nBA | 150 | DOP | 100 | 0.10% | 2 | 1 |
| Example 63 | 3 | B60 | CyHe | A63 | nBA | 150 | DOP | 100 | 0.10% | 2 | 1 |
| Example 64 | 3 | B61 | CyHe | A64 | nBA | 500 | DOP | 300 | 0.10% | 6 | 4 |
| Example 65 | 3 | B62 | CyHe | A65 | nBA | 800 | DOP | 600 | 0.10% | 11 | 5 |
| Example 66 | 3 | B63 | CyHe | A66 | nBA | 900 | DOP | 750 | 0.10% | 15 | 13 |
| Example 67 | 3 | B64 | CyHe | A67 | nBA | 150 | DOP | 100 | 0.10% | 10 | 9 |
| Example 68 | 3 | B65 | CyHe | A68 | nBA | 150 | DOP | 100 | 0.10% | 18 | 12 |
| Example 69 | 3 | B66 | CyHe | A69 | nBA | 150 | DOP | 100 | 0.10% | 23 | 21 |
| Example 70 | 3 | B67 | CyHe | A70 | nBA | 150 | DOP | 100 | 0.50% | 2 | 1 |
| Example 71 | 3 | B68 | CyHe | A71 | nBA | 150 | DOP | 100 | 1.50% | 2 | 1 |
| Example 72 | 3 | B69 | CyHe | A72 | nBA | 150 | DOP | 100 | 0.10% | 15 | 9 |
| Example 73 | 3 | B70 | CyHe | A73 | nBA | 150 | DOP | 100 | 0.10% | 41 | 35 |
| Example 74 | 3 | B71 | CyHe | A74 | nBA | 150 | DOP | 100 | 0.10% | 2 | 1 |
| Example 75 | 3 | B72 | CyHe | A75 | nBA | 150 | DOP | 100 | 0.10% | 2 | 1 |
| Example 76 | 3 | B73 | CyHe | A76 | MIBC | 200 | DOP | 60 | 0.10% | 3 | 1 |
| Example 77 | 3 | B | CyHe | A77 | 1-Hexanol | 300 | DOP | 210 | 0.10% | 4 | 2 |
| Example 78 | 3 | B | CyHe | A78 | 2-Heptanone | 350 | DOP | 170 | 0.10% | 2 | 3 |
| Example 79 | 3 | B | CyHe | A79 | Isoamyl acetate | 400 | DOP | 150 | 0.10% | 2 | 2 |
| Example 80 | 3 | B | CyHe | A80 | nBA | 150 | DOP | 100 | <0.01% | 2 | 1 |
| Example 81 | 3A | B | CyHe | A81 | nBA | 500 | DOP | 300 | 0.10% | 6 | 4 |

| | Composition of chemical liquid for developer | | | | Rinsing liquid | | Evaluation | | |
|---|---|---|---|---|---|---|---|---|---|
| | Content of metal atoms (mass ppt) | | | | Number of coarse particles (number of objects to be counted) (objects to be counted/mL) | Chemical liquid number and solvent type of rinsing liquid (details of components are shown in Table 6) | Develop-ability | Defect suppression performance | Bridge defect suppression performance |
| | Ni | Pb | Others | Total | | | | | |
| Example 55 | 3 | 1 | 16 | 23 | 6 | — | — | B | A | A |
| Example 56 | 3 | 1 | 16 | 23 | 6 | — | — | B | A | A |
| Example 57 | 3 | 1 | 16 | 23 | 6 | — | — | B | A | A |
| Example 58 | 3 | 1 | 16 | 23 | 6 | — | — | B | A | A |
| Example 59 | 3 | 1 | 16 | 23 | 6 | — | — | A | A | A |
| Example 60 | 3 | 1 | 16 | 23 | 6 | — | — | AA | AA | AA |
| Example 61 | 3 | 1 | 16 | 23 | 6 | — | — | AA | AA | AA |
| Example 62 | 3 | 1 | 16 | 23 | 6 | — | — | A | A | A |
| Example 63 | 3 | 1 | 16 | 23 | 6 | C7 | MIBC | AA | AA | AA |
| Example 64 | 3 | 2 | 21 | 36 | 16 | — | — | A | A | A |
| Example 65 | 6 | 4 | 31 | 57 | 28 | — | — | B | B | B |
| Example 66 | 9 | 6 | 44 | 87 | 21 | — | — | C | C | C |
| Example 67 | 6 | 5 | 18 | 48 | 14 | — | — | A | A | A |
| Example 68 | 17 | 15 | 29 | 91 | 26 | — | — | A | B | B |
| Example 69 | 25 | 18 | 45 | 132 | 32 | — | — | A | B | B |
| Example 70 | 3 | 1 | 16 | 23 | 6 | — | — | B | B | B |
| Example 71 | 3 | 1 | 16 | 23 | 6 | — | — | C | C | C |
| Example 72 | 18 | 6 | 28 | 76 | 10 | — | — | A | B | B |
| Example 73 | 47 | 24 | 72 | 219 | 21 | — | — | A | C | C |
| Example 74 | 3 | 1 | 16 | 23 | 6 | C8 | IPA | A | A | A |
| Example 75 | 3 | 1 | 16 | 23 | 6 | C9 | PGMEA | A | A | A |
| Example 76 | 3 | 1 | 13 | 21 | 6 | — | — | C | B | B |
| Example 77 | 2 | 2 | 14 | 24 | 7 | — | — | B | B | B |
| Example 78 | 2 | 1 | 15 | 23 | 6 | — | — | B | B | B |
| Example 79 | 3 | 1 | 16 | 24 | 5 | — | — | B | B | B |
| Example 80 | 3 | 1 | 16 | 23 | 6 | — | — | B | C | C |
| Example 81 | 3 | 2 | 21 | 36 | 16 | — | — | A | AA | AA |

TABLE 6

Composition of chemical liquid for pre-wetting liquid

| | Chemical liquid number | Organic solvent (remaining part) | Organic impurities Content (mass ppm) | Organic impurities other than alcohol impurities (type) | Alcohol impurities (mass ppm) | Water (mass %) | Content of metal atoms (mass ppt) | | | | | | Number of coarse particles (number of objects to be counted) (objects to be counted/mL) |
|---|---|---|---|---|---|---|---|---|---|---|---|---|---|
| | | | | | | | Fe | Cr | Ni | Pb | Others | Total | |
| Example 55 | B53 | PGME | 200 | DOP | 150 | 0.10% | 2 | 1 | 4 | 1 | 21 | 29 | 9 |
| Example 56 | B54 | PGEE | 250 | DOP | 140 | 0.10% | 3 | 1 | 3 | 2 | 18 | 27 | 12 |
| Example 57 | B55 | POPE | 310 | DOP | 160 | 0.10% | 5 | 1 | 2 | 1 | 26 | 35 | 8 |
| Example 58 | B56 | EL | 280 | DOP | 150 | 0.10% | 4 | 2 | 3 | 1 | 25 | 35 | 7 |
| Example 59 | B57 | CyPe | 500 | DOP | 400 | 0.10% | 2 | 1 | 4 | 2 | 24 | 33 | 11 |
| Example 60 | B58 | CyHe | 210 | DOP | 150 | 0.10% | 4 | 2 | 3 | 3 | 31 | 43 | 10 |
| Example 61 | B59 | PGMEA | 200 | DOP | 100 | 0.10% | 3 | 3 | 2 | 1 | 22 | 31 | 15 |
| Example 62 | — | — | — | — | — | — | — | — | — | — | — | — | — |
| Example 63 | B60 | CyHe | 300 | DOP | 150 | 0.10% | 2 | 1 | 3 | 1 | 25 | 32 | 11 |
| Example 64 | B61 | CyHe | 300 | DOP | 150 | 0.10% | 2 | 1 | 3 | 1 | 25 | 32 | 11 |
| Example 65 | B62 | CyHe | 300 | DOP | 150 | 0.10% | 2 | 1 | 3 | 1 | 25 | 32 | 11 |
| Example 66 | B63 | CyHe | 300 | DOP | 150 | 0.10% | 2 | 1 | 3 | 1 | 25 | 32 | 11 |
| Example 67 | B64 | CyHe | 300 | DOP | 150 | 0.10% | 2 | 1 | 3 | 1 | 25 | 32 | 11 |
| Example 68 | B65 | CyHe | 300 | DOP | 150 | 0.10% | 2 | 1 | 3 | 1 | 25 | 32 | 11 |
| Example 69 | B66 | CyHe | 300 | DOP | 150 | 0.10% | 2 | 1 | 3 | 1 | 25 | 32 | 11 |
| Example 70 | B67 | CyHe | 300 | DOP | 150 | 0.10% | 2 | 1 | 3 | 1 | 25 | 32 | 11 |
| Example 71 | B68 | CyHe | 300 | DOP | 150 | 0.10% | 2 | 1 | 3 | 1 | 25 | 32 | 11 |
| Example 72 | B69 | CyHe | 300 | DOP | 150 | 0.10% | 2 | 1 | 3 | 1 | 25 | 32 | 11 |
| Example 73 | B70 | CyHe | 300 | DOP | 150 | 0.10% | 2 | 1 | 3 | 1 | 25 | 32 | 11 |
| Example 74 | B71 | CyHe | 300 | DOP | 150 | 0.10% | 2 | 1 | 3 | 1 | 25 | 32 | 11 |
| Example 75 | B72 | CyHe | 300 | DOP | 150 | 0.10% | 2 | 1 | 3 | 1 | 25 | 32 | 11 |
| Example 76 | B73 | CyHe | 300 | DOP | 150 | 0.10% | 2 | 1 | 3 | 1 | 25 | 32 | 11 |
| Example 77 | B74 | CyHe | 300 | DOP | 150 | 0.10% | 2 | 1 | 3 | 1 | 25 | 32 | 11 |
| Example 78 | B75 | CyHe | 300 | DOP | 150 | 0.10% | 2 | 1 | 3 | 1 | 25 | 32 | 11 |
| Example 79 | B76 | CyHe | 300 | DOP | 150 | 0.10% | 2 | 1 | 3 | 1 | 25 | 32 | 11 |
| Example 80 | B77 | CyHe | 300 | DOP | 150 | 0.10% | 2 | 1 | 3 | 1 | 25 | 32 | 11 |
| Example 81 | B78 | CyHe | 300 | DOP | 150 | 0.10% | 2 | 1 | 3 | 1 | 25 | 32 | 11 |

Composition of chemical liquid for rinsing liquid

| | Chemical liquid number | Organic solvent (remaining part) | Organic impurities Content (mass ppm) | Organic impurities other than alcohol impurities (type) | Alcohol impurities (mass ppm) | Water (mass %) | Content of metal atoms (mass ppt) | | | | | | Number of coarse particles (number of objects to be counted) (objects to be counted/mL) |
|---|---|---|---|---|---|---|---|---|---|---|---|---|---|
| | | | | | | | Fe | Cr | Ni | Pb | Others | Total | |
| Example 55 | — | — | — | — | — | — | — | — | — | — | — | — | — |
| Example 56 | — | — | — | — | — | — | — | — | — | — | — | — | — |
| Example 57 | — | — | — | — | — | — | — | — | — | — | — | — | — |
| Example 58 | — | — | — | — | — | — | — | — | — | — | — | — | — |
| Example 59 | — | — | — | — | — | — | — | — | — | — | — | — | — |
| Example 60 | — | — | — | — | — | — | — | — | — | — | — | — | — |
| Example 61 | — | — | — | — | — | — | — | — | — | — | — | — | — |
| Example 62 | — | — | — | — | — | — | — | — | — | — | — | — | — |
| Example 63 | C7 | MIBC | 650 | DOP | 450 | 0.20% | 4 | 3 | 2 | 1 | 29 | 39 | 15 |
| Example 64 | — | — | — | — | — | — | — | — | — | — | — | — | — |
| Example 65 | — | — | — | — | — | — | — | — | — | — | — | — | — |
| Example 66 | — | — | — | — | — | — | — | — | — | — | — | — | — |
| Example 67 | — | — | — | — | — | — | — | — | — | — | — | — | — |
| Example 68 | — | — | — | — | — | — | — | — | — | — | — | — | — |
| Example 69 | — | — | — | — | — | — | — | — | — | — | — | — | — |
| Example 70 | — | — | — | — | — | — | — | — | — | — | — | — | — |
| Example 71 | — | — | — | — | — | — | — | — | — | — | — | — | — |
| Example 72 | — | — | — | — | — | — | — | — | — | — | — | — | — |
| Example 73 | — | — | — | — | — | — | — | — | — | — | — | — | — |
| Example 74 | C8 | IPA | 650 | DOP | 500 | 0.10% | 4 | 5 | 6 | 1 | 31 | 47 | 11 |
| Example 75 | C9 | PGMEA | 300 | DOP | 210 | 0.10% | 8 | 3 | 4 | 1 | 33 | 49 | 19 |
| Example 76 | — | — | — | — | — | — | — | — | — | — | — | — | — |
| Example 77 | — | — | — | — | — | — | — | — | — | — | — | — | — |
| Example 78 | — | — | — | — | — | — | — | — | — | — | — | — | — |

TABLE 6-continued

| | | | | | | | | | | |
|---|---|---|---|---|---|---|---|---|---|---|
| Example 79 | — | — | — | — | — | — | — — — — | — | — | — |
| Example 80 | — | — | — | — | — | — | — — — — | — | — | — |
| Example 81 | — | — | — | — | — | — | — — — — | — | — | — |

TABLE 7

| | Type of resist composition | Pre-wetting liquid Chemical liquid number and solvent type of pre-wetting liquid (details of components are shown in Table 8) | Chemical liquid number | Organic solvent (remaining part) | Content (mass ppm) | Organic impurities other than alcohol impurities (type) | Alcohol impurities (mass ppm) | Water (mass %) | Content of metal atoms (mass ppt) Fe | Cr |
|---|---|---|---|---|---|---|---|---|---|---|
| Example 82 | 4 | B79 PGME | A82 | nBA | 150 | DOP | 100 | 0.10% | 2 | 1 |
| Example 83 | 4 | B80 PGEE | A83 | nBA | 150 | DOP | 100 | 0.10% | 2 | 1 |
| Example 84 | 4 | B81 POPE | A84 | nBA | 150 | DOP | 100 | 0.10% | 2 | 1 |
| Example 85 | 4 | B82 EL | A85 | nBA | 150 | DOP | 100 | 0.10% | 2 | 1 |
| Example 86 | 4 | B83 CyPe | A86 | nBA | 150 | DOP | 100 | 0.10% | 2 | 1 |
| Example 87 | 4 | B84 CyHe | A87 | nBA | 150 | DOP | 100 | 0.10% | 2 | 1 |
| Example 88 | 4 | B85 PGMEA | A88 | nBA | 150 | DOP | 100 | 0.10% | 2 | 1 |
| Example 89 | 4 | — — | A89 | nBA | 150 | DOP | 100 | 0.10% | 2 | 1 |
| Example 90 | 4 | B86 CyHe | A90 | nBA | 150 | DOP | 100 | 0.10% | 2 | 1 |
| Example 91 | 4 | B87 CyHe | A91 | nBA | 500 | DOP | 300 | 0.10% | 6 | 4 |
| Example 92 | 4 | B88 CyHe | A92 | nBA | 800 | DOP | 600 | 0.10% | 11 | 5 |
| Example 93 | 4 | B89 CyHe | A93 | nBA | 900 | DOP | 750 | 0.10% | 15 | 13 |
| Example 94 | 4 | B90 CyHe | A94 | nBA | 150 | DOP | 100 | 0.10% | 10 | 9 |
| Example 95 | 4 | B91 CyHe | A95 | nBA | 150 | DOP | 100 | 0.10% | 18 | 12 |
| Example 96 | 4 | B92 CyHe | A96 | nBA | 150 | DOP | 100 | 0.10% | 23 | 21 |
| Example 97 | 4 | B93 CyHe | A97 | nBA | 150 | DOP | 100 | 0.50% | 2 | 1 |
| Example 98 | 4 | B94 CyHe | A98 | nBA | 150 | DOP | 100 | 1.50% | 2 | 1 |
| Example 99 | 4 | B95 CyHe | A99 | nBA | 150 | DOP | 100 | 0.10% | 15 | 9 |
| Example 100 | 4 | B96 CyHe | A100 | nBA | 150 | DOP | 100 | 0.10% | 41 | 35 |
| Example 101 | 4 | B97 CyHe | A101 | nBA | 150 | DOP | 100 | 0.10% | 2 | 1 |
| Example 102 | 4 | B98 CyHe | A102 | nBA | 150 | DOP | 100 | 0.10% | 2 | 1 |
| Example 103 | 4 | B99 CyHe | A103 | MIBC | 200 | DOP | 60 | 0.10% | 3 | 1 |
| Example 104 | 4 | B100 CyHe | A104 | 1-Hexanol | 300 | DOP | 210 | 0.10% | 4 | 2 |
| Example 105 | 4 | B101 CyHe | A105 | 2-Heptanone | 350 | DOP | 170 | 0.10% | 2 | 3 |
| Example 106 | 4 | B102 CyHe | A106 | Isoamyl acetate | 400 | DOP | 150 | 0.10% | 2 | 2 |
| Example 107 | 4 | B103 CyHe | A107 | nBA | 150 | DOP | 100 | <0.01% | 2 | 1 |
| Example 108 | 4A | B104 CyHe | A108 | nBA | 500 | DOP | 300 | 0.10% | 6 | 4 |

| | Composition of chemical liquid for developer Content of metal atoms (mass ppt) | | | | Number of coarse particles (number of objects to be counted) (objects to be counted/mL) | Rinsing liquid Chemical liquid number and solvent type of rinsing liquid (details of components are shown in Table 8) | Evaluation | | |
|---|---|---|---|---|---|---|---|---|---|
| | Ni | Pb | Others | Total | | | Develop-ability | Defect suppres-sion perform-ance | Bridge defect suppres-sion perform-ance |
| Example 82 | 3 | 1 | 16 | 23 | 6 | — — | B | A | A |
| Example 83 | 3 | 1 | 16 | 23 | 6 | — — | B | A | A |
| Example 84 | 3 | 1 | 16 | 23 | 6 | — — | B | A | A |
| Example 85 | 3 | 1 | 16 | 23 | 6 | — — | B | A | A |
| Example 86 | 3 | 1 | 16 | 23 | 6 | — — | A | A | A |
| Example 87 | 3 | 1 | 16 | 23 | 6 | — — | AA | AA | AA |
| Example 88 | 3 | 1 | 16 | 23 | 6 | — — | AA | AA | AA |
| Example 89 | 3 | 1 | 16 | 23 | 6 | — — | A | A | A |
| Example 90 | 3 | 1 | 16 | 23 | 6 | C10 MIBC | AA | AA | AA |
| Example 91 | 3 | 2 | 21 | 36 | 16 | — — | A | A | A |
| Example 92 | 6 | 4 | 31 | 57 | 28 | — — | B | B | B |

TABLE 7-continued

| | | | | | | | | | | | |
|---|---|---|---|---|---|---|---|---|---|---|---|
| Example 93 | 9 | 6 | 44 | 87 | 21 | — | — | C | C | C | |
| Example 94 | 6 | 5 | 18 | 48 | 14 | — | — | A | A | A | |
| Example 95 | 17 | 15 | 29 | 91 | 26 | — | — | A | B | B | |
| Example 96 | 25 | 18 | 45 | 132 | 32 | — | — | A | B | B | |
| Example 97 | 3 | 1 | 16 | 23 | 6 | — | — | B | B | B | |
| Example 98 | 3 | 1 | 16 | 23 | 6 | — | — | C | C | C | |
| Example 99 | 18 | 6 | 28 | 76 | 10 | — | — | A | B | B | |
| Example 100 | 47 | 24 | 72 | 219 | 21 | — | — | A | C | C | |
| Example 101 | 3 | 1 | 16 | 23 | 6 | C11 | IPA | A | A | A | |
| Example 102 | 3 | 1 | 16 | 23 | 6 | C12 | PGMEA | A | A | A | |
| Example 103 | 3 | 1 | 13 | 21 | 6 | — | — | C | B | B | |
| Example 104 | 2 | 2 | 14 | 24 | 7 | — | — | B | B | B | |
| Example 105 | 2 | 1 | 15 | 23 | 6 | — | — | B | B | B | |
| Example 106 | 3 | 1 | 16 | 24 | 5 | — | — | B | B | B | |
| Example 107 | 3 | 1 | 16 | 23 | 6 | — | — | B | C | C | |
| Example 108 | 3 | 2 | 21 | 36 | 16 | — | — | A | AA | AA | |

TABLE 8

Composition of chemical liquid for pre-wetting liquid

| | Chemical liquid number | Organic solvent (remaining part) | Organic impurities Content (mass ppm) | Organic impurities other than alcohol impurities (type) | Alcohol impurities (mass ppm) | Water (mass %) | Content of metal atoms (mass ppt) Fe | Cr | Ni | Pb | Others | Total | Number of coarse particles (number of objects to be counted (objects to be counted/mL) |
|---|---|---|---|---|---|---|---|---|---|---|---|---|---|
| Example 82 | B79 | PGME | 200 | DOP | 150 | 0.10% | 2 | 1 | 4 | 1 | 21 | 29 | 9 |
| Example 83 | B80 | PGEE | 250 | DOP | 140 | 0.10% | 3 | 1 | 3 | 2 | 18 | 27 | 12 |
| Example 84 | B81 | POPE | 310 | DOP | 160 | 0.10% | 5 | 1 | 2 | 1 | 26 | 35 | 8 |
| Example 85 | B82 | EL | 280 | DOP | 150 | 0.10% | 4 | 2 | 3 | 1 | 25 | 35 | 7 |
| Example 86 | B83 | CyPe | 500 | DOP | 400 | 0.10% | 2 | 1 | 4 | 2 | 24 | 33 | 11 |
| Example 87 | B84 | CyHe | 210 | DOP | 150 | 0.10% | 4 | 2 | 3 | 3 | 31 | 43 | 10 |
| Example 88 | B85 | PGMEA | 200 | DOP | 100 | 0.10% | 3 | 3 | 2 | 1 | 22 | 31 | 15 |
| Example 89 | — | — | — | — | — | — | — | — | — | — | — | — | — |
| Example 90 | B86 | CyHe | 300 | DOP | 150 | 0.10% | 2 | 1 | 3 | 1 | 25 | 32 | 11 |
| Example 91 | B87 | CyHe | 300 | DOP | 150 | 0.10% | 2 | 1 | 3 | 1 | 25 | 32 | 11 |
| Example 92 | B88 | CyHe | 300 | DOP | 150 | 0.10% | 2 | 1 | 3 | 1 | 25 | 32 | 11 |
| Example 93 | B89 | CyHe | 300 | DOP | 150 | 0.10% | 2 | 1 | 3 | 1 | 25 | 32 | 11 |
| Example 94 | B90 | CyHe | 300 | DOP | 150 | 0.10% | 2 | 1 | 3 | 1 | 25 | 32 | 11 |
| Example 95 | B91 | CyHe | 300 | DOP | 150 | 0.10% | 2 | I | 3 | 1 | 25 | 32 | 11 |
| Example 96 | B92 | CyHe | 300 | DOP | 150 | 0.10% | 2 | 1 | 3 | 1 | 25 | 32 | 11 |
| Example 97 | B93 | CyHe | 300 | DOP | 150 | 0.10% | 2 | 1 | 3 | 1 | 25 | 32 | 11 |
| Example 98 | B94 | CyHe | 300 | DOP | 150 | 0.10% | 2 | 1 | 3 | 1 | 25 | 32 | 11 |
| Example 99 | B95 | CyHe | 300 | DOP | 150 | 0.10% | 2 | 1 | 3 | 1 | 25 | 32 | 11 |
| Example 100 | B96 | CyHe | 300 | DOP | 150 | 0.10% | 2 | 1 | 3 | 1 | 25 | 32 | 11 |
| Example 101 | B97 | CyHe | 300 | DOP' | 150 | 0.10% | 2 | 1 | 3 | 1 | 25 | 32 | 11 |
| Example 102 | B98 | CyHe | 300 | DOP | 150 | 0.10% | 2 | 1 | 3 | 1 | 25 | 32 | 11 |
| Example 103 | B99 | CyHe | 300 | DOP | 150 | 0.10% | 2 | 1 | 3 | 1 | 25 | 32 | 11 |
| Example 104 | B100 | CyHe | 300 | DOP | 150 | 0.10% | 2 | 1 | 3 | 1 | 25 | 32 | 11 |
| Example 105 | B101 | CyHe | 300 | DOP | 150 | 0.10% | 2 | 1 | 3 | 1 | 25 | 32 | 11 |
| Example 106 | B102 | CyHe | 300 | DOP | 150 | 0.10% | 2 | 1 | 3 | 1 | 25 | 32 | 11 |
| Example 107 | B103 | CyHe | 300 | DOP | 150 | 0.10% | 2 | 1 | 3 | 1 | 25 | 32 | 11 |
| Example 108 | B104 | CyHe | 300 | DOP | 150 | 0.10% | 2 | 1 | 3 | 1 | 25 | 32 | 11 |

Composition of chemical liquid for rinsing liquid

| | Chemical liquid number | Organic solvent (remaining part) | Organic impurities Content (mass ppm) | Organic impurities other than alcohol impurities (type) | Alcohol impurities (mass ppm) | Water (mass %) | Content of metal atoms (mass ppt) Fe | Cr | Ni | Pb | Others | Total | Number of coarse particles (number of objects to be counted (objects to be counted/mL) |
|---|---|---|---|---|---|---|---|---|---|---|---|---|---|
| Example 82 | — | — | — | — | — | — | — | — | — | — | — | — | — |
| Example 83 | — | — | — | — | — | — | — | — | — | — | — | — | — |
| Example 84 | — | — | — | — | — | — | — | — | — | — | — | — | — |
| Example 85 | — | — | — | — | — | — | — | — | — | — | — | — | — |

TABLE 8-continued

| | | | | | | | | | | | | | |
|---|---|---|---|---|---|---|---|---|---|---|---|---|---|
| Example 86 | — | — | — | — | — | — | — | — | — | — | — | — | — |
| Example 87 | — | — | — | — | — | — | — | — | — | — | — | — | — |
| Example 88 | — | — | — | — | — | — | — | — | — | — | — | — | — |
| Example 89 | — | — | — | — | — | — | — | — | — | — | — | — | — |
| Example 90 | C10 | MIBC | 650 | DOP | 450 | 0.20% | 4 | 3 | 2 | 1 | 29 | 39 | 15 |
| Example 91 | — | — | — | — | — | — | — | — | — | — | — | — | — |
| Example 92 | — | — | — | — | — | — | — | — | — | — | — | — | — |
| Example 93 | — | — | — | — | — | — | — | — | — | — | — | — | — |
| Example 94 | — | — | — | — | — | — | — | — | — | — | — | — | — |
| Example 95 | — | — | — | — | — | — | — | — | — | — | — | — | — |
| Example 96 | — | — | — | — | — | — | — | — | — | — | — | — | — |
| Example 97 | — | — | — | — | — | — | — | — | — | — | — | — | — |
| Example 98 | — | — | — | — | — | — | — | — | — | — | — | — | — |
| Example 99 | — | — | — | — | — | — | — | — | — | — | — | — | — |
| Example 100 | — | — | — | — | — | — | — | — | — | — | — | — | — |
| Example 101 | C11 | IPA | 650 | DOP | 500 | 0.10% | 4 | 5 | 6 | 1 | 31 | 47 | 11 |
| Example 102 | C12 | PGMEA | 300 | DOP | 210 | 0.10% | 8 | 3 | 4 | 1 | 33 | 49 | 19 |
| Example 103 | — | — | — | — | — | — | — | — | — | — | — | — | — |
| Example 104 | — | — | — | — | — | — | — | — | — | — | — | — | — |
| Example 105 | — | — | — | — | — | — | — | — | — | — | — | — | — |
| Example 106 | — | — | — | — | — | — | — | — | — | — | — | — | — |
| Example 107 | — | — | — | — | — | — | — | — | — | — | — | — | — |
| Example 108 | — | — | — | — | — | — | — | — | — | — | — | — | — |

TABLE 9

| | | Pre-wetting liquid | | Composition of chemical liquid for developer | | | | | | | |
|---|---|---|---|---|---|---|---|---|---|---|---|
| | | | | | | Organic impurities | | | | Content of metal atoms (mass ppt) | |
| | Type of resist composition | Chemical liquid number and solvent type of pre-wetting liquid (details of components are shown in Table 10) | | Chemical liquid number | Organic solvent (remaining part) | Content (mass ppm) | Organic impurities other than alcohol impurities (type) | Alcohol impurities (mass ppm) | Water (mass %) | Fe | Cr |
|---|---|---|---|---|---|---|---|---|---|---|---|
| Example 109 | 1 | B105 | CyHe | A109 | nBA | 150 | DOP | 100 | 0.10% | 153 | 112 |
| Example 110 | 2 | B106 | CyHe | A110 | nBA | 150 | DOP | 100 | 0.10% | 153 | 112 |
| Example 111 | 3 | B107 | CyHe | A111 | nBA | 150 | DOP | 100 | 0.10% | 153 | 112 |
| Example 112 | 4 | B108 | CyHe | A112 | nBA | 150 | DOP | 100 | 0.10% | 153 | 112 |
| Example 113 | 1 | B109 | CyHe | A113 | nBA | 150 | DOP | 100 | 0.10% | <0.1 ppq | <0.1 ppq |
| Example 114 | 2 | B110 | CyHe | A114 | nBA | 150 | DOP | 100 | 0.10% | <0.1 ppq | <0.1 ppq |
| Example 115 | 3 | B111 | CyHe | A115 | nBA | 150 | DOP | 100 | 0.10% | <0.1 ppq | <0.1 ppq |
| Example 116 | 4 | B112 | CyHe | A116 | nBA | 150 | DOP | 100 | 0.10% | <0.1 ppq | <0.1 ppq |
| Example 117 | 1 | B113 | CyHe | A117 | nBA | 150 | DOP | 100 | 0.10% | 113 | 1 |
| Example 118 | 2 | B114 | CyHe | A118 | nBA | 150 | DOP | 100 | 0.10% | 113 | 1 |
| Example 119 | 3 | B115 | CyHe | A119 | nBA | 150 | DOP | 100 | 0.10% | 113 | 1 |
| Example 120 | 4 | B116 | CyHe | A120 | nBA | 150 | DOP | 100 | 0.10% | 113 | 1 |
| Example 121 | 1 | B117 | CyHe | A121 | nBA | 150 | DOP | 100 | 0.10% | 2 | 1 |
| Example 122 | 2 | B118 | CyHe | A122 | nBA | 150 | DOP | 100 | 0.10% | 2 | 1 |
| Example 123 | 3 | B119 | CyHe | A123 | nBA | 150 | DOP | 100 | 0.10% | 2 | 1 |
| Example 124 | 4 | B120 | CyHe | A124 | nBA | 150 | DOP | 100 | 0.10% | 2 | 1 |
| Example 125 | 1A | B121 | CyHe | A125 | nBA | 150 | DOP | 100 | 0.10% | 153 | 112 |
| Example 126 | 2A | B122 | CyHe | A126 | nBA | 150 | DOP | 100 | 0.10% | 153 | 112 |
| Example 127 | 3A | B123 | CyHe | A127 | nBA | 150 | DOP | 100 | 0.10% | 153 | 112 |
| Example 128 | 4A | B124 | CyHe | A128 | nBA | 150 | DOP | 100 | 0.10% | 153 | 112 |

| | Composition of chemical liquid for developer | | | Number of coarse particles (number of objects to be counted) (objects to be counted/mL) | Rinsing liquid | | Evaluation | | |
|---|---|---|---|---|---|---|---|---|---|
| | Content of metal atoms (mass ppt) | | | | Chemical liquid number and solvent type of rinsing liquid (details of components are shown in Table 10) | | Develop-ability | Defect suppression performance | Bridge defect suppression performance |
| | Ni | Pb | Others | Total | | | | | |
|---|---|---|---|---|---|---|---|---|---|
| Example 109 | 145 | 106 | 1256 | 1772 | 136 | C13 | MIBC | B | C | C |
| Example 110 | 145 | 106 | 1256 | 1772 | 136 | C14 | MIBC | B | D | D |
| Example 111 | 145 | 106 | 1256 | 1772 | 136 | C15 | MIBC | B | D | D |
| Example 112 | 145 | 106 | 1256 | 1772 | 136 | C16 | MIBC | B | D | D |
| Example 113 | <0.1 ppq | <0.1 ppq | <0.1 ppq | <0.1 | 6 | C17 | MIBC | B | D | D |

TABLE 9-continued

| | | | | | | | | | | |
|---|---|---|---|---|---|---|---|---|---|---|
| Example 114 | <0.1 ppq | <0.1 ppq | <0.1 ppq | <0.1 | 6 | C18 | MIBC | B | D | D |
| Example 115 | <0.1 ppq | <0.1 ppq | <0.1 ppq | <0.1 | 6 | C19 | MIBC | B | D | D |
| Example 116 | <0.1 ppq | <0.1 ppq | <0.1 ppq | <0.1 | 6 | C20 | MIBC | B | D | D |
| Example 117 | 3 | 1 | 13 | 131 | 32 | C21 | MIBC | D | D | D |
| Example 118 | 3 | 1 | 13 | 131 | 32 | C22 | MIBC | D | D | D |
| Example 119 | 3 | 1 | 13 | 131 | 32 | C23 | MIBC | D | D | D |
| Example 120 | 3 | 1 | 13 | 131 | 32 | C24 | MIBC | D | D | D |
| Example 121 | 3 | 1 | 509 | 516 | 45 | C25 | MIBC | B | D | D |
| Example 122 | 3 | 1 | 509 | 516 | 45 | C26 | MIBC | B | D | D |
| Example 123 | 3 | 1 | 509 | 516 | 45 | C27 | MIBC | B | D | D |
| Example 124 | 3 | 1 | 509 | 516 | 45 | C28 | MIBC | B | D | D |
| Example 125 | 145 | 106 | 1256 | 1772 | 136 | C29 | MIBC | B | B | B |
| Example 126 | 145 | 106 | 1256 | 1772 | 136 | C30 | MIBC | B | B | B |
| Example 127 | 145 | 106 | 1256 | 1772 | 136 | C31 | MIBC | B | B | B |
| Example 128 | 145 | 106 | 1256 | 1772 | 136 | C32 | MIBC | B | B | B |

TABLE 10

| | Composition of chemical liquid for pre-wetting liquid | | | | | | | | | | | |
|---|---|---|---|---|---|---|---|---|---|---|---|---|
| | | | Organic impurities | | | | | | | | | Number of coarse particles (number of objects to be counted) (objects to be counted/mL) |
| | Chemical liquid number | Organic solvent (remaining part) | Content (mass ppm) | Organic impurities other than alcohol impurities (type) | Alcohol impurities (mass ppm) | Water (mass %) | Content of metal atoms (mass ppt) | | | | | |
| | | | | | | | Fe | Cr | Ni | Pb | Others | Total |
| Example 109 | B105 | CyHe | 300 | DOP | 150 | 0.10% | 2 | 1 | 3 | 1 | 25 | 32 | 11 |
| Example 110 | B106 | CyHe | 300 | DOP | 150 | 0.10% | 2 | 1 | 3 | 1 | 25 | 32 | 11 |
| Example 111 | B107 | CyHe | 300 | DOP | 150 | 0.10% | 2 | 1 | 3 | 1 | 25 | 32 | 11 |
| Example 112 | B108 | CyHe | 300 | DOP | 150 | 0.10% | 2 | 1 | 3 | 1 | 25 | 32 | 11 |
| Example 113 | B109 | CyHe | 300 | DOP | 150 | 0.10% | 2 | 1 | 3 | 1 | 25 | 32 | 11 |
| Example 114 | B110 | CyHe | 300 | DOP | 150 | 0.10% | 2 | 1 | 3 | 1 | 25 | 32 | 11 |
| Example 115 | B111 | CyHe | 300 | DOP | 150 | 0.10% | 2 | 1 | 3 | 1 | 25 | 32 | 11 |
| Example 116 | B112 | CyHe | 300 | DOP | 150 | 0.10% | 2 | 1 | 3 | 1 | 25 | 32 | 11 |
| Example 117 | B113 | CyHe | 300 | DOP | 150 | 0.10% | 2 | 1 | 3 | 1 | 25 | 32 | 11 |
| Example 118 | B114 | CyHe | 300 | DOP | 150 | 0.10% | 2 | 1 | 3 | 1 | 25 | 32 | 11 |
| Example 119 | B115 | CyHe | 300 | DOP | 150 | 0.10% | 2 | 1 | 3 | 1 | 25 | 32 | 11 |
| Example 120 | B116 | CyHe | 300 | DOP | 150 | 0,10% | 2 | 1 | 3 | 1 | 25 | 32 | 11 |
| Example 121 | B117 | CyHe | 300 | DOP | 150 | 0.10% | 2 | 1 | 3 | 1 | 25 | 32 | 11 |
| Example 122 | B118 | CyHe | 300 | DOP | 150 | 0.10% | 2 | 1 | 3 | 1 | 25 | 32 | 11 |
| Example 123 | B119 | CyHe | 300 | DOP | 150 | 0.10% | 2 | 1 | 3 | 1 | 25 | 32 | 11 |
| Example 124 | B120 | CyHe | 300 | DOP | 150 | 0.10% | 2 | 1 | 3 | 1 | 25 | 32 | 11 |
| Example 125 | B121 | CyHe | 300 | DOP | 150 | 0.10% | 2 | 1 | 3 | 1 | 25 | 32 | 11 |
| Example 126 | B122 | CyHe | 300 | DOP | 150 | 0.10% | 2 | 1 | 3 | 1 | 25 | 32 | 11 |
| Example 127 | B123 | CyHe | 300 | DOP | 150 | 0.10% | 2 | 1 | 3 | 1 | 25 | 32 | 11 |
| Example 128 | B124 | CyHe | 300 | DOP | 150 | 0.10% | 2 | 1 | 3 | 1 | 25 | 32 | 11 |

| | Composition of chemical liquid for rinsing liquid | | | | | | | | | | | |
|---|---|---|---|---|---|---|---|---|---|---|---|---|
| | | | Organic impurities | | | | | | | | | Number of coarse particles (number of objects to be counted) (objects to be counted/mL) |
| | Chemical liquid number | Organic solvent (remaining part) | Content (mass ppm) | Organic impurities other than alcohol impurities (type) | Alcohol impurities (mass ppm) | Water (mass %) | Content of metal atoms (mass ppt) | | | | | |
| | | | | | | | Fe | Cr | Ni | Pb | Others | Total |
| Example 109 | C13 | MIBC | 650 | DOP | 450 | 0.20% | 4 | 3 | 2 | 1 | 29 | 39 | 15 |
| Example 110 | CI4 | MIBC | 650 | DOP | 450 | 0.20% | 4 | 3 | 2 | 1 | 29 | 39 | 15 |
| Example 111 | C15 | MIBC | 650 | DOP' | 450 | 0.20% | 4 | 3 | 2 | 1 | 29 | 39 | 15 |
| Example 112 | C16 | MIBC | 650 | DOP | 450 | 0.20% | 4 | 3 | 2 | 1 | 29 | 39 | 15 |
| Example 113 | CI7 | MIBC | 650 | DOP | 450 | 0.20% | 4 | 3 | 2 | 1 | 29 | 39 | 15 |
| Example 114 | C18 | MIBC | 650 | DOP | 450 | 0.20% | 4 | 3 | 2 | 1 | 29 | 39 | 15 |
| Example 115 | C19 | MIBC | 650 | DOP | 450 | 0.20% | 4 | 3 | 2 | 1 | 29 | 39 | 15 |
| Example 116 | C20 | MIBC | 650 | DOP | 450 | 0.20% | 4 | 3 | 2 | 1 | 29 | 39 | 15 |
| Example 117 | C21 | MIBC | 650 | DOP | 450 | 0.20% | 4 | 3 | 2 | 1 | 29 | 39 | 15 |
| Example 118 | C22 | MIBC | 650 | DOP | 450 | 0.20% | 4 | 3 | 2 | 1 | 29 | 39 | 15 |
| Example 119 | C23 | MIBC | 650 | DOP | 450 | 0.20% | 4 | 3 | 2 | 1 | 29 | 39 | 15 |
| Example 120 | C24 | MIBC | 650 | DOP | 450 | 0.20% | 4 | 3 | 2 | 1 | 29 | 39 | 15 |

TABLE 10-continued

| | | | | | | | | | | | | | |
|---|---|---|---|---|---|---|---|---|---|---|---|---|---|
| Example 121 | C25 | MIBC | 650 | DOP | 450 | 0.20% | 4 | 3 | 2 | 1 | 29 | 39 | 15 |
| Example 122 | C26 | MIBC | 650 | DOP | 450 | 0.20% | 4 | 3 | 2 | 1 | 29 | 39 | 15 |
| Example 123 | C27 | MIBC | 650 | DOP | 450 | 0.20% | 4 | 3 | 2 | 1 | 29 | 39 | 15 |
| Example 124 | C28 | MIBC | 650 | DOP | 450 | 0.20% | 4 | 3 | 2 | 1 | 29 | 39 | 15 |
| Example 125 | C29 | MIBC | 650 | DOP | 450 | 0.20% | 4 | 3 | 2 | 1 | 29 | 39 | 15 |
| Example 126 | C30 | MIBC | 650 | DOP | 450 | 0.20% | 4 | 3 | 2 | 1 | 29 | 39 | 15 |
| Example 127 | C31 | MIBC | 650 | DOP | 450 | 0.20% | 4 | 3 | 2 | 1 | 29 | 39 | 15 |
| Example 128 | C32 | MIBC | 650 | DOP | 450 | 0.20% | 4 | 3 | 2 | 1 | 29 | 39 | 15 |

TABLE 11

| | Type of resist composition | Pre-wetting liquid: Chemical liquid number and solvent type of pre-wetting liquid (details of components are shown in Table 12) | Chemical liquid number | Organic solvent (remaining) | Content (mass ppm) | Organic impurities other than alcohol impurities (type) | Alcohol impurities | Water (mass %) | Content of metal atoms (mass ppt) Fe | Cr |
|---|---|---|---|---|---|---|---|---|---|---|
| Comparative Example 1 | 1 | B125 CyHe | A129 | nBA | 15000 | DOP | 8000 mass ppm | 0.10% | 2 | 1 |
| Comparative Example 2 | 2 | B126 CyHe | A130 | nBA | 15000 | DOP | 8000 mass ppm | 0.10% | 2 | 1 |
| Comparative Example 3 | 3 | B127 CyHe | A131 | nBA | 15000 | DOP | 8000 mass ppm | 0.10% | 2 | 1 |
| Comparative Example 4 | 4 | B128 CyHe | A132 | nBA | 15000 | DOP | 8000 mass ppm | 0.10% | 2 | 1 |
| Comparative Example 5 | 1 | B129 CyHe | A133 | nBA | <0.01 | DOP | <0.01 mass ppb | 0.10% | 2 | 1 |
| Comparative Example 6 | 2 | B130 CyHe | A134 | nBA | <0.01 | DOP | <0.01 mass ppb | 0.10% | 2 | 1 |
| Comparative Example 7 | 3 | B131 CyHe | A135 | nBA | <0.01 | DOP | <0.01 mass ppb | 0.10% | 2 | 1 |
| Comparative Example 8 | 4 | B132 CyHe | A136 | nBA | <0.01 | DOP | <0.01 mass ppb | 0.10% | 2 | 1 |
| Comparative Example 9 | 1 | B133 CyHe | A137 | nBA | 1650 | DOP | 1500 mass ppm | 0.10% | 0.1 ppq | 0.1 ppq |
| Comparative Example 10 | 2 | B134 CyHe | A138 | nBA | 1650 | DOP | 1500 mass ppm | 0.10% | 0.1 ppq | 0.1 ppq |
| Comparative Example 11 | 3 | B135 CyHe | A139 | nBA | 1650 | DOP | 1500 mass ppm | 0.10% | 0.1 ppq | 0.1 ppq |
| Comparative Example 12 | 4 | B136 CyHe | A140 | nBA | 1650 | DOP | 1500 mass ppm | 0.10% | 0.1 ppq | 0.1 ppq |

| | Content of metal atoms (mass ppt) | | | | Number of coarse particles (number of objects to be counted) (objects to be counted/mL) | Rinsing liquid: Chemical liquid number and solvent type of rinsing liquid (details of components are shown in Table 12) | Developability | Defect suppression performance | Bridge defect suppression performance |
|---|---|---|---|---|---|---|---|---|---|
| | Ni | Pb | Others | Total | | | | | |
| Comparative Example 1 | 3 | 1 | 13 | 20 | 65 | C33 MIBC | E | E | E |
| Comparative Example 2 | 3 | 1 | 13 | 20 | 65 | C34 MIBC | E | E | E |
| Comparative Example 3 | 3 | 1 | 13 | 20 | 65 | C35 MIBC | E | E | E |
| Comparative Example 4 | 3 | 1 | 13 | 20 | 65 | C36 MIBC | E | E | E |
| Comparative Example 5 | 3 | 1 | 13 | 20 | 8 | C37 MIBC | E | E | E |
| Comparative Example 6 | 3 | 1 | 13 | 20 | 8 | C38 MIBC | E | E | E |
| Comparative Example 7 | 3 | 1 | 13 | 20 | 8 | C39 MIBC | E | E | E |
| Comparative Example 8 | 3 | 1 | 13 | 20 | 8 | C40 MIBC | E | E | E |

TABLE 11-continued

| | | | | | | | | | | |
|---|---|---|---|---|---|---|---|---|---|---|
| Comparative Example 9 | 0.1 ppq | 0.1 ppq | 0.2 ppq | 0.6 ppq | 65 | C41 | MIBC | E | E | E |
| Comparative Example 10 | 0.1 ppq | 0.1 ppq | 0.2 ppq | 0.6 ppq | 63 | C42 | MIBC | E | E | E |
| Comparative Example 11 | 0.1 ppq | 0.1 ppq | 0.2 ppq | 0.6 ppq | 64 | C43 | MIBC | E | E | E |
| Comparative Example 12 | 0.1 ppq | 0.1 ppq | 0.2 ppq | 0.6 ppq | 62 | C44 | MIBC | E | E | E |

TABLE 12

Composition of chemical liquid for pre-wetting liquid

| | Chemical liquid number | Organic solvent (remaining part) | Organic impurities Content (mass ppm) | Organic impurities other than alcohol impurities (type) | Alcohol impurities (mass ppm) | Water (mass %) | Content of metal atoms (mass ppt) Fe | Cr | Ni | Pb | Others | Total | Number of coarse particles (number of objects to be counted) (objects to be counted/mL) |
|---|---|---|---|---|---|---|---|---|---|---|---|---|---|
| Comparative Example 1 | B125 | CyHe | 300 | DOP | 150 | 0.10% | 2 | 1 | 3 | 1 | 25 | 32 | 11 |
| Comparative Example 2 | B126 | CyHe | 300 | DOP | 150 | 0.10% | 2 | 1 | 3 | 1 | 25 | 32 | 11 |
| Comparative Example 3 | B127 | CyHe | 300 | DOP | 150 | 0.10% | 2 | 1 | 3 | 1 | 25 | 32 | 11 |
| Comparative Example 4 | B128 | CyHe | 300 | DOP | 150 | 0.10% | 2 | 1 | 3 | 1 | 25 | 32 | 11 |
| Comparative Example 5 | B129 | CyHe | 300 | DOP | 150 | 0.10% | 2 | 1 | 3 | 1 | 25 | 32 | 11 |
| Comparative Example 6 | B130 | CyHe | 300 | DOP | 150 | 0.10% | 2 | 1 | 3 | 1 | 25 | 32 | 11 |
| Comparative Example 7 | B131 | CyHe | 300 | DOP | 150 | 0.10% | 2 | 1 | 3 | 1 | 25 | 32 | 11 |
| Comparative Example 8 | B132 | CyHe | 300 | DOP | 150 | 0.10% | 2 | 1 | 3 | 1 | 25 | 32 | 11 |
| Comparative Example 9 | B133 | CyHe | 300 | DOP | 150 | 0.10% | 2 | 1 | 3 | 1 | 25 | 32 | 11 |
| Comparative Example 10 | B134 | CyHe | 300 | DOP | 150 | 0.10% | 2 | 1 | 3 | 1 | 25 | 32 | 11 |
| Comparative Example 11 | B135 | CyHe | 300 | DOP | 150 | 0.10% | 2 | 1 | 3 | 1 | 25 | 32 | 11 |
| Comparative Example 12 | B136 | CyHe | 300 | DOP | 150 | 0.10% | 2 | 1 | 3 | 1 | 25 | 32 | 11 |

Composition of chemical liquid for rinsing liquid

| | Chemical liquid number | Organic solvent (remaining part) | Organic impurities Content (mass ppm) | Organic impurities other than alcohol impurities (type) | Alcohol impurities (mass ppm) | Water (mass %) | Content of metal atoms (mass ppt) Fe | Cr | Ni | Pb | Others | Total | Number of coarse particles (number of objects to be counted) (objects to be counted/mL) |
|---|---|---|---|---|---|---|---|---|---|---|---|---|---|
| Comparative Example 1 | C33 | MIBC | 650 | DOP | 450 | 0.20% | 4 | 3 | 2 | 1 | 29 | 39 | 15 |
| Comparative Example 2 | C34 | MIBC | 650 | DOP | 450 | 0.20% | 4 | 3 | 2 | 1 | 29 | 39 | 15 |
| Comparative Example 3 | C35 | MIBC | 650 | DOP | 450 | 0.20% | 4 | 3 | 2 | 1 | 29 | 39 | 15 |
| Comparative Example 4 | C36 | MIBC | 650 | DOP | 450 | 0.20% | 4 | 3 | 2 | 1 | 29 | 39 | 15 |
| Comparative Example 5 | C37 | MIBC | 650 | DOP | 450 | 0.20% | 4 | 3 | 2 | 1 | 29 | 39 | 15 |
| Comparative Example 6 | C38 | MIBC | 650 | DOP | 450 | 0.20% | 4 | 3 | 2 | 1 | 29 | 39 | 15 |
| Comparative Example 7 | C39 | MIBC | 650 | DOP | 450 | 0.20% | 4 | 3 | 2 | 1 | 29 | 39 | 15 |

TABLE 12-continued

| | | | | | | | | | | | | | |
|---|---|---|---|---|---|---|---|---|---|---|---|---|---|
| Comparative Example 8 | C40 | MIBC | 650 | DOP | 450 | 0.20% | 4 | 3 | 2 | 1 | 29 | 39 | 15 |
| Comparative Example 9 | C41 | MIBC | 650 | DOP | 450 | 0.20% | 4 | 3 | 2 | 1 | 29 | 39 | 15 |
| Comparative Example 10 | C42 | MIBC | 650 | DOP | 450 | 0.20% | 4 | 3 | 2 | 1 | 29 | 39 | 15 |
| Comparative Example 11 | C43 | MIBC | 650 | DOP | 450 | 0.20% | 4 | 3 | 2 | 1 | 29 | 39 | 15 |
| Comparative Example 12 | C44 | MIBC | 650 | DOP | 450 | 0.20% | 4 | 3 | 2 | 1 | 29 | 39 | 15 |

TABLE 13

| | | Composition of chemical liquid | | | | | | | | | | Number of coarse particles |
|---|---|---|---|---|---|---|---|---|---|---|---|---|
| | | | Organic impurities | | | | | | | | | |
| Type of resist composition | Chemical liquid number | Organic solvent (remaining part) | Content (mass ppm) | Organic impurities other than alcohol impurities (type) | Alcohol impurities (mass ppm) | Water (mass %) | Content of metal atoms (mass ppt) | | | | | (number of objects to be counted) (objects to be counted/mL) |
| | | | | | | | Fe | Cr | Ni | Pb | Others | Total |
| 1A | X1 | PGMEA | 150 | DOP | 100 | 0.10% | 2 | 1 | 3 | 1 | 16 | 23 | 6 |
| | | Cyclohexanone | 150 | DOP | 100 | 0.10% | 2 | 1 | 3 | 1 | 16 | 23 | 6 |
| | | γ-BL | 150 | DOP | 100 | 0.10% | 2 | 1 | 3 | 1 | 16 | 23 | 6 |
| 2A | X2 | PGMEA | 150 | DOP | 100 | 0.10% | 2 | 1 | 3 | 1 | 16 | 23 | 6 |
| | | Cyclohexanone | 150 | DOP | 100 | 0.10% | 2 | 1 | 3 | 1 | 16 | 23 | 6 |
| | | γ-BL | 150 | DOP | 100 | 0.10% | 2 | 1 | 3 | 1 | 16 | 23 | 6 |
| 3A | X3 | PGMEA | 150 | DOP | 100 | 0.10% | 2 | 1 | 3 | 1 | 16 | 23 | 6 |
| | | PGME | 150 | DOP | 100 | 0.10% | 2 | 1 | 3 | 1 | 16 | 23 | 6 |
| | | 2-Heptanone | 150 | DOP | 100 | 0.10% | 2 | 1 | 3 | 1 | 16 | 23 | 6 |
| | | γ-BL | 150 | DOP | 100 | 0.10% | 2 | 1 | 3 | 1 | 16 | 23 | 6 |
| 4A | X4 | PGMEA | 150 | DOP | 100 | 0.10% | 2 | 1 | 3 | 1 | 16 | 23 | 6 |
| | | HBM | 150 | DOP | 100 | 0.10% | 2 | 1 | 3 | 1 | 16 | 23 | 6 |
| | | Cyclohexanone | 150 | DOP | 100 | 0.10% | 2 | 1 | 3 | 1 | 16 | 23 | 6 |

From Tables 1, 3, 5, 7, 9, and 11, it was found that the pattern forming method of Examples is excellent in developability and also excellent in defect suppression performance. It was also found that the bridge defect suppression performance is excellent in the pattern forming method of Examples.

In addition, from the comparison of Examples 1 to 8, it was found that both the developability and the defect suppression performance are superior in a case where the pattern forming method has a pre-wetting step in which cyclopentanone, cyclohexanone, or propylene glycol monomethyl ether acetate is used as a pre-wetting liquid before the resist film forming step (preferably, in a case of having a pre-wetting step using cyclohexanone or propylene glycol monomethyl ether acetate as a pre-wetting liquid).

In addition, from the comparison of Example 6 and Examples 22 to 25, it was found that both the developability and the defect suppression performance are superior in a case of using butyl acetate as a developer in the pattern forming method.

In addition, from the comparison of Examples 9, 20, and 21, it was found that both the developability and the defect suppression performance are superior in a case of using MIBC as a rinsing liquid in the pattern forming method.

In addition, from the comparison of Example 6 and Examples 10 to 12, it was found that both the developability and the defect suppression performance are superior in a case where the total content of organic impurities in the chemical liquid for a developer is 1 to 5000 mass ppm (preferably 1 to 850 mass ppm and more preferably 1 to 700 mass ppm) with respect to the total mass of the chemical liquid.

In addition, from the comparison of Example 6 and Examples 10 to 12, it was found that both the developability and the defect suppression performance are superior in a case where the total content of alcohol impurities in the chemical liquid for a developer is 0.1 mass ppb to 700 mass ppm (preferably 1 mass ppb to 500 mass ppm and more preferably 5 mass ppb to 200 mass ppm) with respect to the total mass of the chemical liquid.

In addition, from the comparison of Examples 6, 16, 17, and 26, it was found that both the developability and the defect suppression performance are superior in a case where the content of water in the chemical liquid for a developer is 0.01 to 1.0 mass % (preferably 0.1 to 0.4 mass %) with respect to the total mass of the chemical liquid.

In addition, from the comparison of Examples 6, 13 to 15, 18, and 19, it was found that both the developability and the defect suppression performance are superior in a case where the total content of metal atoms in the chemical liquid for a developer is 0.1 to 150 mass ppt (preferably 0.1 to 50 mass ppt and more preferably 0.1 to 30 mass ppt) with respect to the total mass of the chemical liquid.

In addition, from the comparison of Examples 6, 13 to 15, 18, and 19, it was found that both the developability and the defect suppression performance are superior in a case where the content of any one or more specific metal atoms selected from the group consisting of an Fe atom, a Cr atom, a Ni atom, and a Pb atom which are likely to influence the defect suppression performance, among the metal atoms, is independently within the numerical range of 0.1 to 10 mass ppt with respect to the total mass of the chemical liquid.

In addition, as shown in Examples 28 to 108, the same tendency was confirmed in a case where the resin constituting the resist film was replaced with another acid-decomposable resin represented by Formula (I).

In Comparative Examples 1 to 8, the content of the alcohol impurities in the chemical liquid was outside the predetermined range, and the defect suppression performance did not satisfy the desired requirement.

In Comparative Examples 9 to 12, the total content of metal atoms contained in the chemical liquid was outside the predetermined range, and the defect suppression performance did not satisfy the desired requirement.

In addition, from the comparison between Example 10 and Example 27, it was found that both the developability and the defect suppression performance are superior in a case where the chemical liquid is applied as a solvent for dissolving various components of an actinic ray-sensitive or radiation-sensitive resin composition.

A resist film forming composition 1-X was prepared in the same manner as in Example 1, except that 3 parts by mass of PGMEA (propylene glycol monomethyl ether acetate), 600 parts by mass of cyclohexanone, and 100 parts by mass of γ-BL (γ-butyrolactone), which are organic solvents used in the resist film forming composition, were changed to PGMEA (3 parts by mass) used as the pre-wetting liquid of Example 7 and cyclohexanone (700 parts by mass) used as the pre-wetting liquid of Example 6, and a patterned resist film was then formed and evaluated. As a result, the developability was A and the defect suppression performance was AA.

Since an organic solvent occupies most of the resist film forming composition, it is considered that impurity components (organic impurities, water, metal particles, and coarse particles) in the resist film forming composition are also very small in a case where the chemical liquid used in Examples 6 and 7 is used.

With regard to the resist film forming composition 1-X, the total amount of an Fe atom, a Cr atom, a Ni atom, and a Pb atom contained in the resist film forming composition was 100 mass ppt or less and the number of coarse particles in the composition was 10 particles/mL or less.

[Evaluation 2 of Developability, Defect Suppression Performance, and Bridge Defect Suppression Performance]

Evaluation of developability, defect suppression performance, and bridge defect suppression performance was carried out using the actinic ray-sensitive or radiation-sensitive resin composition shown below.

[Preparation of Chemical Liquid for Developer]

Chemical liquids A201 to A285 for developers shown in Tables 17 to 19 were prepared in the same manner as in the section of [Evaluation 1 of developability, defect suppression performance, and bridge defect suppression performance].

[Preparation of Chemical Liquid for Pre-Wetting]

The chemical liquid B33 for pre-wetting shown in Tables 17 to 19 is the same as the chemical liquid B33 for pre-wetting used in Example 36.

[Preparation of Chemical Liquid for Rinsing]

The chemical liquid C4 for rinsing shown in Tables 17 to 19 is the same as the chemical liquid C4 for rinsing used in Example 36.

<Method for Measuring Content or the Like of Each Component Contained in Chemical Liquid>

For the measurement of the content or the like of each component contained in the chemical liquid prepared in each of Examples and Comparative Examples, the same method as in the section of [Evaluation 1 of developability, defect suppression performance, and bridge defect suppression performance] was used. In addition, all of the following measurements were carried out in a clean room at a level that satisfies ISO (International Organization for Standardization) Class 2 or lower. In order to improve the measurement accuracy, in the measurement of each component, in a case where the component was below the detection limit by ordinary measurement, the component was concentrated to 1/100 in terms of volume and the measurement was carried out, and the content of the component was calculated in terms of the content of the organic solvent before concentration.

[Preparation of Actinic Ray-Sensitive or Radiation-Sensitive Resin Composition]

<Resin (A) or the Like>

(Synthesis Example 1) Synthesis of Resin (A-1)

600 g of cyclohexanone was placed in a 2 L flask which was then purged with nitrogen at a flow rate of 100 mL/min for one hour. Thereafter, 4.60 g (0.02 mol) of a polymerization initiator V-601 (manufactured by Wako Pure Chemical Industries, Ltd.) was added thereto, and the temperature was raised until the internal temperature of the reaction system reached 80° C. Then, the following monomers and 4.60 g (0.02 mol) of a polymerization initiator V-601 (manufactured by Wako Pure Chemical Industries, Ltd.) were dissolved in 200 g of cyclohexanone to prepare a monomer solution. The monomer solution was added dropwise over 6 hours to the above flask heated to 80° C. After the dropwise addition was completed, the mixture was allowed to react for another 2 hours at 80° C.

| | |
|---|---|
| 4-acetoxy styrene | 48.66 g (0.3 mol) |
| 1-ethylcyclopentyl methacrylate | 109.4 g (0.6 mol) |
| Monomer 1 | 22.2 g (0.1 mol) |

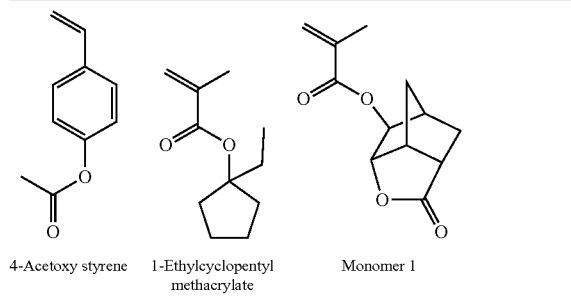

4-Acetoxy styrene   1-Ethylcyclopentyl methacrylate   Monomer 1

The reaction solution was cooled to room temperature and was added dropwise to 3 L of hexane to precipitate a polymer. The filtered solid was dissolved in 500 mL of acetone which was then added dropwise again to 3 L of hexane, followed by filtration. The filtered solid was dried under reduced pressure to obtain 160 g of a 4-acetoxy styrene/1-ethylcyclopentyl methacrylate/monomer 1 copolymer (A-la).

10 g of the above-obtained copolymer (A-la), 40 mL of methanol, 200 mL of 1-methoxy-2-propanol, and 1.5 mL of concentrated hydrochloric acid were added to a reaction vessel which was then heated to 80° C., followed by stirring for 5 hours. The reaction solution was allowed to cool to room temperature and was added dropwise to 3 L of distilled water. The filtered solid was dissolved in 200 mL of acetone which was then added dropwise again to 3 L of distilled water, followed by filtration. The filtered solid was dried under reduced pressure to obtain a resin (A-1) (8.5 g). The weight-average molecular weight (Mw) in terms of standard polystyrene standards by gel permeation chromatography (GPC) (solvent: tetrahydrofuran (THF)) was 11200, and the molecular weight dispersity (Mw/Mn) was 1.45.

Resins (A-2) to (A-19) having the structures shown in Table 14 were synthesized in the same manner as in Synthesis Example 1 except that the monomers used were changed.

In Table 14, the compositional ratio (molar ratio) of the resin was calculated by $^1$H-NMR (nuclear magnetic resonance) measurement. The weight-average molecular weight (Mw: in terms of polystyrene) and the dispersity (Mw/Mn) of the resin were calculated by GPC (solvent: THF) measurement. For other resins shown in Examples, the weight-average molecular weight and dispersity thereof were measured in the same manner.

TABLE 14

| | Structure | Compositional ratio (molar ratio) from left | Mw | Mw/Mn |
|---|---|---|---|---|
| Resin A-1 | | 30/60/10 | 11,200 | 1.45 |
| Resin A-2 | | 30/60/10 | 12,300 | 1.51 |

TABLE 14-continued
| | Structure | Compositional ratio (molar ratio) from left | Mw | Mw/Mn |
|---|---|---|---|---|
| | 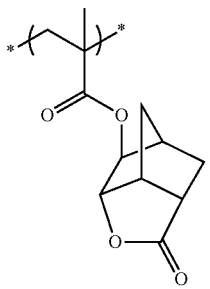 | | | |
| Resin A-3 | 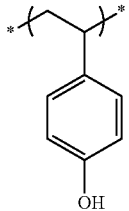 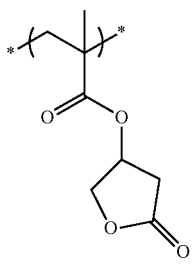 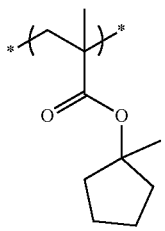 | 40/20/40 | 9,200 | 1.68 |
| Resin A-4 | 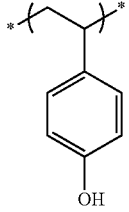 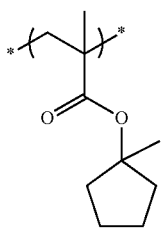 | 30/60/10 | 12,300 | 1.51 |

TABLE 14-continued
| Structure | Compositional ratio (molar ratio) from left | Mw | Mw/Mn |
|---|---|---|---|
| 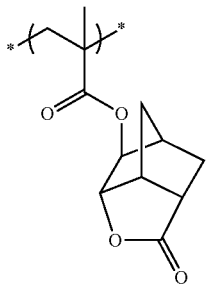 | | | |
| Resin A-5 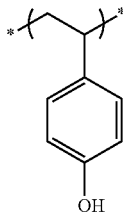 | 20/80 | 12,500 | 1.52 |
| Resin A-6 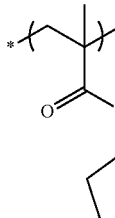 | 50/50 | 13,000 | 1.56 |
| Resin A-7 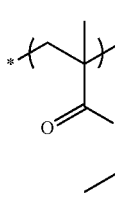 | 70/30 | 12,500 | 1.43 |

TABLE 14-continued

| Structure | Compositional ratio (molar ratio) from left | Mw | Mw/Mn |
|---|---|---|---|
| Resin A-8 | 20/80 | 18,000 | 1.12 |
| Resin A-9 | 5/15/30/50 | 11,000 | 1.56 |
| Resin A-10 | 50/50 | 11,000 | 1.45 |

TABLE 14-continued

| Structure | Compositional ratio (molar ratio) from left | Mw | Mw/Mn |
|---|---|---|---|
| Resin A-11 | 35/65 | 12,300 | 1.51 |
| Resin A-12 | 60/40 | 12,500 | 1.68 |
| Resin A-13 | 70/30 | 13,000 | 1.51 |
| Resin A-14 | 20/40/40 | 11,000 | 1.45 |

TABLE 14-continued
| Structure | Compositional ratio (molar ratio) from left | Mw | Mw/Mn |
|---|---|---|---|
| Resin A-15 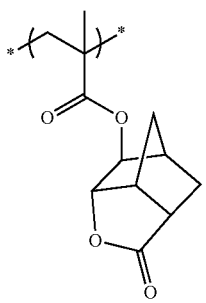 | 30/70 | 12,300 | 1.51 |
| Resin A-16 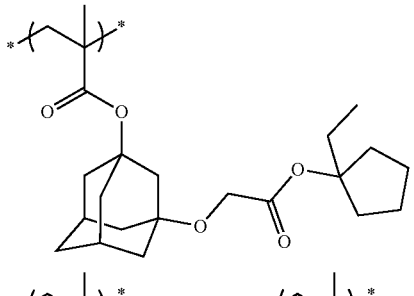 | 50/20/30 | 14,500 | 1.68 |
| Resin A-17 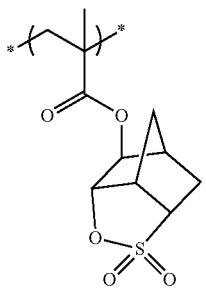 | 30/50/10/10 | 12,100 | 1.53 |

TABLE 14-continued

| Structure | Compositional ratio (molar ratio) from left | Mw | Mw/Mn |
|---|---|---|---|
| Resin A-18 | 50/35/15 | 11,100 | 1.61 |

TABLE 14-continued
| Structure | Compositional ratio (molar ratio) from left | Mw | Mw/Mn |
|---|---|---|---|
| Resin A-19 | 30/45/15/10 | 11,500 | 1.49 |
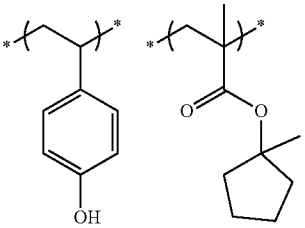
<Hydrophobic Resin (A')>
The following resins were used as the hydrophobic resin.
TABLE 17
| Table 15 | Compositional ratio (molar ratio) | | | | Mw | Mw/Mn |
|---|---|---|---|---|---|---|
| Resin (1b) | 50 | 45 | 5 | — | 7000 | 1.30 |
| Resin (2b) | 40 | 40 | 20 | — | 18600 | 1.57 |
| Resin (3b) | 50 | 50 | — | — | 25400 | 1.63 |
| Resin (4b) | 30 | 65 | 5 | — | 28000 | 1.70 |
| Resin (5b) | 10 | 10 | 30 | 50 | 12500 | 1.65 |
Specific structural formulae of the resins (1b) to (5b) described in the table are shown below.
(1b)
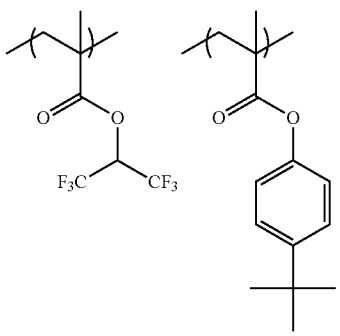

-continued
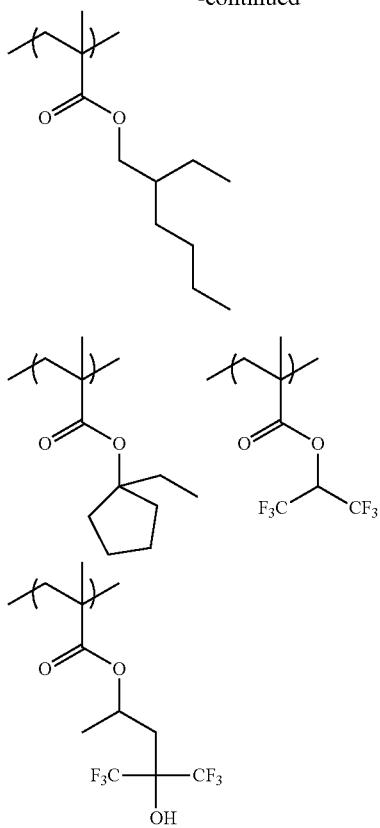
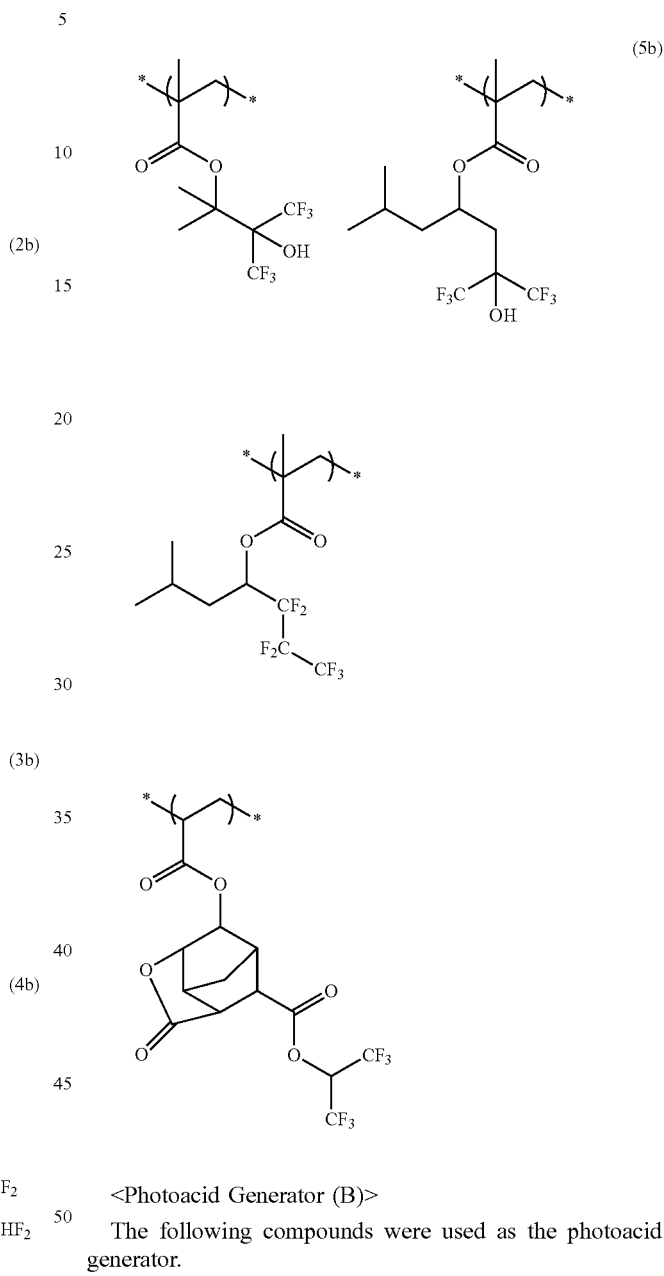
<Photoacid Generator (B)>
The following compounds were used as the photoacid generator.
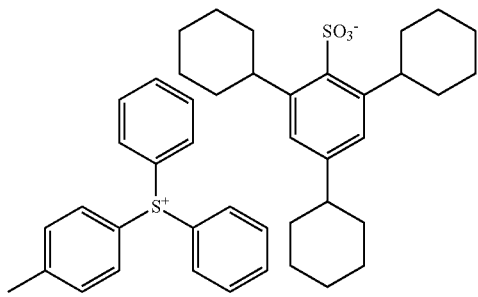
(B-1)
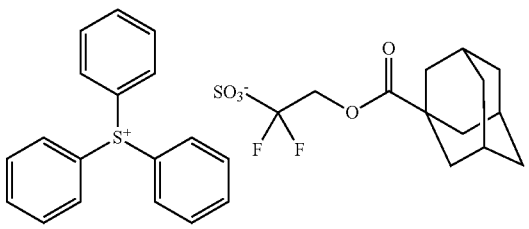
(B-2)

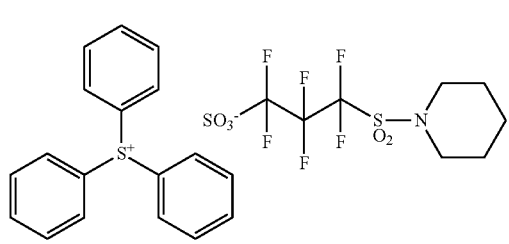
(B-3)
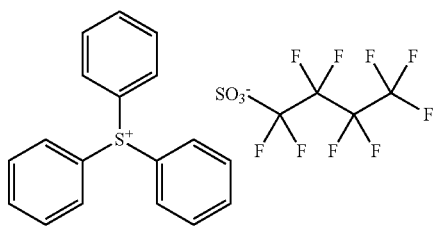
(B-4)
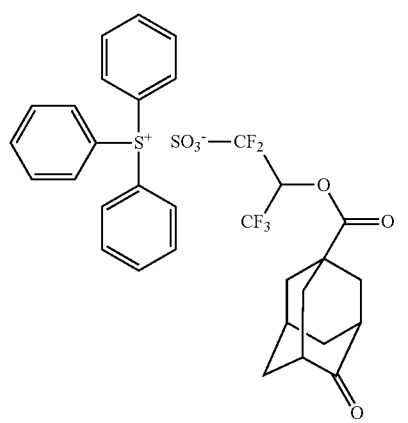
(B-5)
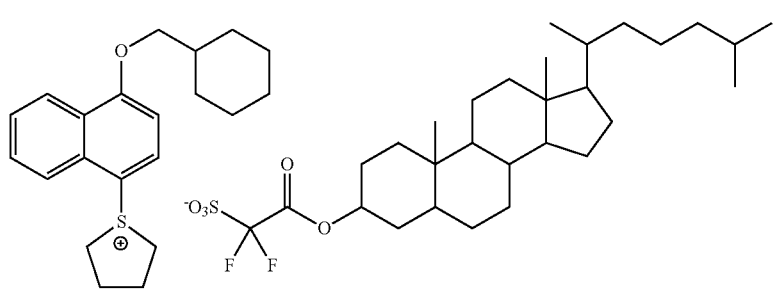
(B-6)
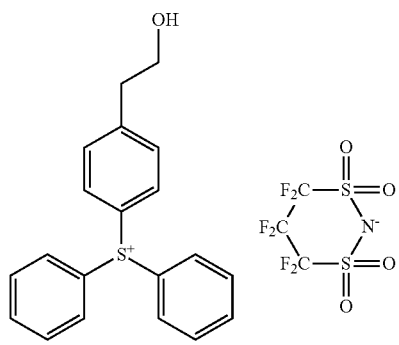
(B-7)
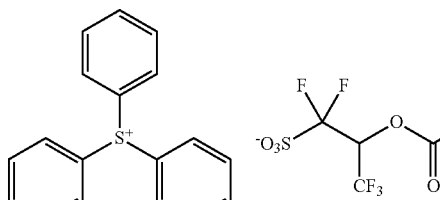
(B-8)
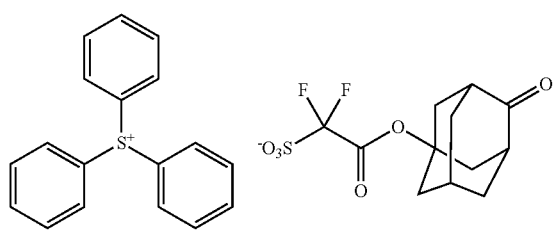
(B-9)

-continued
(B-10)
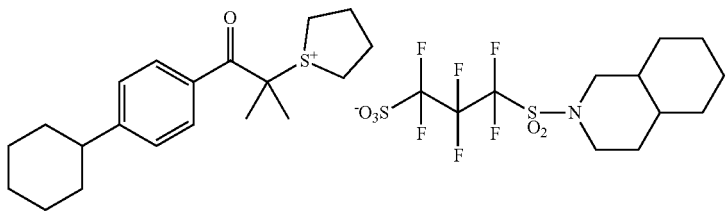
<Basic Compound (E)>
The following compounds were used as the basic compound.
(E-1) (E-2)
(E-3) (E-4)
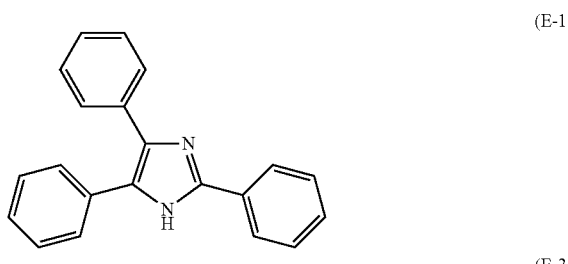
(E-5)
(E-6)
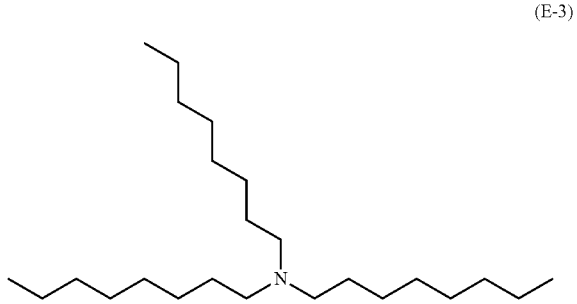
(E-7)
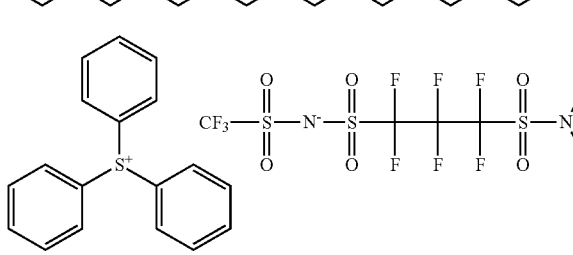
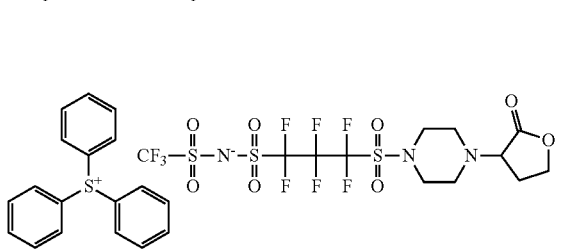

-continued

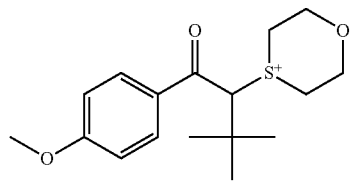 (E-8)

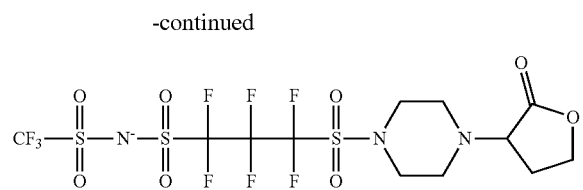

(E-9)

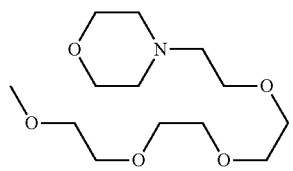

(E-10)

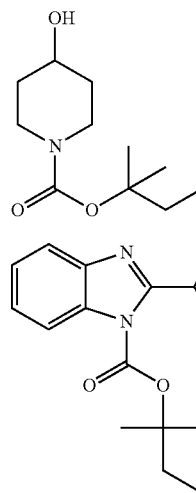

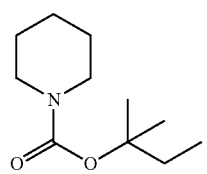

(E-11)

(E-12)

(E-13)

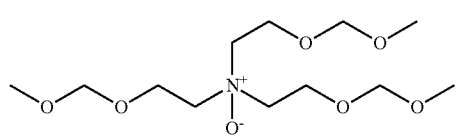

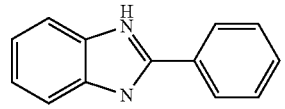

(E-14)

<Solvent (C)>
The following compounds were used as the resist solvent.
C-1: propylene glycol monomethyl ether acetate
C-2: propylene glycol monomethyl ether
C-3: ethyl lactate
C-4: cyclohexanone <Resist Composition>

Individual components shown in the following Table 16 were dissolved in the solvent shown in the same table. This was followed by filtration using a polyethylene filter having a pore size of 0.03 μm to obtain a resist composition.

TABLE 18

| Table 16 | Resin (A) | Photoacid generator (B) | Basic compound (E) | Solvent (C) | | | Hydrophobic resin (A') |
|---|---|---|---|---|---|---|---|
| Resist composition 1 | A-1 0.77 g | B-1 0.2 g | E-3 0.03 g | C-1 67.5 g | C-3 7.5 g | — | — |
| Resist composition 2 | A-2 0.79 g | B-2 0.18 g | E-1 0.03 g | C-1 45 g | C-2 30 g | — | — |
| Resist composition 3 | A-3 0.79 g | B-2 0.18 g | E-1 0.03 g | C-1 45 g | C-2 30 g | — | — |
| Resist composition 4 | A-4 0.79 g | B-2 0.18 g | E-1 0.03 g | C-1 60 g | C-3 15 g | — | — |
| Resist composition 5 | A-5 0.78 g | B-3 0.19 g | E-3 0.03 g | C-1 67.5 g | C-3 7.5 g | — | — |
| Resist composition 6 | A-6 0.79 g | B-2 0.18 g | E-1 0.03 g | C-1 67.5 g | C-3 7.5 g | — | — |
| Resist composition 7 | A-6/A-7 0.395 g/0.395 g | B-4 0.2 g | E-4 0.01 g | C-1 45 g | C-4 30 g | — | — |
| Resist composition 8 | A-8 0.79 g | B-1 0.18 g | E-1 0.03 g | C-1 45 g | C-2 30 g | — | — |
| Resist composition 9 | A-1/A-2 0.395 g/0.395 g | B-2 0.18 g | E-1/E-5 0.015 g/0.015 g | C-1 45 g | C-2 30 g | — | — |
| Resist composition 10 | A-2 0.79 g | B-2 0.18 g | E-6 0.03 g | C-1 45 g | C-2 30 g | — | — |
| Resist composition 11 | A-2 0.79 g | B-2 0.18 g | E-7 0.03 g | C-1 45 g | C-2 30 g | — | — |
| Resist composition 12 | A-2 0.79 g | B-2 0.18 g | E-8 0.03 g | C-1 45 g | C-2 30 g | — | — |

TABLE 18-continued

| Table 16 | Resin (A) | Photoacid generator (B) | Basic compound (E) | Solvent (C) | | | Hydrophobic resin (A') |
|---|---|---|---|---|---|---|---|
| Resist composition 13 | A-9 0.76 g | B-5 0.18 g | E-9 0.03 g | C-1 45 g | C-2 15 g | C-4 15 g | 5b 0.03 g |
| Resist composition 14 | A-7 0.787 g | B-5 0.18 g | E-9 0.03 g | C-1 45 g | C-2 15 g | C-4 15 g | 4b 0.003 g |
| Resist composition 15 | A-6 0.785 g | B-4 0.18 g | E-10 0.03 g | C-1 45 g | C-2 15 g | C-4 15 g | 3b 0.005 g |
| Resist composition 16 | A-10 0.78 g | B-3 0.18 g | E-11 0.03 g | C-1 45 g | C-2 15 g | C-4 15 g | 2b 0.01 g |
| Resist composition 17 | A-11 0.72 g | B-6/B-2 0.15 g/0.09 g | E-12 0.03 g | C-1 45 g | C-2 15 g | C-4 15 g | 1b 0.01 g |
| Resist composition 18 | A-12 0.76 g | B-7 0.18 g | E-13 0.03 g | C-1 45 g | C-2 30 g | — | 5b 0.03 g |
| Resist composition 19 | A-13 0.787 g | B-8 0.18 g | E-14 0.03 g | C-1 30 g | C-2 45 g | — | 4b 0.003 g |
| Resist composition 20 | A-14 0.785 g | B-9 0.18 g | E-2 0.03 g | C-1 45 g | C-4 30 g | — | 3b 0.005 g |
| Resist composition 21 | A-15 0.78 g | B-10/B-2 0.09 g/0.09 g | E-13 0.03 g | C-1 30 g | C-4 45 g | — | 2b 0.01 g |
| Resist composition 22 | A-16 0.71 g | B-6 0.25 g | E-14 0.03 g | C-1 50 g | C-2 10 g | — | 1b 0.01 g |
| Resist composition 23 | A-17 0.79 g | B-2 0.18 g | E-1 0.03 g | C-1 60 g | C-3 15 g | — | — |
| Resist composition 24 | A-18 0.79 g | B-2 0.18 g | E-1 0.03 g | C-1 60 g | C-3 15 g | — | — |
| Resist composition 25 | A-19 0.79 g | B-2 0.18 g | E-1 0.03 g | C-1 60 g | C-3 15 g | — | — |

[Evaluation]
<Evaluation of Resist by NTI Pattern Development>
A resist pattern was formed by the following operation.
(Pre-Wetting Step)
The pre-wetting liquid (described in the following Tables 17 to 19) was added dropwise onto the surface of a silicon wafer, and spin coating was then carried out.
(Resist Composition Application and Post Baking (PB) Step)
Each of the resist compositions (those described in the following Tables 17 to 19) obtained as described above was applied onto a 12-inch silicon wafer and baked under the conditions of 90° C. to 180° C. for 60 seconds to form a resist film having a film thickness of 40 nm.
(Exposing (EUV Exposing) Step)
The above-prepared wafer was subjected to EUV exposure with numerical aperture (NA) of 0.25 and dipole illumination (Dipole 60×, outer sigma 0.81, inner sigma 0.43). Specifically, for a negative-tone resist, pattern-wise exposure was carried out through a halftone mask with an exposure dose of 1 mJ/cm$^2$.

(Post-Exposure Bake (PEB) Step)
After irradiation, once removed from the EUV exposure apparatus, the wafer was immediately baked under the conditions of 85° C. to 130° C. for 60 seconds.
(Developing Step)
Thereafter, using a shower type developing apparatus (ADE 3000S, manufactured by ACTES Co., Ltd.), the development was carried out by spray-jetting the developer (23° C.) at a flow rate of 200 mL/min for 30 seconds while rotating the wafer at 50 revolutions (rpm). As the developer, those described in the following Tables 17 to 19 were used.
(Rinsing Step)
Thereafter, a rinsing treatment was carried out by spray-jetting the rinsing liquid (23° C.) at a flow rate of 200 mL/min for 15 seconds while rotating the wafer at 50 revolutions (rpm).
Finally, the wafer was dried by high speed rotation of 2500 revolutions (rpm) for 60 seconds. As the rinsing liquid, those described in the following Tables 17 to 19 were used.
In the table, EUV-1 to EUV-25 correspond to the above-mentioned resist compositions 1 to 25, respectively.

TABLE 19

Composition of chemical liquid for developer

| | | Pre-wetting liquid Chemical liquid number and solvent type of pre-wetting | | Chemical liquid | Organic solvent (remaining | | Organic impurities | | | Content of metal atoms (mass ppt) | |
|---|---|---|---|---|---|---|---|---|---|---|---|
| Table 17 | Type of resist | composition | liquid | number | part) | Content (mass ppm) | Organic impurities other than alcohol impurities (type) | Alcohol impurities (mass ppm) | Water (mass %) | Fe | Cr |
| Example 129 | EUV-1 | B33 | CyHe | A201 | nBA | 220 | DOP | 100 | 0.10% | 2 | 1 |
| Example 130 | EUV-2 | B33 | CyHe | A202 | nBA | 200 | DOP | 100 | 0.10% | 1 | 2 |
| Example 131 | EUV-3 | B33 | CyHe | A203 | nBA | 250 | DOP | 120 | 0.10% | 3 | 1 |
| Example 132 | EUV-4 | B33 | CyHe | A204 | nBA | 250 | DOP | 100 | 0.10% | 2 | 1 |
| Example 133 | EUV-5 | B33 | CyHe | A205 | nBA | 310 | DOP | 130 | 0.10% | 3 | 1 |
| Example 134 | EUV-6 | B33 | CyHe | A206 | nBA | 360 | DOP | 150 | 0.10% | 2 | 1 |
| Example 135 | EUV-7 | B33 | CyHe | A207 | nBA | 250 | DOP | 120 | 0.10% | 4 | 1 |

TABLE 19-continued

| | | | | | | | | | | | |
|---|---|---|---|---|---|---|---|---|---|---|---|
| Example 136 | EUV-8 | B33 | CyHe | A208 | nBA | 240 | DOP | 100 | 0.10% | 2 | 1 |
| Example 137 | EUV-9 | B33 | CyHe | A209 | nBA | 230 | DOP | 130 | 0.10% | 3 | 2 |
| Example 138 | EUV-10 | B33 | CyHe | A210 | nBA | 280 | DOP | 150 | 0.10% | 2 | 1 |
| Example 139 | EUV-11 | B33 | CyHe | A211 | nBA | 330 | DOP | 180 | 0.10% | 2 | 1 |
| Example 140 | EUV-12 | B33 | CyHe | A212 | nBA | 380 | DOP | 200 | 0.10% | 3 | 1 |
| Example 141 | EUV-13 | B33 | CyHe | A213 | nBA | 340 | DOP | 130 | 0.10% | 1 | 1 |
| Example 142 | EUV-14 | B33 | CyHe | A214 | nBA | 270 | DOP | 140 | 0.10% | 1 | 1 |
| Example 143 | EUV-15 | B33 | CyHe | A215 | nBA | 240 | DOP | 100 | 0.10% | 2 | 1 |
| Example 144 | EUV-16 | B33 | CyHe | A216 | nBA | 250 | DOP | 130 | 0.10% | 3 | 1 |
| Example 145 | EUV-17 | B33 | CyHe | A217 | nBA | 250 | DOP | 150 | 0.10% | 4 | 1 |
| Example 146 | EUV-18 | B33 | CyHe | A218 | nBA | 330 | DOP | 180 | 0.10% | 2 | 1 |
| Example 147 | EUV-19 | B33 | CyHe | A219 | nBA | 320 | DOP | 200 | 0.10% | 1 | 2 |
| Example 148 | EUV-20 | B33 | CyHe | A220 | nBA | 220 | DOP | 120 | 0.10% | 3 | 1 |
| Example 149 | EUV-21 | B33 | CyHe | A221 | nBA | 230 | DOP | 100 | 0.10% | 1 | 1 |
| Example 150 | EUV-22 | B33 | CyHe | A222 | nBA | 280 | DOP | 130 | 0.10% | 1 | 1 |
| Example 151 | EUV-23 | B33 | CyHe | A223 | nBA | 330 | DOP | 150 | 0.10% | 1 | 1 |
| Example 152 | EUV-24 | B33 | CyHe | A224 | nBA | 390 | DOP | 180 | 0.10% | 2 | 1 |
| Example 153 | EUV-25 | B33 | CyHe | A225 | nBA | 330 | DOP | 200 | 0.10% | 3 | 2 |

| | Composition of chemical liquid for developer | | | | Number of coarse particles (number of objects to be counted) (objects to be counted/mL) | Rinsing liquid | | Evaluation | | |
|---|---|---|---|---|---|---|---|---|---|---|
| | Content of metal atoms (mass ppt) | | | | | Chemical liquid number and solvent type of rinsing liquid | | Develop-ability | Defect suppres-sion perform-ance | Bridge defect suppres-sion perform-ance |
| Table 17 | Ni | Pb | Others | Total | | | | | | |
| Example 129 | 1 | 1 | 16 | 21 | 6 | C4 | MIBC | AA | AA | AA |
| Example 130 | 3 | 1 | 14 | 21 | 7 | C4 | MIBC | AA | AA | AA |
| Example 131 | 2 | 1 | 15 | 22 | 6 | C4 | MIBC | AA | AA | AA |
| Example 132 | 3 | 1 | 16 | 23 | 5 | C4 | MIBC | AA | AA | AA |
| Example 133 | 2 | 2 | 14 | 22 | 7 | C4 | MIBC | AA | AA | AA |
| Example 134 | 4 | 1 | 16 | 24 | 6 | C4 | MIBC | AA | AA | AA |
| Example 135 | 2 | 1 | 16 | 24 | 4 | C4 | MIBC | AA | AA | AA |
| Example 136 | 3 | 1 | 14 | 21 | 7 | C4 | MIBC | AA | AA | AA |
| Example 137 | 1 | 2 | 16 | 24 | 8 | C4 | MIBC | AA | AA | AA |
| Example 138 | 3 | 1 | 16 | 23 | 7 | C4 | MIBC | AA | AA | AA |
| Example 139 | 2 | 1 | 17 | 23 | 6 | C4 | MIBC | AA | AA | AA |
| Example 140 | 3 | 1 | 16 | 24 | 7 | C4 | MIBC | AA | AA | AA |
| Example 141 | 2 | 1 | 16 | 21 | 6 | C4 | MIBC | AA | AA | AA |
| Example 142 | 4 | 1 | 16 | 23 | 6 | C4 | MIBC | AA | AA | AA |
| Example 143 | 2 | 2 | 16 | 23 | 5 | C4 | MIBC | AA | AA | AA |
| Example 144 | 3 | 1 | 15 | 23 | 8 | C4 | MIBC | AA | AA | AA |
| Example 145 | 2 | 1 | 17 | 25 | 9 | C4 | MIBC | AA | AA | AA |
| Example 146 | 2 | 1 | 16 | 22 | 10 | C4 | MIBC | AA | AA | AA |
| Example 147 | 3 | 1 | 16 | 23 | 8 | C4 | MIBC | AA | AA | AA |
| Example 148 | 1 | 1 | 16 | 22 | 9 | C4 | MIBC | AA | AA | AA |
| Example 149 | 1 | 1 | 16 | 20 | 10 | C4 | MIBC | AA | AA | AA |
| Example 150 | 2 | 1 | 14 | 19 | 9 | C4 | MIBC | AA | AA | AA |
| Example 151 | 3 | 2 | 16 | 23 | 7 | C4 | MIBC | AA | AA | AA |
| Example 152 | 4 | 1 | 15 | 23 | 6 | C4 | MIBC | AA | AA | AA |
| Example 153 | 2 | 1 | 16 | 24 | 5 | C4 | MIBC | AA | AA | AA |

TABLE 20

| | | Composition of chemical liquid for developer | | | | | | | | |
|---|---|---|---|---|---|---|---|---|---|---|
| | | | | | Organic impurities | | | | | |
| | Type of resist | Pre-wetting liquid Chemical liquid number and solvent type of pre-wetting liquid | Chemical liquid number | Organic solvent (remaining part) | Content (mass ppm | Organic impurities other than alcohol impurities (type) | Alcohol impurities (mass ppm | Water (mass %) | Content of metal atoms (mass ppt) | |
| Table 18 | composition | | | | | | | | Fe | Cr |
| Example 154 | EUV-1 | B33 | CyHe | A226 | nBA | 300 | ENB | 180 | 0.10% | 1 | 1 |
| Example 155 | EUV-1 | B33 | CyHe | A227 | nBA | 300 | DCP | 200 | 0.10% | 3 | 1 |
| Example 156 | EUV-1 | B33 | CyHe | A228 | nBA | 260 | DOP | 130 | 0.10% | 2 | 2 |
| Example 157 | EUV-1 | B33 | CyHe | A229 | nBA | 290 | HD | 140 | 0.10% | 3 | 1 |
| Example 158 | EUV-1 | B33 | CyHe | A230 | nBA | 280 | DIDP | 100 | 0.10% | 2 | 1 |

TABLE 20-continued

| | | | | | | | | | | | |
|---|---|---|---|---|---|---|---|---|---|---|---|
| Example 159 | EUV-1 | B33 | CyHe | A231 | nBA | 340 | DINA | 130 | 0.10% | 1 | 1 |
| Example 160 | EUV-1 | B33 | CyHe | A232 | nBA | 280 | DPHP | 150 | 0.10% | 3 | 1 |
| Example 161 | EUV-1 | B33 | CyHe | A233 | nBA | 320 | DINP | 180 | 0.10% | 2 | 2 |
| Example 162 | EUV-1 | B33 | CyHe | A234 | nBA | 250 | DBP | 150 | 0.10% | 3 | 1 |
| Example 163 | EUV-1 | B33 | CyHe | A235 | nBA | 310 | BRzP | 180 | 0.10% | 2 | 1 |
| Example 164 | EUV-1 | B33 | CyHe | A236 | nBA | 350 | DOP | 200 | 0.10% | 4 | 1 |
| Example 165 | EUV-1 | B33 | CyHe | A237 | nBA | 310 | DIDP | 130 | 0.10% | 2 | 1 |
| Example 166 | EUV-1 | B33 | CyHe | A238 | nBA | 350 | DIOP | 140 | 0.10% | 3 | 2 |
| Example 167 | EUV-1 | B33 | CyHe | A239 | nBA | 300 | DEP | 150 | 0.10% | 2 | 1 |
| Example 168 | EUV-1 | B33 | CyHe | A240 | nBA | 360 | DIBP | 180 | 0.10% | 1 | 1 |
| Example 169 | EUV-1 | B33 | CyHe | A241 | nBA | 410 | TMTM | 200 | 0.10% | 3 | 1 |
| Example 170 | EUV-1 | B33 | CyHe | A242 | nBA | 280 | ATM | 140 | 0.10% | 3 | 1 |
| Example 171 | EUV-1 | B33 | CyHe | A243 | nBA | 220 | LTM | 100 | 0.10% | 2 | 1 |
| Example 172 | EUV-1 | B33 | CyHe | A244 | nBA | 230 | OTM | 130 | 0.10% | 4 | 1 |
| Example 173 | EUV-1 | B33 | CyHe | A245 | nBA | 300 | DEHA | 150 | 0.10% | 2 | 1 |
| Example 174 | EUV-1 | B33 | CyHe | A246 | nBA | 300 | DMAD | 180 | 0.10% | 3 | 2 |
| Example 175 | EUV-1 | B33 | CyHe | A247 | nBA | 300 | MMAD | 200 | 0.10% | 2 | 1 |
| Example 176 | EUV-1 | B33 | CyHe | A248 | nBA | 280 | DBS | 150 | 0.10% | 2 | 1 |
| Example 177 | EUV-1 | B33 | CyHe | A249 | nBA | 330 | DBM | 180 | 0.10% | 3 | 1 |
| Example 178 | EUV-1 | B33 | CyHe | A250 | nBA | 380 | DIBM | 200 | 0.10% | 1 | 1 |
| Example 179 | EUV-1 | B33 | CyHe | A251 | nBA | 210 | Azelates | 100 | 0.10% | 1 | 2 |
| Example 180 | EUV-1 | B33 | CyHe | A252 | nBA | 270 | Benzoates | 120 | 0.10% | 1 | 1 |
| Example 181 | EUV-1 | B33 | CyHe | A253 | nBA | 200 | DEHT | 100 | 0.10% | 1 | 1 |
| Example 182 | EUV-1 | B33 | CyHe | A254 | nBA | 240 | DIMCH | 90 | 0.10% | 1 | 1 |
| Example 183 | EUV-1 | B33 | CyHe | A255 | nBA | 200 | Ethylene rubber | 100 | 0.10% | 1 | 1 |
| Example 184 | EUV-1 | B33 | CyHe | A256 | nBA | 300 | Ethylene propylene rubber | 150 | 0.10% | 1 | 1 |

| | Composition of chemical liquid for developer | | | | | Rinsing liquid Chemical liquid number and solvent type of rinsing liquid | | Evaluation | | |
|---|---|---|---|---|---|---|---|---|---|---|
| | Content of metal atoms (mass ppt) | | | | Number of coarse particles (number of objects to be counted) (objects to be counted/mL) | | | | Defect suppression performance | Bridge defect suppression performance |
| Table 18 | Ni | Pb | Others | Total | | | | Developability | | |
| Example 154 | 3 | 1 | 15 | 21 | 6 | C4 | MIBC | AA | A | B |
| Example 155 | 2 | 1 | 14 | 21 | 6 | C4 | MIBC | AA | A | B |
| Example 156 | 3 | 2 | 16 | 25 | 5 | C4 | MIBC | AA | AA | AA |
| Example 157 | 2 | 1 | 14 | 21 | 8 | C4 | MIBC | AA | A | B |
| Example 158 | 1 | 1 | 16 | 21 | 9 | C4 | MIBC | AA | A | B |
| Example 159 | 3 | 1 | 15 | 21 | 10 | C4 | MIBC | AA | A | B |
| Example 160 | 2 | 1 | 16 | 23 | 8 | C4 | MIBC | AA | A | B |
| Example 161 | 1 | 2 | 17 | 24 | 9 | C4 | MIBC | AA | AA | AA |
| Example 162 | 3 | 1 | 16 | 24 | 7 | C4 | MIBC | AA | AA | AA |
| Example 163 | 2 | 1 | 16 | 22 | 6 | C4 | MIBC | AA | A | B |
| Example 164 | 3 | 1 | 14 | 23 | 6 | C4 | MIBC | AA | A | B |
| Example 165 | 2 | 1 | 17 | 23 | 5 | C4 | MIBC | AA | A | B |
| Example 166 | 1 | 1 | 15 | 22 | 8 | C4 | MIBC | AA | A | B |
| Example 167 | 3 | 1 | 16 | 23 | 7 | C4 | MIBC | AA | A | B |
| Example 168 | 1 | 1 | 16 | 20 | 6 | C4 | MIBC | AA | A | B |
| Example 169 | 3 | 1 | 14 | 22 | 6 | C4 | MIBC | AA | A | B |
| Example 170 | 3 | 1 | 15 | 23 | 8 | C4 | MIBC | AA | A | B |
| Example 171 | 2 | 1 | 16 | 22 | 9 | C4 | MIBC | AA | A | B |
| Example 172 | 1 | 1 | 1 | 8 | 7 | C4 | MIBC | AA | A | B |
| Example 173 | 3 | 2 | 16 | 24 | 6 | C4 | MIBC | AA | AA | AA |
| Example 174 | 2 | 1 | 17 | 25 | 6 | C4 | MIBC | AA | A | B |
| Example 175 | 3 | 1 | 14 | 21 | 5 | C4 | MIBC | AA | A | B |
| Example 176 | 2 | 1 | 16 | 22 | 8 | C4 | MIBC | AA | A | B |
| Example 177 | 4 | 1 | 16 | 25 | 9 | C4 | MIBC | AA | A | B |
| Example 178 | 2 | 2 | 18 | 21 | 10 | C4 | MIBC | AA | A | B |
| Example 179 | 3 | 1 | 16 | 23 | 8 | C4 | MIBC | AA | A | B |
| Example 180 | 2 | 2 | 16 | 21 | 9 | C4 | MIBC | AA | A | B |
| Example 181 | 2 | 2 | 16 | 21 | 10 | C4 | MIBC | AA | A | B |
| Example 182 | 2 | 2 | 16 | 21 | 6 | C4 | MIBC | AA | A | B |
| Example 183 | 2 | 2 | 16 | 21 | 10 | C4 | MIBC | AA | AA | AA |
| Example 184 | 2 | 1 | 16 | 21 | 6 | C4 | MIBC | AA | AA | AA |

TABLE 21

| | Pre-wetting liquid | | Composition of chemical liquid for developer | | | | | | | |
|---|---|---|---|---|---|---|---|---|---|---|
| | | Chemical liquid number and solvent type of pre-wetting | | Organic solvent (remaining | Content (mass | Organic impurities other than alcohol impurities | Alcohol impurities | Water | Content of metal atoms (mass ppt) | |
| Type of resist Table 19 | composition | liquid | Chemical liquid number | part) | ppm) | (type) | (mass ppm) | (mass %) | Fe | Cr |
| Example 185 | EUV-1 | B33 | CyHe | A257 | nBA | 380 | Epoxidized vegetable oils | 200 | 0.10% | 2 | 1 |
| Example 186 | EUV-1 | B33 | CyHe | A258 | nBA | 340 | ASE | 130 | 0.10% | 4 | 1 |
| Example 187 | EUV-1 | B33 | CyHe | A259 | nBA | 270 | ETSA | 140 | 0.10% | 2 | 1 |
| Example 188 | EUV-1 | B33 | CyHe | A260 | nBA | 260 | HPBSA | 120 | 0.10% | 3 | 2 |
| Example 189 | EUV-1 | B33 | CyHe | A261 | nBA | 220 | BBSA-NBBS | 100 | 0.10% | 2 | 1 |
| Example 190 | EUV-1 | B33 | CyHe | A262 | nBA | 250 | TCP | 150 | 0.10% | 1 | 1 |
| Example 191 | EUV-1 | B33 | CyHe | A263 | nBA | 270 | TBP | 120 | 0.10% | 3 | 1 |
| Example 192 | EUV-1 | B33 | CyHe | A264 | nBA | 300 | 3G6 | 180 | 0.10% | 2 | 1 |
| Example 193 | EUV-1 | B33 | CyHe | A265 | nBA | 380 | 4G7 | 200 | 0.10% | 3 | 1 |
| Example 194 | EUV-1 | B33 | CyHe | A266 | nBA | 340 | TEC | 130 | 0.10% | 2 | 2 |
| Example 195 | EUV-1 | B33 | CyHe | A267 | nBA | 270 | ATEC | 140 | 0.10% | 4 | 1 |
| Example 196 | EUV-1 | B33 | CyHe | A268 | nBA | 260 | TBC | 120 | 0.10% | 2 | 1 |
| Example 197 | EUV-1 | B33 | CyHe | A269 | nBA | 320 | ATBC | 200 | 0.10% | 2 | 1 |
| Example 198 | EUV-1 | B33 | CyHe | A270 | nBA | 230 | TOC | 130 | 0.10% | 4 | 1 |
| Example 199 | EUV-1 | B33 | CyHe | A271 | nBA | 290 | ATOC | 140 | 0.10% | 2 | 1 |
| Example 200 | EUV-1 | B33 | CyHe | A272 | nBA | 240 | THC | 120 | 0.10% | 3 | 2 |
| Example 201 | EUV-1 | B33 | CyHe | A273 | nBA | 280 | ATHC | 100 | 0.10% | 2 | 1 |
| Example 202 | EUV-1 | B33 | CyHe | A274 | nBA | 360 | BTHC | 150 | 0.10% | 2 | 1 |
| Example 203 | EUV-1 | B33 | CyHe | A275 | nBA | 250 | TMC | 120 | 0.10% | 4 | 1 |
| Example 204 | EUV-1 | B33 | CyHe | A276 | nBA | 340 | ESBO | 200 | 0.10% | 2 | 1 |
| Example 205 | EUV-1 | B33 | CyHe | A277 | nBA | 250 | NG | 130 | 0.10% | 3 | 2 |
| Example 206 | EUV-1 | B33 | CyHe | A278 | nBA | 240 | BTTN | 140 | 0.10% | 2 | 1 |
| Example 207 | EUV-1 | B33 | CyHe | A279 | nBA | 270 | DNT | 120 | 0.10% | 1 | 1 |
| Example 208 | EUV-1 | B33 | CyHe | A280 | nBA | 220 | TMETN | 100 | 0.10% | 3 | 1 |
| Example 209 | EUV-1 | B33 | CyHe | A281 | nBA | 250 | DEGDN | 150 | 0.10% | 2 | 2 |
| Example 210 | EUV-1 | B33 | CyHe | A282 | nBA | 250 | TEGDN | 120 | 0.10% | 3 | 1 |
| Example 211 | EUV-1 | B33 | CyHe | A283 | nBA | 330 | BDNPF | 180 | 0.10% | 2 | 1 |
| Example 212 | EUV-1 | B33 | CyHe | A284 | nBA | 380 | BDNPA | 200 | 0.10% | 4 | 1 |
| Example 213 | EUV-1 | B33 | CyHe | A285 | nBA | 240 | TNEN | 130 | 0.10% | 2 | 1 |

| | Composition of chemical liquid for developer | | | | | | Evaluation | | |
|---|---|---|---|---|---|---|---|---|---|
| | Content of metal atoms (mass ppt) | | | | Number of coarse particles (number of objects to be counted) (objects to be | Rinsing liquid Chemical liquid number and solvent type of | Develop- | Defect suppression perform- | Bridge defect suppression perform- |
| Table 19 | Ni | Pb | Others | Total | counted/mL) | rinsing liquid | ability | ance | ance |
| Example 185 | 3 | 1 | 16 | 23 | 7 | C4 | MIBC | AA | A | B |
| Example 186 | 2 | 1 | 14 | 22 | 6 | C4 | MIBC | AA | A | B |
| Example 187 | 4 | 2 | 16 | 25 | 6 | C4 | MIBC | AA | A | B |
| Example 188 | 2 | 1 | 17 | 25 | 5 | C4 | MIBC | AA | A | B |
| Example 189 | 3 | 1 | 16 | 23 | 8 | C4 | MIBC | AA | A | B |
| Example 190 | 2 | 1 | 17 | 22 | 9 | C4 | MIBC | AA | A | B |
| Example 191 | 1 | 1 | 16 | 22 | 10 | C4 | MIBC | AA | A | B |
| Example 192 | 3 | 2 | 16 | 24 | 7 | C4 | MIBC | AA | A | B |
| Example 193 | 2 | 1 | 16 | 23 | 6 | C4 | MIBC | AA | A | B |
| Example 194 | 3 | 1 | 14 | 22 | 6 | C4 | MIBC | AA | A | B |
| Example 195 | 2 | 1 | 16 | 24 | 5 | C4 | MIBC | AA | A | B |
| Example 196 | 4 | 1 | 16 | 24 | 8 | C4 | MIBC | AA | A | B |
| Example 197 | 2 | 1 | 14 | 20 | 9 | C4 | MIBC | AA | A | B |
| Example 198 | 3 | 2 | 16 | 26 | 10 | C4 | MIBC | AA | A | B |
| Example 199 | 2 | 1 | 16 | 22 | 8 | C4 | MIBC | AA | A | B |
| Example 200 | 1 | 1 | 17 | 24 | 9 | C4 | MIBC | AA | A | B |
| Example 201 | 3 | 1 | 16 | 23 | 7 | C4 | MIBC | AA | A | B |
| Example 202 | 2 | 1 | 15 | 21 | 6 | C4 | MIBC | AA | A | B |
| Example 203 | 2 | 2 | 16 | 25 | 6 | C4 | MIBC | AA | A | B |
| Example 204 | 4 | 1 | 16 | 24 | 5 | C4 | MIBC | AA | A | B |
| Example 205 | 2 | 1 | 16 | 24 | 8 | C4 | MIBC | AA | A | B |
| Example 206 | 3 | 2 | 15 | 23 | 9 | C4 | MIBC | AA | A | B |
| Example 207 | 2 | 1 | 16 | 21 | 10 | C4 | MIBC | AA | A | B |

TABLE 21-continued

| | | | | | | | | | | |
|---|---|---|---|---|---|---|---|---|---|---|
| Example 208 | 1 | 1 | 16 | 22 | 8 | C4 | MIBC | AA | A | B |
| Example 209 | 3 | 1 | 14 | 22 | 7 | C4 | MIBC | AA | A | B |
| Example 210 | 2 | 1 | 16 | 23 | 6 | C4 | MIBC | AA | A | B |
| Example 211 | 3 | 1 | 17 | 24 | 6 | C4 | MIBC | AA | A | B |
| Example 212 | 2 | 2 | 15 | 24 | 5 | C4 | MIBC | AA | A | B |
| Example 213 | 4 | 2 | 16 | 24 | 8 | C4 | MIBC | AA | A | B |

From the following Tables 17 to 19, it was found that the pattern forming method of Examples is excellent in developability and also excellent in defect suppression performance. It was also found that the bridge defect suppression performance is excellent in the pattern forming method of Examples.

What is claimed is:

1. A pattern forming method comprising:
a resist film forming step of forming a resist film on a substrate using an actinic ray-sensitive or radiation-sensitive resin composition;
an exposing step of exposing the resist film; and
a developing step of developing the exposed resist film using a developer,
wherein the actinic ray-sensitive or radiation-sensitive resin composition contains a resin including a repeating unit selected from the group consisting of a repeating unit represented by Formula (a), a repeating unit represented by Formula (b), a repeating unit represented by Formula (c), a repeating unit represented by Formula (d), and a repeating unit represented by Formula (e), and
the developer is a chemical liquid containing
an organic solvent,
organic impurities containing at least alcohol impurities, and
metal impurities containing metal atoms, in which the total content of the alcohol impurities is 0.01 mass ppb to 1000 mass ppm with respect to the total mass of the chemical liquid, (I)

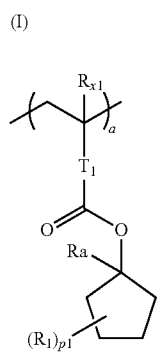

(a)

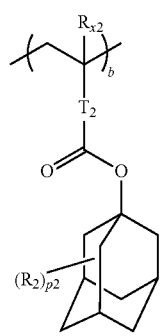

(b)

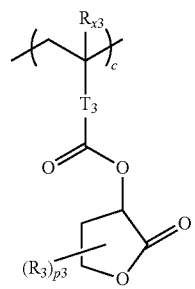

(c)

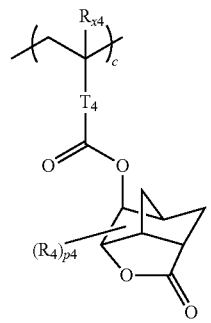

(d)

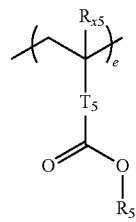

(e)

in the formulae,
$R_{x1}$ to $R_{x5}$ each independently represents a hydrogen atom or an alkyl group which may have a substituent,
$R_1$ to $R_4$ each independently represents a monovalent substituent, and $p_1$ to $p_4$ each independently represents 0 or a positive integer,
$R_a$ represents a linear or branched alkyl group,
$T_1$ to $T_5$ each independently represents a single bond or a divalent linking group,
$R_5$ represents a monovalent organic group,
a to e each represent mol %, and each independently represents a number within ranges of $0 \leq a \leq 100$, $0 \leq b \leq 100$, $0 \leq c < 100$, $0 \leq d < 100$, and $0 \leq e < 100$, provided that $a+b+c+d+e=100$ and $a+b \neq 0$, and
the repeating unit represented by Formula (e) is different from any of the repeating units represented by Formulae (a) to (d),
the metal impurities contain at least one specific metal atom selected from the group consisting of an Fe atom, a Cr atom, a Ni atom, and a Pb atom,
in a case where the specific metal atom is one selected from the group consisting of an Fe atom, a Cr atom, a Ni atom, and a Pb atom, a content of the specific metal atom is 0.001 to 100 mass ppt with respect to the total mass of the chemical liquid, in a case where the specific metal atom is two or more selected from the group consisting of an Fe atom, a Cr atom, a Ni atom, and a Pb atom, the content of each of the specific metal atoms is 0.001 to 100 mass ppt with respect to the total mass of the chemical liquid, the total content of the metal atoms contained in the chemical liquid is 0.1 to 500 mass ppt with respect to the total mass of the chemical liquid, and the organic impurities include one or more selected from the group consisting of dioctyl phthalate, diisononyl phthalate, dioctyl adipate, dibutyl phthalate, ethylene rubber, and ethylene propylene rubber.

2. A pattern forming method comprising:

a resist film forming step of forming a resist film on a substrate using an actinic ray-sensitive or radiation-sensitive resin composition;

an exposing step of exposing the resist film; and a developing step of developing the exposed resist film using a developer, wherein the actinic ray-sensitive or radiation-sensitive resin composition contains a resin having a repeating unit having a phenolic hydroxyl group and having a group capable of decomposing by the action of an acid to generate a polar group, and the developer is a chemical liquid containing an organic solvent, organic impurities containing at least alcohol impurities, and metal impurities containing metal atoms, in which the total content of the alcohol impurities is 0.01 mass ppb to 1000 mass ppm with respect to the total mass of the chemical liquid, the metal impurities contain at least one specific metal atom selected from the group consisting of an Fe atom, a Cr atom, a Ni atom, and a Pb atom, in a case where the specific metal atom is one selected from the group consisting of an Fe atom, a Cr atom, a Ni atom, and a Pb atom, a content of the specific metal atom is 0.001 to 100 mass ppt with respect to the total mass of the chemical liquid, in a case where the specific metal atom is two or more selected from the group consisting of an Fe atom, a Cr atom, a Ni atom, and a Pb atom, the content of each of the specific metal atoms is 0.001 to 100 mass ppt with respect to the total mass of the chemical liquid, the total content of the metal atoms contained in the chemical liquid is 0.1 to 500 mass ppt with respect to the total mass of the chemical liquid, and the organic impurities include one or more selected from the group consisting of dioctyl phthalate, diisononyl phthalate, dioctyl adipate, dibutyl phthalate, ethylene rubber, and ethylene propylene rubber.

3. The pattern forming method according to claim 1, wherein the total content of the organic impurities is 1 to 5,000 mass ppm with respect to the total mass of the chemical liquid.

4. The pattern forming method according to claim 1, wherein the number of objects to be counted having a size of 0.1 μm or more counted by a light scattering type in-liquid particle counter in the chemical liquid is 100 objects to be counted/mL or less.

5. The pattern forming method according to claim 1, wherein the content of water in the chemical liquid is 0.01 to 1.0 mass % with respect to the total mass of the chemical liquid.

6. The pattern forming method according to claim 1, wherein the organic solvent is any one selected from the group consisting of propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, 1-hexanol, 2-heptanone, isoamyl acetate, and 4-methyl-2-pentanol.

7. A pattern forming method comprising:

a pre-wetting step of bringing a pre-wetting liquid into contact with a substrate;

a resist film forming step of forming a resist film on the substrate using an actinic ray-sensitive or radiation-sensitive resin composition;

an exposing step of exposing the resist film; and a developing step of developing the exposed resist film using a developer; and, wherein the actinic ray-sensitive or radiation-sensitive resin composition contains a resin including a repeating unit selected from the group consisting of a repeating unit represented by Formula (a), a repeating unit represented by Formula (b), a repeating unit represented by Formula (c), a repeating unit represented by Formula (d), and a repeating unit represented by Formula (e), and the developer is a chemical liquid containing an organic solvent, organic impurities containing at least alcohol impurities, and metal impurities containing metal atoms, in which the total content of the alcohol impurities is 0.01 mass ppb to 1000 mass ppm with respect to the total mass of the chemical liquid, (I)

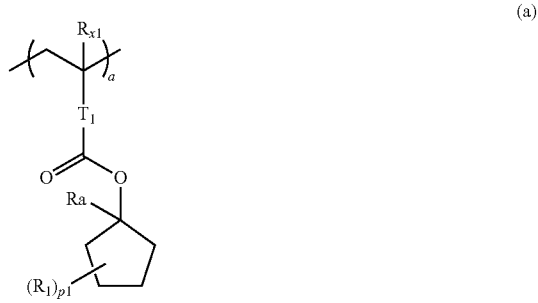

(a)

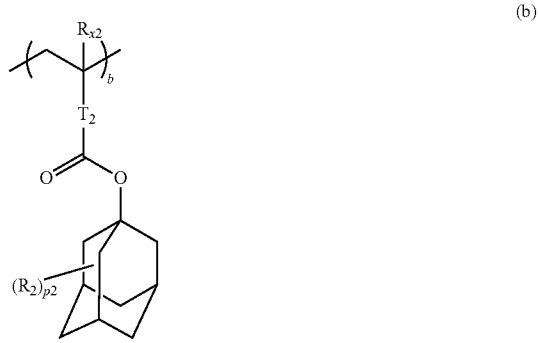

(b)

-continued

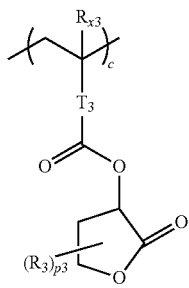
(c)

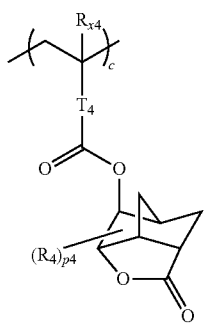
(d)

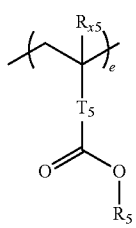
(e)

in the formulae, $R_{x1}$ to $R_{x5}$ each independently represents a hydrogen atom or an alkyl group which may have a substituent, $R_1$ to $R_4$ each independently represents a monovalent substituent, and $p_1$ to $p_4$ each independently represents 0 or a positive integer, $R_a$ represents a linear or branched alkyl group, $T_1$ to $T_5$ each independently represents a single bond or a divalent linking group, $R_5$ represents a monovalent organic group, a to e each represent mol %, and each independently represents a number within ranges of 0≤a≤100, 0≤b≤100, 0≤c<100, 0≤d<100, and 0≤e<100, provided that a+b+c+d+e=100 and a+b≠0, and the repeating unit represented by Formula (e) is different from any of the repeating units represented by Formulae (a) to (d), the metal impurities contain at least one specific metal atom selected from the group consisting of an Fe atom, a Cr atom, a Ni atom, and a Pb atom, in a case where the specific metal atom is one selected from the group consisting of an Fe atom, a Cr atom, a Ni atom, and a Pb atom, a content of the specific metal atom is 0.001 to 100 mass ppt with respect to the total mass of the chemical liquid, in a case where the specific metal atom is two or more selected from the group consisting of an Fe atom, a Cr atom, a Ni atom, and a Pb atom, the content of each of the specific metal atoms is 0.001 to 100 mass ppt with respect to the total mass of the chemical liquid, the total content of the metal atoms contained in the chemical liquid is 0.1 to 500 mass ppt with respect to the total mass of the chemical liquid, and the pre-wetting liquid contains the chemical liquid.

8. The pattern forming method according to claim 1, further comprising:

a rinsing step of cleaning the substrate using a rinsing liquid after the developing step, wherein the chemical liquid is used as the rinsing liquid.

9. The pattern forming method according to claim 1, wherein the actinic ray-sensitive or radiation-sensitive resin composition further contains a photoacid generator and an organic solvent.

10. The pattern forming method according to claim 9, wherein, in the actinic ray-sensitive or radiation-sensitive resin composition, at least one of the organic solvents is propylene glycol monomethyl ether acetate.

11. A method for producing an electronic device, comprising:

the pattern forming method according to claim 1.

12. The pattern forming method according to claim 2, wherein the total content of the organic impurities is 1 to 5,000 mass ppm with respect to the total mass of the chemical liquid.

13. A pattern forming method comprising:

a resist film forming step of forming a resist film on a substrate using an actinic ray-sensitive or radiation-sensitive resin composition;

an exposing step of exposing the resist film; and a developing step of developing the exposed resist film using a developer, wherein the actinic ray-sensitive or radiation-sensitive resin composition contains a resin including a repeating unit selected from the group consisting of a repeating unit represented by Formula (a), a repeating unit represented by Formula (b), a repeating unit represented by Formula (c), a repeating unit represented by Formula (d), and a repeating unit represented by Formula (e), and the developer is a chemical liquid containing an organic solvent, organic impurities containing at least alcohol impurities, and metal impurities containing metal atoms, in which the total content of the alcohol impurities is 0.01 mass ppb to 1000 mass ppm with respect to the total mass of the chemical liquid, (I)

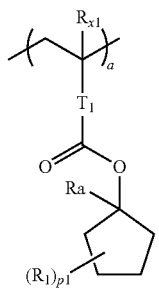
(a)

-continued

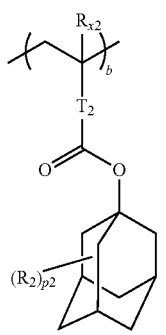
(b)

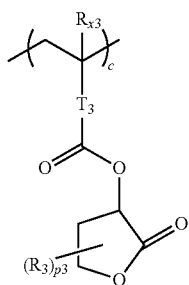
(c)

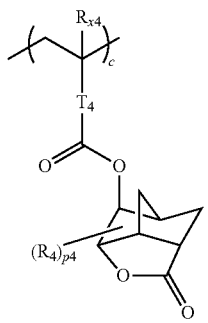
(d)

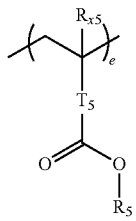
(e)

in the formulae,
$R_{x1}$ to $R_{x5}$ each independently represents a hydrogen atom or an alkyl group which may have a substituent,
$R_1$ to $R_4$ each independently represents a monovalent substituent, and $p_1$ to $p_4$ each independently represents 0 or a positive integer,
$R_a$ represents a linear or branched alkyl group,
$T_1$ to $T_5$ each independently represents a single bond or a divalent linking group,
$R_5$ represents a monovalent organic group,
a to e each represent mol %, and each independently represents a number within ranges of $0 \leq a \leq 100$, $0 \leq b \leq 100$, $0 \leq c < 100$, $0 \leq d < 100$, and $0 \leq e < 100$, provided that $a+b+c+d+e=100$ and $a+b \neq 0$, and
the repeating unit represented by Formula (e) is different from any of the repeating units represented by Formulae (a) to (d), and
the organic impurities include one or more selected from the group consisting of dioctyl phthalate, diisononyl phthalate, dioctyl adipate, dibutyl phthalate, ethylene rubber, and ethylene propylene rubber.

14. A pattern forming method comprising:
a resist film forming step of forming a resist film on a substrate using an actinic ray-sensitive or radiation-sensitive resin composition;
an exposing step of exposing the resist film; and
a developing step of developing the exposed resist film using a developer,
wherein the actinic ray-sensitive or radiation-sensitive resin composition contains a resin having a repeating unit having a phenolic hydroxyl group and having a group capable of decomposing by the action of an acid to generate a polar group, and
the developer is a chemical liquid containing
an organic solvent,
organic impurities containing at least alcohol impurities, and
metal impurities containing metal atoms, in which the total content of the alcohol impurities is 0.01 mass ppb to 1000 mass ppm with respect to the total mass of the chemical liquid, and
the organic impurities include one or more selected from the group consisting of dioctyl phthalate, diisononyl phthalate, dioctyl adipate, dibutyl phthalate, ethylene rubber, and ethylene propylene rubber.

15. A pattern forming method comprising:
a pre-wetting step of bringing a pre-wetting liquid into contact with a substrate;
a resist film forming step of forming a resist film on the substrate using an actinic ray-sensitive or radiation-sensitive resin composition;
an exposing step of exposing the resist film; and
a developing step of developing the exposed resist film using a developer,
wherein the actinic ray-sensitive or radiation-sensitive resin composition contains a resin including a repeating unit selected from the group consisting of a repeating unit represented by Formula (a), a repeating unit represented by Formula (b), a repeating unit represented by Formula (c), a repeating unit represented by Formula (d), and a repeating unit represented by Formula (e), and
the developer is a chemical liquid containing
an organic solvent,
organic impurities containing at least alcohol impurities, and
metal impurities containing metal atoms, in which the total content of the alcohol impurities is 0.01 mass ppb to 1000 mass ppm with respect to the total mass of the chemical liquid, (I)

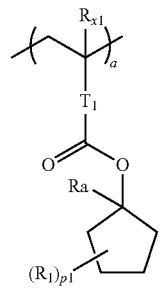
(a)

-continued

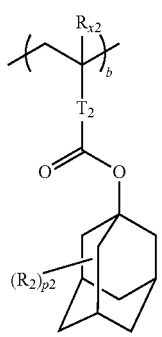

(b)

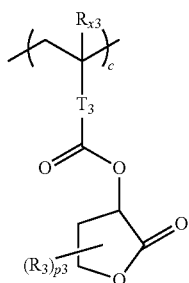

(c)

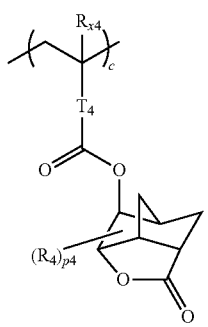

(d)

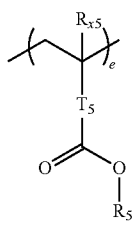

(e)

in the formulae,
$R_{x1}$ to $R_{x5}$ each independently represents a hydrogen atom or an alkyl group which may have a substituent,
$R_1$ to $R_4$ each independently represents a monovalent substituent, and $p_1$ to $p_4$ each independently represents 0 or a positive integer,
$R_a$ represents a linear or branched alkyl group,
$T_1$ to $T_5$ each independently represents a single bond or a divalent linking group,
$R_5$ represents a monovalent organic group,
a to e each represent mol %, and each independently represents a number within ranges of $0 \leq a \leq 100$, $0 \leq b \leq 100$, $0 \leq c < 100$, $0 \leq d < 100$, and $0 \leq e < 100$, provided that $a+b+c+d+e=100$ and $a+b \neq 0$, and
the repeating unit represented by Formula (e) is different from any of the repeating units represented by Formulae (a) to (d), and
the pre-wetting liquid contains the chemical liquid.

16. A pattern forming method comprising:
a pre-wetting step of bringing a pre-wetting liquid into contact with a substrate;
a resist film forming step of forming a resist film on the substrate using an actinic ray-sensitive or radiation-sensitive resin composition;
an exposing step of exposing the resist film; and
a developing step of developing the exposed resist film using a developer,
wherein the actinic ray-sensitive or radiation-sensitive resin composition contains a resin having a repeating unit having a phenolic hydroxyl group and having a group capable of decomposing by the action of an acid to generate a polar group, and
the developer is a chemical liquid containing
an organic solvent,
organic impurities containing at least alcohol impurities, and
metal impurities containing metal atoms, in which the total content of the alcohol impurities is 0.01 mass ppb to 1000 mass ppm with respect to the total mass of the chemical liquid, and
the pre-wetting liquid contains the chemical liquid.

17. A pattern forming method comprising:
a pre-wetting step of bringing a pre-wetting liquid into contact with a substrate;
a resist film forming step of forming a resist film on the substrate using an actinic ray-sensitive or radiation-sensitive resin composition;
an exposing step of exposing the resist film; and
a developing step of developing the exposed resist film using a developer,
wherein the actinic ray-sensitive or radiation-sensitive resin composition contains a resin having a repeating unit having a phenolic hydroxyl group and having a group capable of decomposing by the action of an acid to generate a polar group, and
the developer is a chemical liquid containing
an organic solvent,
organic impurities containing at least alcohol impurities, and
metal impurities containing metal atoms, in which the total content of the alcohol impurities is 0.01 mass ppb to 1000 mass ppm with respect to the total mass of the chemical liquid,
the metal impurities contain at least one specific metal atom selected from the group consisting of an Fe atom, a Cr atom, a Ni atom, and a Pb atom,
in a case where the specific metal atom is one selected from the group consisting of an Fe atom, a Cr atom, a Ni atom, and a Pb atom, a content of the specific metal atom is 0.001 to 100 mass ppt with respect to the total mass of the chemical liquid,
in a case where the specific metal atom is two or more selected from the group consisting of an Fe atom, a Cr atom, a Ni atom, and a Pb atom, the content of each of the specific metal atoms is 0.001 to 100 mass ppt with respect to the total mass of the chemical liquid,
the total content of the metal atoms contained in the chemical liquid is 0.1 to 500 mass ppt with respect to the total mass of the chemical liquid, and
the pre-wetting liquid contains the chemical liquid.

18. A pattern forming method comprising:
a resist film forming step of forming a resist film on a substrate using an actinic ray-sensitive or radiation-sensitive resin composition;
an exposing step of exposing the resist film; and a developing step of developing the exposed resist film using a developer, wherein the actinic ray-sensitive or radiation-sensitive resin composition contains a resin including a repeating unit selected from the group consisting of a repeating unit represented by Formula (a), a repeating unit represented by Formula (b), a repeating unit represented by Formula (c), a repeating unit represented by Formula (d), and a repeating unit represented by Formula (e), and the developer is a chemical liquid containing an organic solvent, organic impurities containing at least alcohol impurities, and metal impurities containing metal atoms, in which the total content of the alcohol impurities is 0.01 mass ppb to 1000 mass ppm with respect to the total mass of the chemical liquid, (I)

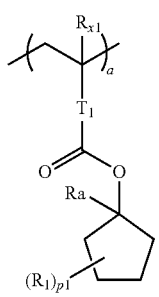
(a)

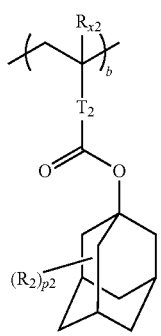
(b)

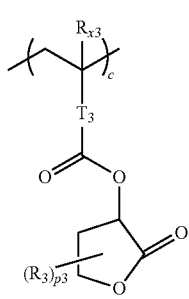
(c)

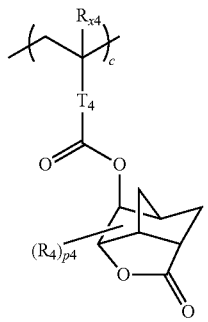
(d)

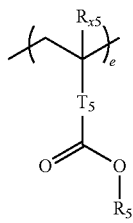
(e)

in the formulae, $R_{x1}$ to $R_{x5}$ each independently represent a hydrogen atom or an alkyl group which may have a substituent, $R_1$ to $R_4$ each independently represent a monovalent substituent, and $p_1$ to $p_4$ each independently represent 0 or a positive integer, $R_a$ represents a linear or branched alkyl group, $T_1$ to $T_5$ each independently represent a single bond or a divalent linking group, $R_5$ represents a monovalent organic group, a to e each represent mol %, and each independently represent a number within ranges of $0 \leq a \leq 100$, $0 \leq b \leq 100$, $0 \leq c < 100$, $0 \leq d < 100$, and $0 \leq e < 100$, provided that a+b+c+d+e=100 and a+b≠0, and the repeating unit represented by Formula (e) is different from any of the repeating units represented by Formulae (a) to (d), the metal impurities contain at least a Pb atom, and a content of the Pb atom is 0.001 to 100 mass ppt with respect to the total mass of the chemical liquid.

19. The pattern forming method according to claim 18, wherein the content of the Pb atom is 0.001 to 2 mass ppt with respect to the total mass of the chemical liquid.

20. A pattern forming method comprising:

a resist film forming step of forming a resist film on a substrate using an actinic ray-sensitive or radiation-sensitive resin composition;

an exposing step of exposing the resist film; and a developing step of developing the exposed resist film using a developer, wherein the actinic ray-sensitive or radiation-sensitive resin composition contains a resin having a repeating unit having a phenolic hydroxyl group and having a group capable of decomposing by the action of an acid to generate a polar group, and the developer is a chemical liquid containing an organic solvent, organic impurities containing at least alcohol impurities, and metal impurities containing metal atoms, in which the total content of the alcohol impurities is 0.01 mass ppb to 1000 mass ppm with respect to the total mass of the chemical liquid, the metal impurities contain at least a Pb atom, and
a content of the Pb atom is 0.001 to 100 mass ppt with respect to the total mass of the chemical liquid.

21. The pattern forming method according to claim 20, wherein the content of the Pb atom is 0.001 to 2 mass ppt with respect to the total mass of the chemical liquid.

* * * * *